(12) United States Patent
Shimizu et al.

(10) Patent No.: US 11,442,548 B2
(45) Date of Patent: Sep. 13, 2022

(54) TOUCH SENSING DEVICE

(71) Applicant: HOSIDEN CORPORATION, Yao (JP)

(72) Inventors: Masato Shimizu, Yao (JP); Naoki Toyota, Yao (JP); Hitoshi Ao, Yao (JP)

(73) Assignee: Hosiden Corporation, Yao (JP)

( * ) Notice: Subject to any disclaimer, the term of this patent is extended or adjusted under 35 U.S.C. 154(b) by 0 days.

(21) Appl. No.: 17/505,004

(22) Filed: Oct. 19, 2021

(65) Prior Publication Data
US 2022/0137708 A1  May 5, 2022

(30) Foreign Application Priority Data

Oct. 30, 2020 (JP) .............................. JP2020-183090

(51) Int. Cl.
| | | |
|---|---|---|
| *G06F 3/01* | (2006.01) | |
| *G06F 3/041* | (2006.01) | |
| *G06F 3/044* | (2006.01) | |

(52) U.S. Cl.
CPC .............. *G06F 3/016* (2013.01); *G06F 3/044* (2013.01); *G06F 3/0416* (2013.01); *G06F 2203/04108* (2013.01)

(58) Field of Classification Search
None
See application file for complete search history.

(56) References Cited

U.S. PATENT DOCUMENTS 11,227,516 B1 *   1/2022   Shin ........................ G09F 9/301

FOREIGN PATENT DOCUMENTS

| EP | 2610719 A2 | 7/2013 |
|---|---|---|
| JP | 2015-049601 A | 3/2015 |
| WO | 2022018998 A1 | 1/2022 |

OTHER PUBLICATIONS

Extended European Search Report for European patent application No. 21204362.4, dated Mar. 29, 2022, 8 pages.

* cited by examiner

*Primary Examiner* — Stephen T. Reed
(74) *Attorney, Agent, or Firm* — Kilyk & Bowersox, P.L.L.C.

(57) ABSTRACT

A touch sensing device including a housing, a movable part, a covering, and a lifting actuator. The movable part is relatively movable within an opening of the housing relative to an edge portion of the opening, between first and second heights. The covering includes a flexible layer covering at least the edge portion and the movable part. The flexible layer includes first and second portions directly or indirectly fixed to the edge portion and to the movable part, respectively. The flexible layer can partly flex and stretch or partly shrink in accordance with a relative movement of the second portion relative to the first portion, from a third height to a fourth height, or vice versa. The lifting actuator can move the movable part or the edge portion to relatively move the movable part, from the first height to the second height, or vice versa, relative to the edge portion.

20 Claims, 15 Drawing Sheets

TOUCH SENSING DEVICE

CROSS-REFERENCE TO RELATED APPLICATIONS

The present application claims priority under 35 U.S.C. § 119 of Japanese Patent Application No. 2020-183090 filed on Oct. 30, 2020, the disclosure of which is expressly incorporated by reference herein in its entirety.

BACKGROUND OF THE INVENTION

Technical Field

The present invention relates to touch sensing devices.

Background Art

Japanese Unexamined Patent Application Publication No. 2015-49601 describes a conventional touch sensing device. The touch sensing device includes a frame having an opening, a touch sensor, a lifting mechanism, and a controller. The touch sensor has an outer shape corresponding to the shape of the opening of the frame in plan view, and is disposed in the opening of the frame such as to be movable up and down between a neutral position and a lowered position. At the neutral position, a face (including a touch region) of the touch sensor is flush with a face of the frame without a seam therebetween. In the lowered position, the face of the touch sensor is located below the face of the frame. The lifting mechanism is configured to move the touch sensor up and down between the neutral position and the lowered position. When the touch sensor is subjected to a predetermined operation (e.g., a swipe operation or the like), the controller drives the lifting mechanism to move the touch sensor from the neutral position to the lowered position.

SUMMARY OF INVENTION

In the conventional touch sensing device, the shape of the opening of the frame and the outer shape of the touch sensor are fabricated with high accuracy in order to eliminate the seam between the face of the touch sensor and the face of the frame. However, since the touch sensor and the frame are separate members, there is a very small gap therebetween to be exposed to the outside.

The present invention provides a novel touch sensing device having a seamless design.

A touch sensing device according to an aspect of the invention includes a housing, at least one movable part, a covering, at least one touch sensor, and at least one lifting actuator. The housing includes at least one opening, opening out at least to one side in a first direction and an edge portion of the at least one opening. The edge portion of the at least one opening includes a first face on the one side in the first direction. The first direction is an axial direction of the at least one opening. The at least one movable part includes a first face on the one side in the first direction and is relatively movable within the at least one opening relative to the edge portion of the at least one opening, between a first height position and a second height position in the first direction. The first height position is such that the first face of the at least one movable part is located at a predetermined height in the first direction relative to the first face of the edge portion of the at least one opening of the housing. The second height position is located on the other side or the one side in the first direction relative to the first height position. The covering includes a flexible layer being flexible and stretchable. The flexible layer covers at least the edge portion of the at least one opening of the housing and the at least one movable part from the one side in the first direction. The flexible layer includes at least one first portion, which is directly or indirectly fixed to the first face of the edge portion of the at least one opening of the housing and includes a first face on the one side in the first direction, and at least one second portion, which is directly or indirectly fixed to the first face of the at least one movable part and includes a first face on the one side in the first direction. In a state where the at least one movable part is relatively located at the first height position relative to the edge portion of the at least one opening of the housing, the first face of the at least one second portion of the flexible layer is relatively located at a predetermined third height position in the first direction relative to the first face of the at least one first portion of the flexible layer. In a state where the at least one movable part is relatively located at the second height position relative to the edge portion of the at least one opening of the housing, the first face of the at least one second portion of the flexible layer is relatively located at a fourth height position relative to the first face of the at least one first portion of the flexible layer. The fourth height position is located on the other side or the one side in the first direction relative to the third height position. The flexible layer is configured to partly flex and stretch, or alternatively partly shrink, in accordance with a relative movement of the at least one second portion relative to the at least one first portion, from the third height position to the fourth height position, or alternatively from the fourth height position to the third height position. The at least one touch sensor is provided at the at least one movable part, or in spaced relation to and on the other side in the first direction relative to the at least one movable part. The at least one touch sensor is configured to detect a detection target contacting a touch region of an outer face on the one side in the first direction of the covering. The at least one lifting actuator is configured to move the at least one movable part, or alternatively move the edge portion of the at least one opening of the housing in the first direction, and thereby relatively move the at least one movable part from the first height position to the second height position, or alternatively from the second height position to the first height position, relative to the edge portion of the at least one opening of the housing.

In such a touch sensing device, the edge portion of the at least one opening of the housing and the movable part are covered by the covering from the one side in the first direction, so that the gap between the edge portion of the at least one opening of the housing and the movable part is not exposed to the one side in the first direction. This arrangement achieves a seamless design of the touch sensing device.

The outer face of the covering may include at least one first region located on the one side in the first direction relative to the edge portion of the at least one opening of the housing and at least one second region located on the one side in the first direction relative to the at least one movable part. In a state where the at least one movable part is relatively located at the first height position relative to the edge portion of the at least one opening of the housing, the at least one first region and the at least one second region of the outer face may be substantially flush with each other. In a state where the at least one movable part is relatively located at the second height position relative to the edge portion of the at least one opening of the housing, the at least one second region of the outer face ay be relatively located on the other side or the one side in the first direction relative to the at least one first region of the outer face.

The at least one movable part may be disposed in the at least one opening of the housing with a gap between the at least one movable part and the edge portion of the at least one opening of the housing. In this case, the flexible layer may further include at least one third portion between the at least one first portion and the at least one second portion. The at least one third portion may be located on the one side in the first direction relative to the gap.

The at least one third portion may be configured to flex and stretch, or alternatively shrink, in accordance with the relative movement of the at least one second portion relative to the at least one first portion, from the third height position to the fourth height position, or alternatively from the fourth height position to the third height position.

Where the at least one third portion is provided, the outer face may further include at least one third region between the at least one first region and the at least one second region. The at least one third region may be located on the one side in the first direction relative to the gap. In a state where the at least one movable part is relatively located at the first height position relative to the edge portion of the at least one opening of the housing, the at least one first region, the at least one second region, and the at least one third region of the outer face may be substantially flush with each other. In a state where the at least one movable part is relatively located at the second height position relative to the edge portion of the at least one opening of the housing, the at least one second region of the outer face may be relatively located on the other side or the one side in the first direction relative to the at least one first region of the outer face, and the at least one third region of the outer face may slope obliquely from the at least one second region of the outer face to the at least one first region of the outer face.

Regardless of whether the at least one third portion and the at least one third region are provided, in a state where the at least one movable part is relatively located at the first height position relative to the edge portion of the at least one opening of the housing, the at least one first region of the outer face may be located on the other or the one side in the first direction relative to the at least one second region of the outer face.

The flexible layer may be configured to partly restore itself or partly stretches when the first face of the at least one second portion of the flexible layer relatively returns from the fourth height position to the third height position relative to the first face of the at least one first portion of the flexible layer and the at least one movable part relatively moves from the second height position to the first height position relative to the edge portion of the at least one opening of the housing, or alternatively when the first face of the at least one second portion of the flexible layer relatively returns from the third height position to the fourth height position relative to the first face of the at least one first portion of the flexible layer and the at least one movable part relatively moves from the first height position to the second height position relative to the edge portion of the at least one opening of the housing.

The covering may further include an outermost layer including the outer face. The outermost layer may be located on the one side in the first direction relative to the flexible layer. Where the outermost layer is omitted, the flexible layer may include the outer face.

The outermost layer may be configured to partly flex as the flexible layer partly flexes, or alternatively partly shrink as the flexible layer partly shrinks.

The covering may further include a cushioning layer disposed between the flexible layer and a combination of the housing and the at least one movable part. The cushioning layer may include at least one first portion, which may be interposed between the at least one first portion of the flexible layer and the first face of the edge portion of the at least one opening of the housing, and at least one second portion, which may be interposed between the at least one second portion of the flexible layer and the first face of the at least one movable part.

The at least one touch sensor may be provided on the first face of the at least one movable part. In this case, the at least one second portion of the flexible layer may be indirectly fixed to the first face of the at least one movable part via the at least one touch sensor.

The at least one lifting actuator may be a solenoid, a piezoelectric element, or a motor. Where the at least one lifting actuator is a solenoid, there may be provided a motion convertor to convert linear motion of a plunger of the solenoid into up-and-down motion of the movable part or the edge portion of the opening. Where the at least one lifting actuator is a motor, there may be provided a motion convertor to convert rotational motion of a rotation shaft of the motor into up-and-down motion of the movable part or the edge portion of the opening.

The outer face may further include at least one ornamental protrusion protruding to the one side in the first direction and/or at least one ornamental recess recessed to the other side in the first direction. The at least one ornamental protrusion and/or the at least one ornamental recess may be located between the at least one first region and the at least one second region. In a state where the at least one movable part is relatively located at the first height position relative to the edge portion of the at least one opening of the housing, the at least one first region and the at least one second region of the outer face may be substantially flush with each other except for the at least one ornamental protrusion and/or the at least one ornamental recess.

The touch sensing device of any of the above aspects may further include a controller. The controller may be configured to drive the at least one lifting actuator according to a receipt of at least one deformation instruction.

The at least one touch sensor may be configured to change or output an electric signal according to a contact by a detection target with the touch region of the outer face of the covering. The controller may be further configured to determine that a change in an electric signal or a receipt of an electric signal of the at least one touch sensor indicates the receipt of the at least one deformation instruction.

The touch sensing device of any aspect described above may further include a proximity detector configured to output the at least one deformation instruction to the controller according to an approach of a detection target to the touch region of the outer face of the covering.

The controller may be further configured to detect, after the receipt of the at least one deformation instruction, position information on the contact with the touch region by the detection target according to a change in an electric signal in the at least one touch sensor or a receipt of an electric signal from the at least one touch sensor.

The at least one touch sensor may be a touch panel configured to change or output an electric signal according to an operational input with a detection target to the touch region of the outer face of the covering. In this case, the controller may be further configured to detect information on the operational input according to a change in an electric signal in the at least one touch sensor or a receipt of an electric signal from the at least one touch sensor, and to determine whether the detected information on the operational input matches predetermined information on an operational input recorded on a memory. The controller may be further configured such that if the controller determines that the detected information on the operational input matches the information on the operational input on the memory, then the controller determines that the detected information on the operational input indicates the receipt of the at least one deformation instruction.

The controller may be further configured to detect, after the receipt of the at least one deformation instruction, information on an operational input with the detection target to the touch region according to a change in an electric signal in the at least one touch sensor or a receipt of an electric signal from the at least one touch sensor.

The controller may be further configured to detect, after the receipt of the at least one deformation instruction, information on the operational input according to a change in an electric signal in the at least one touch sensor or a receipt of an electric signal from the at least one touch sensor, and to determine whether the detected information on the operational input matches predetermined information on an operational input recorded on a memory.

The controller may be further configured such that if the controller determines that the detected information on the operational input matches the information on the operational input on the memory, then the controller detects information on the operational input with the detection target to the touch region according to a change in an electric signal in the at least one touch sensor or a receipt of an electric signal from the at least one touch sensor.

The touch sensing device of any aspect described above may further include at least one vibration generator to apply vibration to the at least one movable part. The controller may be further configured to drive the at least one vibration generator according to a change in an electric signal in the at least one touch sensor or a receipt of an electric signal from the at least one touch sensor.

The edge portion of the at least one opening of the housing and/or the movable part may include a stepped portion. In this case, the outermost layer may or may not extend along the stepped portion.

In a state where the at least one movable part is relatively located at the first or second height position relative to the edge portion of the at least one opening of the housing, the at least one first region of the outer face may be located on the other side or the one side in the first direction relative to the at least one second region of the outer face. In this case, a step may be formed in a portion between the at least one first region of the outer face and the at least one second region of the outer face.

The at least one third portion of the flexible layer may be translucent.

The at least one opening of the housing may be generally circular. In this case, the movable part may have a generally disk-shaped cross section in a second direction substantially orthogonal to the first direction.

The at least one opening of the housing may include a plurality of openings. In this case, the at least one movable part may include a plurality of movable parts disposed in the respective openings. The at least one first portion and the at least one second portion of the flexible layer may include a plurality of first portions and a plurality of second portions, respectively. The at least one lifting actuator may include a plurality of lifting actuators, and each of the lifting actuators may be configured to move a corresponding one of the movable parts, or alternatively move a corresponding one of the edge portions of the openings of the housing, in the first direction. The at least one deformation instruction may include a plurality of deformation instructions. The controller may be further configured to drive each of the lifting actuators according to a receipt of a corresponding one of the deformation instructions.

The at least one movable part may include a plurality of movable parts disposed in the at least one opening. The at least one first portion and the at least one second portion of the flexible layer may include a plurality of first portions and a plurality of second portions, respectively. The at least one lifting actuator may include a plurality of the lifting actuators, and each of the lifting actuators may be configured to move a corresponding one of the movable parts in the first direction. The at least one deformation instruction may include a plurality of deformation instructions. The controller may be further configured to drive each of the lifting actuators according to a receipt of a corresponding one of the deformation instructions.

Where the at least one first portion and the at least one second portion include a plurality of first portions and a plurality of second portions, respectively, the at least one first region and the at least one second region of the outer face may include a plurality of first regions and a plurality of second regions, respectively. At least one of the second regions may include the touch region to be contacted by the detection target.

The plurality of movable parts may include at least one first movable part and at least one second movable part. The at least one opening of the housing may include a plurality of openings. The edge portion of the at least one opening of the housing may include a plurality of edge portions of openings. The plurality of openings may include at least one first opening and at least one second opening. The edge portions of the openings may include an edge portion of at least one first opening and an edge portion of at least one second opening. The plurality of lifting actuators may include at least one first lifting actuator and at least one second lifting actuator. The at least one first lifting actuator may be configured to move the at least one first movable part or the edge portion of the at least one first opening in the first direction so as to relatively move the at least one first movable part from the first height position to the second height position relative to the edge portion of the at least one first opening. The at least one second lifting actuator may be configured to move the at least one second movable part or the edge portion of the at least one second opening in the first direction so as to relatively move the at least one second movable part from the first height position to the second height position relative to the edge portion of the at least one second opening.

The controller may be further configured to detect information on the operational input according to a change in an electric signal in the at least one touch sensor or according to a receipt of an electric signal from the at least one touch sensor, and to determine whether the detected information on the operational input matches at least one piece of information on an operational input recorded on a memory. The controller may be further configured such that if the controller determines that the detected information on the operational input matches the at least one piece of information on the operational input on the memory, then the controller determines that the detected information on the operational input indicates the receipt of the deformation instruction. The controller may be further configured to drive at least one of, or all of, the lifting actuators corresponding to the deformation instruction according to the receipt of the deformation instruction.

Each of the second regions may include a touch region to be contacted by a detection target. In this case, the at least one touch sensor may include a plurality of touch sensors. Each of the touch sensors may be provided at, or disposed in spaced relation on the other side in the first direction relative to, a corresponding one of the movable parts.

Where the plurality of touch sensors constitutes the touch panel, the controller may be further configured to detect information on an operational input according to respective changes in electric signals in the touch sensors or according to respective receipts of the electric signals from the touch sensors, and to determine whether the detected information on the operational input matches any one of pieces of information on operational inputs of a plurality of types recorded on a memory. Also, the controller may be further configured such that if the controller determines that the detected information on the operational input matches the one piece of the information on the operational inputs of the plurality of types on the memory, then the controller determines that the detected information on the operational input indicates a receipt of a deformation instruction corresponding to the one piece of the information on the operational inputs of the plurality of types. The controller may be further configured to drive one or more of the lifting actuators that correspond to the deformation instruction according to the receipt of the deformation instruction.

One of the at least one touch sensor may be disposed in spaced relation on the other side in the first direction relative to the plurality of movable parts and configured to detect a detection target contacting the touch regions corresponding to the plurality of movable parts.

Figure 1A:
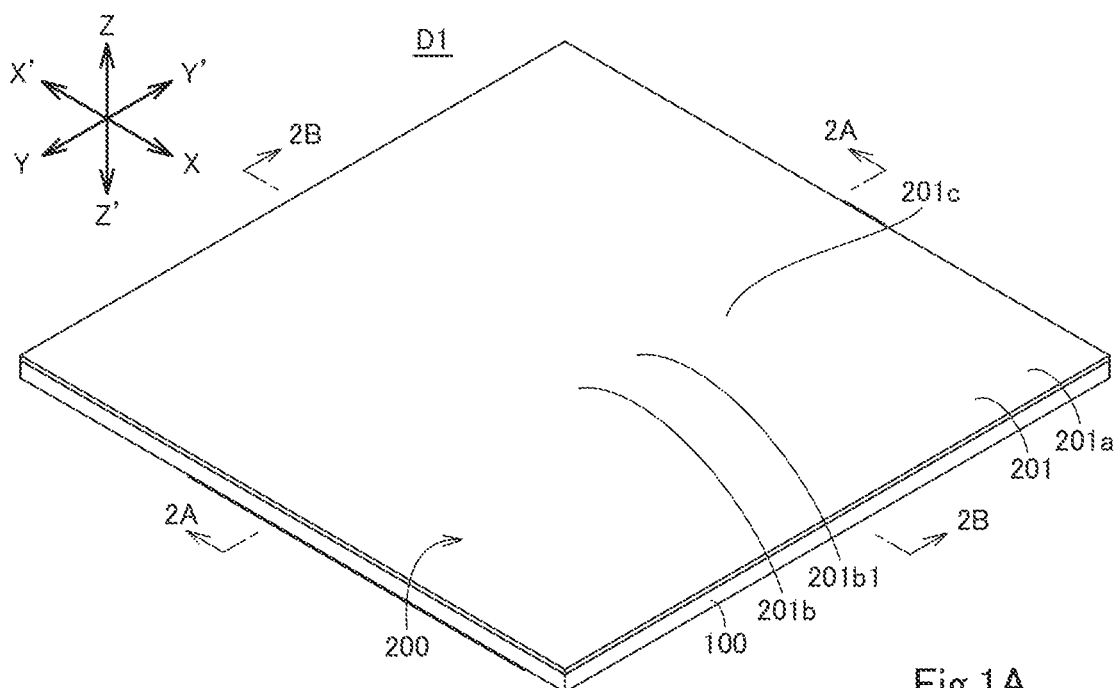
FIG. 1A is a front, top, right side perspective view of a touch sensing device according to a first embodiment of the invention, in a state where an outer face of the touch sensing device is flattened.
Figure 1B:
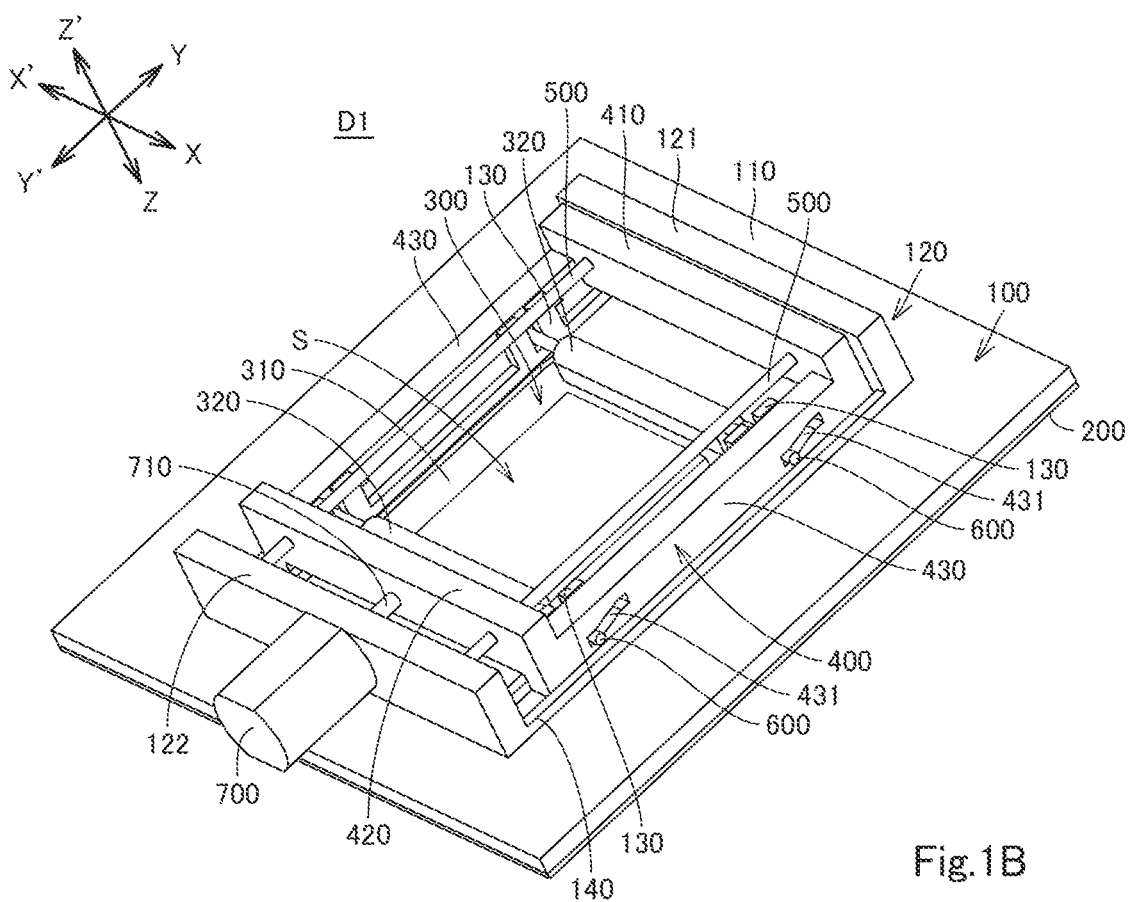
FIG. 1B is a rear, bottom, right side perspective view of the touch sensing device according to the first embodiment, in the state where the outer face of the touch sensing device is flattened.

In the brief description of the drawings above and the description of embodiments which follows, relative spatial terms such as "upper", "lower", "top", "bottom", "left", "right", "front", "rear", etc., are used for the convenience of the skilled reader and refer to the orientation of the touch sensing devices and their constituent parts as depicted in the drawings. No limitation is intended by use of these terms, either in use of the invention, during its manufacture, shipment, custody, or sale, or during assembly of its constituent parts or when incorporated into or combined with other apparatus.

DESCRIPTION OF EMBODIMENTS

Hereinafter described are a plurality of embodiments of the invention, including first and second embodiments and their variants. It should be noted that constituents of the embodiments and their variants to be described can be combined in any possible manner. It should also be noted that the materials, the shapes, the dimensions, the numbers, the arrangements, etc. that constitute each constituent of the embodiments and their variants to be described are presented by way of example only and can be modified in any manner as long as the same functions can be fulfilled. First embodiment Hereinafter described is a touch sensing device D1 (which may be simply referred to as a sensing device D1) according to a plurality of embodiments of the invention, including the first embodiment and variants thereof, with reference to FIGS. 1A to 6B. FIGS. 1A to 5C illustrate the sensing device D1 according to the first embodiment. FIGS. 6A and 6B illustrate a variant of the sensing device D1 of the first embodiment. FIGS. 1A to 2B, 3A to 5B, and 6A to 6B indicate a Z-Z' direction (first direction). FIGS. 1A to 2A, 2C to 5A, and 5C to 6A indicate a Y-Y' direction (second direction). FIGS. 1A to 1B, 2B to 4B, 5B, 5C, and 6B indicate an X-X' direction (third direction). The Y-Y' direction is substantially orthogonal to the Z-Z' direction, and the X-X' direction is substantially orthogonal to the Z-Z' and Y-Y' directions.

The sensing device D1 may be, for example, an interior part of an automobile (e.g., a console (see FIGS. 1 to 2A and 3A to 3C), an armrest, a seat, a dashboard, a steering wheel, an inner panel of a door, or a headliner (lining)); furniture (e.g., a sofa, a stool, a chair, a desk, a table, etc.); a portable information terminal, such as a smartphone; a stationary information terminal to be operated by a user (e.g., an electric appliance, an automated teller machine (ATM), a ticket vending device, a reception terminal for making a loan contract for cash advances or the like services, a multimedia terminal for making a ticket reservation or a product purchase application, a vending machine, a point of sales (POS) terminal, a ticketing machine for issuing boarding passes or other tickets installed at an airport, a train station, etc., an amusement device (e.g., a pachinko machine, a slot machine in a pachinko parlor, a slot machine, an arcade game, or the like); or the like.

The sensing device D1 includes a housing 100. The housing 100 is a housing of an interior of an automobile, or a housing of furniture, portable information terminal, fixed information terminal, or the like described above. The housing 100 is made of an insulating material, such as a synthetic resin or the like. The housing 100 includes an opening 101. The opening 101 is open at least in the Z direction (at least to one side in the first direction). For example, the opening 101 may be a bottomed hole in the housing 100 opening only in the Z direction, or may be a through hole extending through the housing 100 in the Z-Z' direction and opening in the Z and Z' directions (see FIGS. 1A to 5C). When viewed from the Z-direction side, the opening 101 may have any shape but may be generally circular or polygonal, for example.

The housing 100 further includes an edge portion 110 of the opening 101. The edge portion 110 may be a generally ring-shaped portion around the opening 101 of the housing 100. The edge portion 110 may alternatively be at least one of first, second, third, or fourth side portions on the Y-, Y'-, X-, or X'-direction sides, respectively, relative to the opening 101. The edge portion 110 may be part of the housing 100 or may be a separate member from the housing 100. The edge portion 110 includes a first face 111 on the Z-direction side and a second face 112 on the Z'-direction side. The Z-Z' direction is the axial direction of the opening 101 and also the thickness direction of the edge portion 110, and Z' direction corresponds to the other side in the first direction.

Sensing device D1 further includes a movable part 300. The movable part 300 includes a body 310, which is a plate or block of an insulating material, such as a synthetic resin or the like. The body 310 includes a first face 311 on the Z-direction side and a second face 312 on the Z'-direction side. The body 310 is relatively movable within the opening 101, relative to the edge portion 110, between a first height position and a second height position in the Z-Z' direction. Specifically, (1) the body 310 may be movable within the opening 101, relative to the edge portion 110, between the first height position and the second height position. In this case, the edge portion 110 is an integral part of, or a separate member from, the housing 100, and is fixed to the housing 100 or a holding portion (not illustrated) inside the housing 100. Alternatively, (2) the edge portion 110 may be movable relative to the body 310, between the first height position and the second height position. In this case, the edge portion 110 is a separate member from the housing 100, and the body 310 is held by a holding portion (not illustrated) inside the housing 100 and thereby fixed in position within the opening 101. It should be noted that the movable part 300 is only required to be relatively movable relative to the edge portion 110, and the movable part 300 itself may not move.

The first height position may be such that the first face 311 of the body 310 of the movable part 300 is located at a predetermined height in the Z-Z' direction relative to the first face 111 of the edge portion 110 of the housing 100. For example, the first height position may be such that the first face 311 of the body 310 is located at the same height in the Z-Z' direction as the first face 111 of the edge portion 110 of the housing 100 (see FIGS. 2A to 2B). In this case, the first face 311 of the body 310 at the first height position and the first face 111 of the edge portion 110 of the housing 100 may form a composite face, and the composite face has a flat shape extending substantially orthogonally to the Z-Z' direction. Alternatively, the first height position may be such that the first face 311 of the body 310 is located on the Z- or Z'-direction side relative to the first face 111 of the edge portion 110 of the housing 100. Where the first face 311 of the body 310 at the first height position is relatively located on the Z-direction side relative to the first face 111 of the edge portion 110 of the housing 100, the composite face may have a spherical or arcuate shape protruding in the Z direction. Where the first face 311 of the body 310 at the first height position is relatively located on the Z'-direction side relative to the first face 111 of the edge portion 110 of the housing 100, the composite face may have a spherical or arcuate shape recessed in the Z' direction. It also be appreciated that the first height position is a neutral position of the body 310.

The second height position may be on the Z'-direction side relative to the first height position (see FIGS. 5A to 5B), where the first face 311 of the body 310 is relatively located on the Z'-direction side relative to the first height position, with respect to the first face 111 of the edge portion 110 of the housing 100. Alternatively, the second height position may be on the Z-direction side relative to the first height position, where the first face 311 of the body 310 is relatively located on the Z-direction side relative to the first height position, with respect to the first face 111 of the edge portion 110 of the housing 100.

The body 310 may be disposed in the opening 101 of the housing 100 with a gap G between the body 310 and the edge portion 110. In this case, the body 310 may have any cross-sectional shape in the Y-Y' direction, buy may have a cross-sectional shape in the Y-Y' direction corresponding to that of the opening 101. For example, where the opening 101 is circular, the body 310 may have a disk-shaped cross section in the Y-Y' direction (see FIGS. 1A to 5C), and where the opening 101 is polygonal, the body 310 may have a polygonal cross section in the Y-Y' direction. Alternatively, the body 310 may be disposed in the opening 101 of the housing 100 without any gap G between the body 310 and the edge portion 110. In this case, the body 310 has a cross-sectional shape in the Y-Y' direction corresponding to that of the opening 101, and may have outer dimensions (area) of the cross section in the Y-Y' direction that is substantially the same as, or slightly smaller than, the dimensions (area) of the cross section in the Y-Y' direction of the opening 101. The cross-sectional shape and the outer dimension in the Y-Y' direction of the body 310 may be fabricated with high accuracy or with low accuracy corresponding to the cross-sectional shape and the dimension in the Y-Y' direction of the opening 101. Even where no gap G is provided between the body 310 and the edge portion 110, there may be left a very small or narrow gap between the body 310 and the edge portion 110.

The sensing device D1 further includes a covering 200. The covering 200 includes a flexible layer 210. The flexible layer 210 is made of a flexible and stretchable material, such as an elastic material (e.g., rubber or elastomer), a styrene-based material, a polyurethane-based material, a polyester-based material, an olefin-based material, polyvinyl chloride (PVC), silicon, a cloth made of a fiber material (e.g., a woven or knitted fabric), or the like. The flexible layer 210 covers at least the edge portion 110 of the housing 100 and the movable part 300 from the Z-direction side, and extends at least along the first face 311 of the body 310 and the first face 111 of the edge portion 110 of the housing 100, i.e., at least along the composite face of any aspect above. Where the composite face has a flat shape extending substantially orthogonally to the Z-Z' direction at the first height position, the flexible layer 210 also has a flat shape extending substantially orthogonal to the Z-Z' direction. Where the composite face has a spherical or arcuate shape protruding in the Z direction at the first height position, the flexible layer 210 has a spherical or arcuate shape protruding in the Z direction. Where the composite face has a spherical or arcuate shape recessed in the Z' direction at the first height position, the flexible layer 210 has a spherical or arcuate shape protruding in the Z direction.

The flexible layer 210 includes a first portion 211 and a second portion 212. The first portion 211 is directly or indirectly fixed to the first face 111 of the edge portion 110 of the housing 100. The first portion 211 includes a first face on the Z-direction side and a second face on the Z'-direction side. The second portion 212 is directly or indirectly fixed to the first face 311 of the body 310 of the movable part 300. For example, the second portion 212 may be fixed to the first face 311 of the body 310 of the movable part 300 indirectly via an adhesive or a double-sided tape (via at least one first intermediate layer 230 to be described), or fixed directly and firmly (in intimate contact to) to the first face 311 of the body 310 of the movable part 300 by being insert-molded or outsert-molded into the body 310 of the movable part 300. In the latter case, the first face 311 may be a boundary face between the body 310 of the movable part 300 and the second portion 212. The second portion 212 includes a first face on the Z-direction side and a second face on the Z'-direction side.

Where the body 310 and the edge portion 110 have configuration (1) described above and are provided with the gap G therebetween, the second portion 212 supports the body 310 movably and floatably in the Z-Z' direction. Where the body 310 and the edge portion 110 have configuration (1) described above and are not provided with the gap G therebetween, the second portion 212 supports the body 310 movably in the Z-Z' direction. Where the body 310 and the edge portion 110 have configuration (2) described above and are provided with the gap G therebetween, the first portion 211 supports the edge portion 110 movably and floatably in the Z-Z' direction. Where the body 310 and the edge portion 110 have configuration (2) described above and are not provided with the gap G therebetween, the first portion 211 supports the edge portion 110 movably in the Z-Z' direction.

Where the body 310 and the edge portion 110 are provided with the gap G therebetween, the flexible layer 210 may further include a third portion 213. The third portion 213 is located on the Z-direction side relative to the gap G and is located between the first portion 211 and the second portion 212. The third portion 213 includes a first face on the Z-direction side and a second face on the Z'-direction side. Where the body 310 and the edge portion 110 are not provided with the gap G therebetween, the third portion 213 is omitted.

In a state where the body 310 is relatively located at the first height position relative to the edge portion 110 of the housing 100, the first face of the second portion 212 is relatively located at a predetermined third height position in the Z-Z' direction relative to the first face of the first portion 211. For example, where the composite face has a flat shape extending at the first height position substantially orthogonally to the Z-Z' direction and the third portion 213 is provided, the first face of the second portion 212 at the third height position is located at substantially the same height in the Z-Z' direction as the first face of the first portion 211 and the first face of the third portion 213 (see FIGS. 2A to 2B). Where the composite face has a flat shape extending at the first height position substantially orthogonally to the Z-Z' direction and the third portion 213 is not provided, the first face of the second portion 212 at the third height position is located at substantially the same height in the Z-Z' direction as the first face of the first portion 211. Where the composite face has a spherical or arcuate shape protruding in the Z direction at the first height position and the third portion 213 is provided, the first face of the second portion 212 at the third height position is relatively located on the Z-direction side relative to the first face of the first portion 211 and the first face of the third portion 213, and the first face of the third portion 213 is relatively located on the Z-direction side relative to the first face of the second portion 212. Where the composite face has a spherical or arcuate shape protruding in the Z direction at the first height position and the third portion 213 is not provided, the first face of the second portion 212 at the third height position is relatively located on the Z-direction side relative to the first face of the first portion 211. Where the composite face has a spherical or arcuate shape recessed in the Z' direction at the first height position at the first height position and the third portion 213 is provided, the first face of the second portion 212 at the third height position is relatively located on the Z'-direction side relative to the first face of the first portion 211 and the first face of the third portion 213, and the first face of the third portion 213 is located on the Z'-direction side relative to the first face of the second portion 212. Where the composite face has a spherical or arcuate shape recessed in the Z' direction at the first height position at the first height position and the third portion 213 is not provided, the first face of the second portion 212 is relatively located on the Z'-direction side relative to the first face of the first portion 211.

In a state where the body 310 is relatively located at the second height position relative to the edge portion 110 of the housing 100, the first face of the second portion 212 is relatively located at a fourth height position relative to the first face of the first portion 211. The fourth height position may be positioned on the Z'-direction side relative to the third height position (see FIGS. 5A to 5B), where the first face of the second portion 212 is relatively located on the Z'-direction side relative to the third height position with respect to the first face of the first portion 211. Alternatively, the fourth height position may be positioned on the Z-direction side relative to the third height position, where the first face of the second portion 212 is relatively located on the Z-direction side relative to the third height position with respect to the first face of the first portion 211.

The flexible layer 210 is configured to partly flex and stretch in accordance with a relative movement of the second portion 212 relative to the first portion 211, from the third height position to the fourth height position. Specifically, where the third portion 213 is provided, it is the third portion 213 that is configured to flex and stretch. Where the third portion 213 is not provided, it is a boundary between the first portion 211 and the second portion 212 that is configured to flex and stretch. Particularly where the opening 101 is generally circular and has a disk-shaped cross section in the Y-Y' direction, stretching stress concentration is unlikely to occur on part of the third portion 213 or the above boundary during flexing and stretching.

The covering 200 may further include an outermost layer 220 (see FIGS. 6A and 6B). The outermost layer 220 is flexible and stretchable, and made of a natural, artificial, or synthetic leather, a cloth made of a fiber material (e.g., a woven or knitted fabric), a resin film, or the like material. The outermost layer 220 covers the flexible layer 210 from the Z-direction side and is directly or indirectly fixed to the flexible layer 210. The outermost layer 220 extends along the flexible layer 210. Where the flexible layer 210 has a flat shape extending substantially orthogonally to the Z-Z' direction, the outermost layer 220 also has a flat shape extending substantially orthogonally to the Z-Z' direction. Where the flexible layer 210 has a spherical or arcuate shape protruding in the Z direction, the outermost layer 220 also has a spherical or arcuate shape protruding in the Z direction. Where the flexible layer 210 has a spherical or arcuate shape recessed in the Z' direction, the outermost layer 220 also has a spherical or arcuate shape recessed in the Z' direction.

The outermost layer 220 includes a first portion and a second portion. The first portion of the outermost layer 220 is directly or indirectly fixed to the first face of the first portion 211 of the flexible layer 210. The second portion of the outermost layer 220 is directly or indirectly fixed to the first face of the second portion 212 of the flexible layer 210. As the second portion 212 of the flexible layer 210 relatively moves from the third height position to the fourth height position relative to the first portion 211 of the flexible layer 210, the second portion of the outermost layer 220 accordingly relatively moves relative to the first portion of the outermost layer 220. Where the flexible layer 210 is provided with the third portion 213, the outermost layer 220 further includes a third portion. The outermost layer 220 is configured to partly flex and stretch in accordance with partial flexing and stretching of the flexible layer 210. Specifically, where the flexible layer 210 is provided with the third portion 213 configured to flex and stretch, the third portion of the outermost layer 220 is configured to flex and stretch in accordance with the flexing and stretching of the third portion 213 of the flexible layer 210. Where the flexible layer 210 is not provided with the third portion 213 and the boundary between the first portion 211 and the second portion 212 of the flexible layer 210 is configured to flex and stretch, a boundary between the first portion and the second portion of the outermost layer 220 is configured to flex and stretch in accordance with the flexing and stretching of the boundary of the flexible layer 210.

The covering 200 further includes an outer face 201 on the Z-direction side. Where the outermost layer 220 is provided, the outer face 201 is a face on the Z-direction side of outermost layer 220. Where the outermost layer 220 is not provided, the outer face 201 is a face on the Z-direction side of the flexible layer 210. Where the flexible layer 210 or the outermost layer 220 has a flat shape extending substantially orthogonally to the Z-Z' direction, the outer face 201 has a flat shape extending substantially orthogonally to the Z-Z' direction. Where the flexible layer 210 or the outermost layer 220 has a spherical or arcuate shape protruding in the Z direction, the outer face 201 has a spherical or arcuate shape protruding in the Z direction. Where the flexible layer 210 or the outermost layer 220 has a spherical or arcuate shape recessed in the Z' direction, the outer face 201 has a spherical or arcuate shape recessed in the Z' direction. The outer face 201 includes a first region 201a and a second region 201b. The first region 201a is a region of the outer face 201 that is located on the Z-direction side relative to the edge portion 110 of the housing 100. The second region 201b is a region of the outer face 201 that is located on the Z-direction side relative to the body 310 of the movable part 300. The second region 201b includes a touch region 201b1 to be contacted from the Z-direction side by a detection target, such as a human finger or a stylus.

Where the body 310 and the edge portion 110 are provided with the gap G therebetween, the outer face 201 further includes a third region 201c. The third region 201c is located on the Z-direction side relative to the gap G and located between the first region 201a and the second region 201b.

At least one ornamental protrusion and/or at least one ornamental recess (not illustrated) may be provided between the first region 201a and the second region 201b of the outer face 201. The at least one ornamental protrusion and/or the at least one ornamental recess may be any ornamental configuration. For example, the at least one ornamental protrusion and/or the at least one ornamental recess may be formed by embossing or stitching the outer face 201 of the outermost layer 220. Ornamental printing (not illustrated) may be applied between the first region 201a and the second region 201b of the outer face 201. If there is provided at least one of the at least one ornamental protrusion, the at least one ornamental recess, and the ornamental printing, such provision allows a user to visually recognize the first region 201a of the outer face 201. The at least one of the at least one ornamental protrusion, the at least one ornamental recess, and the ornamental printing may be provided around the touch region 201b1, rather than between the first region 201a and the second region 201b of the outer face 201. The at least one ornamental protrusion, the at least one ornamental recess, and the ornamental printing can be omitted.

Where the third region 201c is provided, in a state where the body 310 is relatively located at the first height position relative to the edge portion 110 of the housing 100, the first region 201a, the second region 201b, and the third region 201c are substantially flush with each other, while in a state where the body 310 is relatively located at the second height position relative to the edge portion 110 of the housing 100, the third region 201c is stretched such as to slope from the first region 201a to the second region 201b. Where the third region 201c is not provided, in a state where the body 310 is relatively located at the first height position relative to the edge portion 110 of the housing 100, the first region 201a and the second region 201b are substantially flush with each other, while in a state where the body 310 is relatively located at the second height position relative to the edge portion 110 of the housing 100, it is a boundary between the first region 201a and the second region 201b that is stretched such as to slope. The term "substantially flush" herein refers to a state in which there is no substantial height difference, except for the at least one ornamental protrusion and/or the at least one ornamental recess if provided, at boundaries between the first region 201a, the second region 201b, and the third region 201c, or alternatively at a boundary between the first region 201a and the second region 201b, irrespective of whether the outer face 201 has a flat shape extending substantially orthogonally to the Z-Z' direction or a spherical or arcuate shape protruding in the Z direction or recessed in the Z' direction.

The covering 200 may further include at least one first intermediate layer 230 (see FIGS. 6A and 6B), which is flexible and stretchable. The at least one first intermediate layer 230 may be one or a plurality of first intermediate layers. The plurality of first intermediate layers 230 is laminated in the Z-Z' direction. The one or plurality of first intermediate layers 230 is interposed between the flexible layer 210 and the combination of the edge portion 110 of the housing 100 and the movable part 300. The or each first intermediate layer 230 is a double-sided tape, an adhesive layer, a cushioning layer, or the like.

The or each first intermediate layers 230 includes a first portion and a second portion. The first portion of the one or plurality of first intermediate layers 230 is interposed between the first portion 211 of the flexible layer 210 and the edge portion 110 of the housing 100. The second portion of the one or plurality of first intermediate layers 230 is interposed between the second portion 212 of the flexible layer 210 and the body 310 of the movable part 300. As the second portion 212 of the flexible layer 210 relatively moves from the third height position to the fourth height position relative to the first portion 211 of the flexible layer 210, the second portion of the one or plurality of first intermediate layers 230 accordingly relatively moves relative to the first portion of the one or plurality of first intermediate layers 230. Where the flexible layer 210 is provided with the third portion 213 of, the or each first intermediate layer 230 further includes a third portion. The one or plurality of first intermediate layers 230 are configured to partly flex and stretch in accordance with partial flexing and stretching of the flexible layer 210. Specifically, where the flexible layer 210 is provided with the third portion 213 configured to flex and stretch, the third portion of the one or plurality of first intermediate layers 230 is configured to flex and stretch in accordance with the flexing and stretching of the third portion 213 of the flexible layer 210. Where the flexible layer 210 is not provided with the third portion 213 and the boundary between the first portion 211 and the second portion 212 of the flexible layer 210 is configured to flex and stretch, a boundary between the first portion and the second portion of the one or plurality of first intermediate layers 230 is configured to flex and stretch in accordance with the flexing and stretching of the boundary of the flexible layer 210. The at least one first intermediate layer 230 can be omitted.

When the outermost layer 220 is provided, the covering 200 may further include at least one second intermediate layer (not illustrated), which is flexible and stretchable. The at least one second intermediate layer may be a plurality of second intermediate layers laminated in the Z-Z' direction. The one or plurality of second intermediate layers is interposed between the outermost layer 220 and the flexible layer 210. Where the at least one second intermediate layer is provided, the outermost layer 220 is indirectly fixed to the flexible layer 210 via the one or plurality of second intermediate layers. The or each second intermediate layer is a double-sided tape, an adhesive layer, a cushioning layer, or the like.

The or each second intermediate layer include a first portion and a second portion. The first portion of the one or plurality of second intermediate layers is interposed between the first portion 211 of the flexible layer 210 and the first portion of the outermost layer 220. The second portion of the one or plurality of second intermediate layers is interposed between the second portion 212 of the flexible layer 210 and the second portion of the outermost layer 220. As the second portion 212 of the flexible layer 210 relatively moves from the third height position to the fourth height position relative to the first portion 211 of the flexible layer 210, the second portion of the one or plurality of second intermediate layers accordingly moves relative to the first portion of the one or plurality of second intermediate layers. Where the flexible layer 210 is provided with the third portion 213, the or each second intermediate layer further includes a third portion. The one or plurality of second intermediate layers is configured to partly flex and stretch in accordance with partial flexing and stretching of the flexible layer 210. Specifically, where the flexible layer 210 is provided with the third portion 213 configured to flex and stretch, the third portion of the one or plurality of second intermediate layers is configured to flex and stretch in accordance with the flexing and stretching of the third portion 213 of the flexible layer 210. Where the flexible layer 210 is not provided with the third portion 213 and the boundary between the first portion 211 and the second portion 212 of the flexible layer 210 is configured to flex and stretch, a boundary between the first portion and the second portion of the one or plurality of second intermediate layers is configured to flex and stretch in accordance with the flexing and stretching of the boundary of the flexible layer 210. The at least one second intermediate layer can be omitted.

Where the covering 200 includes the flexible layer 210 only and provided with the third portion 213, at least the third portion 213 of the flexible layer 210 may be translucent. The second portion 212, in addition to the third portion 213, of the flexible layer 210 may be translucent. The first portion 211, in addition to the third portion 213 and the second portion 212, of the flexible layer 210 may be translucent. The entire flexible layer 210 of the covering 200 may be translucent. Where the covering 200 further includes the outermost layer 220, the third portion of the outermost layer 220 may also be translucent. the second portion of the outermost layer 220, in addition to the third portion, of the outermost layer 220 may be translucent. The first portion, in addition to the third and second portions, of the outermost layer 220 may also be translucent. The entire outermost layer 220 may also be translucent. Where the covering 200 further includes the at least one first intermediate layer 230, the third portion of the at least one first intermediate layer 230 may also be translucent. The second portion, in addition to the third portion, of the at least one first intermediate layer 230 may also be translucent. The first portion, in addition to the third and second portions, of the at least one first intermediate layer 230 may also be translucent. The entire at least one first intermediate layer 230 may also be translucent. Where the covering 200 further includes the at least one second intermediate layer, the third portion of the at least one second intermediate layer may also be translucent. The second portion, in addition to the third portion, of the at least one second intermediate layer may also be translucent. The first portion, in addition to the third and second portions, of the at least one second intermediate layer may also be translucent. The entire at least one second intermediate layer may also be translucent. In any of the above cases, the above translucent portion or portions transmit light in the Z direction, and the light may be emitted from a light-emitting device (not illustrated) located on the Z'-direction side relative to the covering 200. The covering 200 may not have any translucency. As used herein the term "translucent" means that an element allows transmission of some light and the element may be transparent.

The sensing device D1 further includes a motion convertor and a lifting actuator 700. The lifting actuator 700 is a solenoid including a plunger 710 and a coil (not illustrated). The motion convertor is configured to convert the motion of the plunger 710 in the Y-Y' direction into the up-and-down motion in the Z-Z' direction of the movable part 300 or the edge portion 110 of the housing 100.

Where the body 310 and the edge portion 110 have configuration (1) described above, the motion convertor is configured as described below. The motion convertor includes at least one guide 140 and/or at least one guide shaft 500, and a slider 400.

The at least one guide 140 is configured to guide the slider 400 movably in the Y-Y' directions relative to the edge portion 110 of the housing 100. For example, the or each guide 140 may be provided on the second face 112 of the edge portion 110 of the housing 100 and include two ridges, and the ridges may extend in the Y-Y' direction in side-by-side and spaced relation in the X-X' direction. In this case, the slider 400 includes at least one runner 430. The or each runner 430 has a dimension in the X-X' direction is substantially the same as the distance in the X-X' direction between the two ridges. The or each runner 430 is configured to be guided such as to move in the Y-Y' direction between the two ridges of the or each guide 140. In this manner, the slider 400 is movable in the Y-Y' directions along the at least one guide 140. In an embodiment shown in FIGS. 1A to 6B, the at least one guide 140 include two guides 140, and the at least one runner 430 include two runners 430. One and the other of the guides 140 are located on the X- and X'-direction sides, respectively, relative to the opening 101. One of the two runners 430 is configured to be guided such as to move in the Y-Y' direction between the two ridges of the guide 140 on the X-direction side, and the other runner 430 is configured to be guided such as to move in the Y-Y' direction between the two ridges of the guide 140 on the X'-direction side.

Alternatively, the or each guide 140 may be provided on the second face 112 of the edge portion 110 of the housing 100 and include a guide rail extending in the Y-Y' direction. In this case, the or each runner 430 of the slider 400 includes a rail groove (not shown). The guide rail of the or each guide 140 is received in the rail groove of the or each runner 430 of the slider 400 such as to be relatively movable in the Y-Y' direction. The slider 400 is thus movable in the Y-Y' directions along the at least one guide 140. The or each guide 140 may include a plurality of guide rails, and the or each runner 430 may include a plurality of rail grooves.

The at least one guide shaft 500 extends in the Y-Y' direction and through the slider 400 in the Y-Y' direction. In this case, holding portions 121 and 122 are provided on the second face 112 of the edge portion 110 of the housing 100. The holding portion 121 and the holding portion 122 are disposed on the Y- and Y'-direction sides, respectively, relative to the opening 101. The holding portion 121 holds an end portion on the Y-direction side of the or each guide shaft 500 and the holding portion 122 holds an end portion on the Y'-direction side of the or each guide shaft 500. A distance between the holding portions 121 and 122 is larger than a dimension in the Y-Y' direction of the slider 400. The slider 400 is movable in the Y-Y' direction between the holding portions 121 and 122, along the at least one guide shaft 500. In the embodiment shown in FIGS. 1A to 6B, the at least one guide shaft 500 include two guide shafts 500, and the slider 400 includes coupling portions 410 and 420 to couple the two runners 430. The coupling portions 410 and 420 are disposed between the holding portions 121 and 122 in spaced relation along the Y-Y' direction. The two guide shafts 500 extend through the coupling portions 410 and 420 in the Y-Y' direction, and the slider 400 is movable along the two guide shafts 500.

(A) The slider 400 may move in the Y' direction from a neutral position (see FIGS. 2A to 2C) to a displaced position (see FIGS. 5A to 5C) along the at least one guide 140 and/or the at least one guide shaft 500 as described above. In this case, the displaced position is located on the Y'-direction side relative to the neutral position. Alternatively, (B) the slider 400 may move in the Y direction from a neutral position to a displaced position along the at least one guide 140 and/or the at least one guide shaft 500 as described above. In this case, the displaced position is located on the Y-direction side relative to the neutral position.

Where both the at least one guide 140 and the at least one guide shaft 500 are provided, the at least one guide 140 may be provided between the holding portions 121 and 122 holding the at least one guide shaft 500 on the second face 112 of the edge portion 110 of the housing 100. One of the coupling portions 410 or 420 of the slider 400 may be omitted.

The motion convertor further includes at least one cam groove 431 of the slider 400, at least one cam shaft 600, at least one holding portion 320 of the movable part 300, and at least one holding portion 130 of the housing 100.

The at least one cam groove 431 includes one or a plurality of cam grooves. Where the at least one runner 430 is a single runner 430, the runner 430 is provided with the one or plurality of cam grooves 431. Where the at least one runner 430 is two runners 430 and the at least one cam groove 431 is a plural of cam grooves 431, each of the two runners 430 is provided with one of, or more than one of, the cam grooves 431. The or each cam groove 431 passes through the or a corresponding runner 430 in the X-X' direction. The or each cam groove 431 includes a first grooved portion, a second grooved portion, and a middle grooved portion therebetween. The first and second grooved portions of the or each cam groove 431 have any of the following configurations (C1) to (C4).

(C1) Where the second height position is positioned on the Z'-direction side relative to the first height position and the slider 400 is configured to move in manner (A) descried above, the second grooved portion is located on the Z'-direction side and on the Y-direction side relative to the first grooved portion (see FIGS. 2A to 2C and 5A to 5C).

(C2) Where the second height position is positioned on the Z-direction side relative to the first height position and the slider 400 is configured to move in manner (A) descried above, the second grooved portion is located on the Z-direction side and on the Y-direction side relative to the first grooved portion.

(C3) Where the second height position is positioned on the Z'-direction side relative to the first height position and the slider 400 is configured to move in manner (B) descried above, the second grooved portion is located on the Z'-direction side and on the Y'-direction side relative to the first grooved portion.

(C4) Where the second height position is positioned on the Z-direction side relative to the first height position and the slider 400 is configured to move in manner (B) descried above, the second grooved portion is located on the Z-direction side and on the Y'-direction side relative to the first grooved portion.

In any of configurations (C1) to (C4), the middle grooved portion extends and slopes from the first grooved portion to the second grooved portion.

Where the at least one runner 430 is a single runner 430, the at least one cam shaft 600 is one or a plurality of cam shafts in accordance with the number of the at least one cam groove 431 of the single runner 430. Where the at least one runner 430 is two runners 430, the at least one cam shaft 600 is one or a plurality of cam shafts in accordance with the number of the at least one cam groove 431 of each of the two runners 430. The or each cam shaft 600 extends in the X-X' direction and includes a first end portion on the X-direction side and/or a second end portion on the X'-direction side.

The at least one holding portion 320 may be one or a plurality of holding portions 320 in accordance with the number of the at least one cam shaft 600. The or each holding portion 320 is provided on the second face 312 of the body 310 and holds the corresponding cam shaft 600. Where the at least one runner 430 is a single runner 430, the first end portion of the corresponding cam shaft 600 protrudes in the X direction from the or each holding portion 320, or the second end portion of the corresponding cam shaft 600 protrudes in the X' direction from the or each holding portion 320. The first or second end portion of the corresponding cam shaft 600 is received in the corresponding cam groove 431 of the single runner 430 such as to be movable between the first grooved portion and the second grooved portion of the cam groove 431. Where the at least one runner 430 is two runners 430, the first end portion of the corresponding cam shaft 600 protrudes in the X direction from the or each holding portion 320 and is received in the corresponding cam groove 431 of the runner 430 on the X-direction side of the two runners 430 such as to be movable between the first grooved portion and the second grooved portion of the cam groove 431. The second end portion of the corresponding cam shaft 600 protrudes in the X' direction from the or each holding portion 320 and is received in the corresponding cam groove 431 of the runner 430 on the X'-direction side of the two runners 430 such as to be movable between the first grooved portion and the second grooved portion of the cam groove 431. It should be noted that the at least one holding portion 320 can be omitted. In this case, the at least one cam shaft 600 may be held not by the at least one holding portion 320, but by the body 310 in any of manners described above.

Where the first or second end portion of the corresponding cam shaft 600 protrudes from the or each holding portion 320, the at least one holding portion 130 is one or a plurality of holding portions in accordance with the number of the at least one cam shaft 600. In this case, the or each holding portion 130 is provided on the corresponding guide 140 or the second face 112 of the edge portion 110 of the housing 100, is located on the X-or X'-direction side relative to one runner 430, and holds the first or second end portion of the corresponding cam shaft 600.

Where the first and second end portions of the corresponding cam shaft 600 protrude from the or each holding portion 320, the at least one holding portion 130 includes at least one first holding portion 130 and at least one second holding portion 130. The at least one first holding portion 130 may be one or a plurality of first holding portions in accordance with the number of the at least one cam shaft 600, and the at least one second holding portion 130 may be one or a plurality of second holding portions in accordance with the number of the at least one cam shaft 600. The or each first holding portion 130 is provided on the corresponding guide 140 or the second face 112 of the edge portion 110 of the housing 100, is located on the X-or X'-direction side relative to the runner 430 on the X-direction side, and holds the first end portion of the corresponding cam shaft 600. The or each second holding portion 130 is provided on the corresponding guide 140 or the second face 112 of the edge portion 110 of the housing 100, is located on the X- or X'-direction side relative to the runner 430 on the X'-direction side, and holds the second end portion of the corresponding cam shaft 600.

Where the slider 400 is configured to move in manner (A) descried above and the first and second grooved portions of the or each cam groove 431 have configuration (C1) descried above, when the slider 400 moves in the Y' direction from the neutral position to the displaced position, and the first end and/or second end portion of the or each cam shaft 600 moves within the corresponding cam groove 431 of the slider 400 from the first grooved portion to the second grooved portion, the body 310 of the movable part 300 moves in the Z' direction from the first height position to the second height position, the second portion 212 of the flexible layer 210 moves in the Z' direction from the third height position to the fourth height position, and the second region 201b of the outer face 201 moves and become recessed in the Z' direction relative to the first region 201a. At this time, where the third portion 213 and the third region 201c are provided, the third portion 213 flexes and stretches, and the third region 201c becomes sloped from the first region 201a to the second region 201b. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201a and the second region 201b of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the slider 400 is configured to move in manner (A) descried above and the first and second grooved portions of the or each cam groove 431 have configuration (C2) descried above, when the slider 400 moves in the Y' direction from the neutral position to the displaced position, and the first and/or second end portion of the or each cam shaft 600 moves within the corresponding cam groove 431 of the slider 400 from the first grooved portion to the second grooved portion, the body 310 of the movable part 300 moves in the Z direction from the first height position to the second height position, the second portion 212 of the flexible layer 210 moves in the Z direction from the third height position to the fourth height position, and the second region 201b of the outer face 201 moves and become protruded in the Z direction relative to the first region 201a. At this time, where the third portion 213 and the third region 201c are provided, the third portion 213 flexes and stretches, and the third region 201c becomes sloped from the first region 201a to the second region 201b. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201a and the second region 201b of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the slider 400 is configured to move in manner (B) descried above and the first and second grooved portions of the or each cam groove 431 have configuration (C3) descried above, when the slider 400 moves in the Y direction from the neutral position to the displaced position, and the first and/or second end portion of the or each cam shaft 600 moves within the corresponding cam groove 431 of the slider 400 from the first grooved portion to the second grooved portion, the body 310 of the movable part 300 moves in the Z' direction from the first height position to the second height position, the second portion 212 of the flexible layer 210 moves in the Z' direction from the third height position to the fourth height position, and the second region 201b of the outer face 201 moves and become recessed in the Z' direction relative to the first region 201a. At this time, where the third portion 213 and the third region 201c are provided, the third portion 213 flexes and stretches, and the third region 201c becomes sloped from the first region 201a to the second region 20 lb. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201a and the second region 201b of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the slider 400 is configured to move in manner (B) descried above and the first and second grooved portions of the or each cam groove 431 have configuration (C4) descried above, when the slider 400 moves in the Y direction from the neutral position to the displaced position, and the first and/or second end portion of the or each cam shaft 600 moves within the corresponding cam groove 431 of the slider 400 from the first grooved portion to the second grooved portion, the body 310 of the movable part 300 moves in the Z direction from the first height position to the second height position, the second portion 212 of the flexible layer 210 moves in the Z direction from the third height position to the fourth height position, and the second region 201b of the outer face 201 moves and become protruded in the Z direction relative to the first region 201a. At this time, where the third portion 213 and the third region 201c are provided, the third portion 213 flexes and stretches, and the third region 201c becomes sloped from the first region 201a to the second region 201b. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201a and the second region 201b of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

The lifting actuator 700 is disposed on the Y'-direction side relative to the slider 400. Where the slider 400 is configured to move in manner (A) descried above, the plunger 710 of the lifting actuator 700 is coupled to the slider 400. The lifting actuator 700 is configured such that when the coil is energized, the plunger 710 is thereby retracted from an origin position into the lifting actuator 700 to pull the slider 400 in the Y' direction and move the slider 400 in the Y' direction from the neutral position to the displaced position (see FIGS. 1A to 5C). Where the slider 400 is configured to move in manner (B) descried above, the lifting actuator 700 is configured such that when the coil is energized, the plunger 710 is thereby advanced from the origin position to press the slider 400 in the Y direction, and move the slider 400 in the Y direction from the neutral position to the displaced position (not illustrated). In this case, the plunger 710 at the origin position may be in contact with the slider 400 from the Y' direction, disposed with a gap between the plunger 710 and the slider 400, or coupled to the slider 400. Where the coupling portion 420 is provided, the coupling portion 420 may be provided with a through hole to receive therethrough the plunger 710. For convenience of illustration, the internal structure of the lifting actuator 700 is omitted from FIGS. 2A, 5A, 6A, and 6B.

Where the plunger 710 of the lifting actuator 700 is coupled to the slider 400 and the third portion 213 and the third region 201c are provided, when the coil becomes deenergized, the plunger 710 is thereby returned to the origin position. By the returning of the plunger 710 to the origin position, the slider 400 moves from the displaced position back to the neutral position, the third portion 213 of the flexible layer 210 restores itself, the body 310 of the movable part 300 moves from the second height position back to the first height position, and the second region 201b, the first region 201a, and the third region 201c of the outer face 201 become substantially flush with each other again. Also, where at least one of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the lifting actuator 700 is coupled to the slider 400 and neither the third portion 213 nor the third region 201c are provided, when the coil becomes deenergized, the plunger 710 returns to the origin position. By the returning of the plunger 710 to the origin position, the slider 400 moves from the displaced position back to the neutral position, the boundary between the second portion 212 and the first portion 211 of the flexible layer 210 restores itself, the body 310 of the movable part 300 moves from the second height position back to the first height position, and the second region 201b and the first region 201a of the outer face 201 become substantially flush with each other again. Where at least one of the outermost layer 220, the at least one first intermediate layer 230, and the at least one second intermediate layer is provided, the boundary between the second portion and the first portion of the at least one layer restores itself according to the restoration of the boundary of the flexible layer 210.

Where the plunger 710 of the lifting actuator 700 is not coupled to the slider 400 and the third portion 213 and the third region 201c are provided, when the coil becomes deenergized, released is the pressing in the Y direction of the plunger 710 against the slider 400, so that the third portion 213 of the flexible layer 210 restores itself. By the restoration of the third portion 213 of the flexible layer 210, the body 310 of the movable part 300 moves from the second height position back to the first height position, the slider 400 moves from the displaced position back to the neutral position, and the second region 201b, the first region 201a, and the third region 201c of the outer face 201 become substantially flush with each other again. Also, where at least one layer of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the lifting actuator 700 is not coupled to the slider 400 and neither the third portion 213 nor the third region 201c are provided, When the coil becomes deenergized, released is the pressing in the Y direction of the plunger 710 against the slider 400, so that the boundary between the second portion 212 and the first portion 211 of the flexible layer 210 restores itself. By the restoration of the boundary of the flexible layer 210, the body 310 of the movable part 300 moves from the second height position back to the first height position, the slider 400 moves from the displaced position back to the neutral position, and the second region 201b of the outer face 201 becomes substantially flush with the first region 201a again. Where at least one layer of the outermost layer 220, the at least one first intermediate layer 230, and the at least one second intermediate layer is provided, the boundary between the second portion and the first portion of the at least one layer restores itself according to the restoration of the boundary of the flexible layer 210.

Where the body 310 and the edge portion 110 have configuration (2) described above, the motion convertor may have any of configurations described above, but is different in the following points from the motion convertor in which the body 310 and the edge portion 110 have configuration (1) described above. The at least one guide 140 is configured to guide the slider 400 movably in the Y-Y' direction relative to the body 310 of the movable part 300. The at least one guide 140 is provided not on the second face 112 of the edge portion 110 of the housing 100, but on the second face 312 of the body 310 of the movable part 300.

The holding portions 121 and 122 are provided not on the second face 112 of the edge portion 110 of the housing 100, but on the second face 312 of the body 310 of the movable part 300 in spaced relation along the Y-Y' direction.

The at least one holding portion 130 is one or a plurality of holding portions in accordance with the number of the at least one cam shaft 600. The or each holding portion 130 is provided on the corresponding guide 140 or on the second face 312 of the body 310 of the movable part 300, and holds the corresponding cam shaft 600. Where the at least one runner 430 is a single runner 430, the first end portion of the corresponding cam shaft 600 protrudes in the X direction from the or each holding portion 130, or the second end portion of the corresponding cam shaft 600 protrudes in the X' direction from the or each holding portion 130. The first or second end portion of the corresponding cam shaft 600 is received in the corresponding cam groove 431 of the single runner 430 such as to be movable between the first grooved portion and the second grooved portion of the cam groove 431. Where the at least one runner 430 is two runners 430, the first end portion of the corresponding cam shaft 600 protrudes in the X direction from the or each holding portion 130 and is received in the corresponding cam groove 431 of the runner 430 on the X-direction side of the two runners 430 such as to be movable between the first grooved portion and the second grooved portion of the cam groove 431. The second end portion of the corresponding cam shaft 600 protrudes in the X' direction from the or each holding portion 130 and is received in the corresponding cam groove 431 of the runner 430 on the X'-direction side of the two runners 430 such as to be movable between the first grooved portion and the second grooved portion of the cam groove 431. It should be noted that the at least one holding portion 130 can be omitted. In this case, the at least one cam shaft 600 may be held by the body 310 in any of manners described above.

The at least one holding portion 320 is a plurality of holding portions 320, two for each of the at least one cam shaft 600, and are provided not on the second face 312 of the body 310, but on the second face 112 of the edge portion 110 of the housing 100. The each two holding portions 320 includes a holding portion 320 on the X-direction side, which is located on the X-direction side relative to the opening 101 and holds the first end portion of the corresponding cam shaft 600, and a holding portion 320 on the X'-direction side, which is located on the X'-direction side relative to the opening 101 and holds the second end portion of the corresponding cam shaft 600.

Where the slider 400 is configured to move in manner (A) descried above and the first and second grooved portions of the or each cam groove 431 have configuration (C1) descried above, when the slider 400 moves in the Y' direction from the neutral position to the displaced position, and the first end and/or second end portion of the or each cam shaft 600 moves from the first grooved portion to the second grooved portion of the corresponding cam groove 431 of the slider 400, the edge portion 110 of the housing 100 moves in the Z' direction from the first height position to the second height position, the first portion 211 of the flexible layer 210 moves in the Z' direction from the third height position to the fourth height position, and the first region 201*a* of the outer face 201 moves and become recessed in the Z' direction relative to the second region 201*b*. At this time, where the third portion 213 and the third region 201*c* are provided, the third portion 213 flexes and stretches, and the third region 201*c* becomes sloped from the first region 201*a* to the second region 201*b*. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201*a* and the second region 201*b* of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the slider 400 is configured to move in manner (A) descried above and the first and second grooved portions of the or each cam groove 431 have configuration (C2) descried above, when the slider 400 moves in the Y' direction from the neutral position to the displaced position, and the first and/or second end portion of the or each cam shaft 600 moves from the first grooved portion to the second grooved portion of the corresponding cam groove 431 of the slider 400, the edge portion 110 of the housing 100 moves in the Z direction from the first height position to the second height position, the first portion 211 of the flexible layer 210 moves in the Z direction from the third height position to the fourth height position, and the first region 201*a* of the outer face 201 moves and become protruded in the Z direction relative to the second region 201*b*. At this time, where the third portion 213 and the third region 201*c* are provided, the third portion 213 flexes and stretches, and the third region 201*c* becomes sloped from the first region 201*a* to the second region 201*b*. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201*a* and the second region 201*b* of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the slider 400 is configured to move in manner (B) descried above and the first and second grooved portions of the or each cam groove 431 have configuration (C3) descried above, when the slider 400 moves in the Y direction from the neutral position to the displaced position, and the first and/or second end portion of the or each cam shaft 600 moves from the first grooved portion to the second grooved portion of the corresponding cam groove 431 of the slider 400, the edge portion 110 of the housing 100 moves in the Z' direction from the first height position to the second height position, the first portion 211 of the flexible layer 210 moves in the Z' direction from the third height position to the fourth height position, and the first region 201*a* of the outer face 201 moves and become recessed in the Z' direction relative to the second region 201*b*. At this time, where the third portion 213 and the third region 201*c* are provided, the third portion 213 flexes and stretches, and the third region 201*c* becomes sloped from the first region 201*a* to the second region 201*b*. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201*a* and the second region 201*b* of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the slider 400 is configured to move in manner (B) descried above and the first and second grooved portions of the or each cam groove 431 have configuration (C4) descried above, when the slider 400 moves in the Y direction from the neutral position to the displaced position, and the first and/or second end portion of the or each cam shaft 600 moves from the first grooved portion to the second grooved portion of the corresponding cam groove 431 of the slider 400, the edge portion 110 of the housing 100 moves in the Z direction from the first height position to the second height position, the first portion 211 of the flexible layer 210 moves in the Z direction from the third height position to the fourth height position, and the first region 201*a* of the outer face 201 moves and become protruded in the Z direction relative to the second region 201*b*. At this time, where the third portion 213 and the third region 201*c* are provided, the third portion 213 flexes and stretches, and the third region 201*c* becomes sloped from the first region 201*a* to the second region 201*b*. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201*a* and the second region 201*b* of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the plunger 710 of the lifting actuator 700 is coupled to the slider 400 and the third portion 213 and the third region 201c are provided, when the coil becomes deenergized, the plunger 710 returns to the origin position. By the returning of the plunger 710 to the origin position, the third portion 213 of the flexible layer 210 restores itself, the slider 400 moves from the displaced position back to the neutral position, the edge portion 110 of the housing 100 moves from the second height position back to the first height position, and the first region 201a, the second region 201b, and the third region 201c of the outer face 201 become substantially flush with each other again. Also, where at least one of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the lifting actuator 700 is coupled to the slider 400 and neither the third portion 213 nor the third region 201c are provided, when the coil becomes deenergized, the plunger 710 returns to the origin position. By the returning of the plunger 710 to the origin position, the slider 400 moves from the displaced position back to the neutral position, the boundary between the second portion 212 and the first portion 211 of the flexible layer 210 restores itself, the edge portion 110 of the housing 100 moves from the second height position back to the first height position, and the first region 201a of the outer face 201 become substantially flush with the second region 201b again. Where at least one of the outermost layer 220, the at least one first intermediate layer 230, and the at least one second intermediate layer is provided, the boundary between the second portion and the first portion of the at least one layer restores itself according to the restoration of the boundary of the flexible layer 210.

Where the plunger 710 of the lifting actuator 700 is not coupled to the slider 400 and the third portion 213 and the third region 201c are provided, when the coil becomes deenergized, released is the pressing in the Y direction of the plunger 710 against the slider 400, so that the third portion 213 of the flexible layer 210 restores itself. By the restoration of the third portion 213 of the flexible layer 210, the edge portion 110 of the housing 100 moves from the second height position back to the first height position, the slider 400 moves from the displaced position back to the neutral position, and the first region 201a, the second region 201b, and the third region 201c of the outer face 201 become substantially flush with each other again. Also, where at least one layer of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the lifting actuator 700 is not coupled to the slider 400 and neither the third portion 213 nor the third region 201c are provided, When the coil becomes deenergized, released is the pressing in the Y direction of the plunger 710 against the slider 400, so that the boundary between the second portion 212 and the first portion 211 of the flexible layer 210 restores itself. By the restoration of the boundary of the flexible layer 210, the edge portion 110 of the housing 100 moves from the second height position back to the first height position, the slider 400 moves from the displaced position back to the neutral position, and the first region 201a of the outer face 201 becomes substantially flush with the second region 201b again. Where at least one layer of the outermost layer 220, the at least one first intermediate layer 230, and the at least one second intermediate layer is provided, the boundary between the second portion and the first portion of the at least one layer restores itself according to the restoration of the boundary of the flexible layer 210.

The sensing device D1 may further include a capacitive touch sensor S and a controller 800. The touch sensor S may be provided at the body 310 of the movable part 300. For example, the touch sensor S may be provided on the second face 312, on the first face 311, or inside of the body 310 of the movable part 300. Where the touch sensor S is provided on the second face 312 of the body 310 of the movable part 300, the touch sensor S is adhered to the second face 312 of the body 310 of the movable part 300 with an adhesive, a double-sided tape, or the like, or fixed to the second face 312 by outsert molding or other means. Where the touch sensor S is provided on the first face 311 of the body 310 of the movable part 300, the touch sensor S is adhered to the first face 311 of the body 310 of the movable part 300 with an adhesive, a double-sided tape, or the like, or fixed to the first face 311 by outsert molding or other means, and the touch sensor S is adhered to the second portion 212 of the flexible layer 210 of the covering 200 or the one or plurality of first intermediate layers 230 of the covering 200 with an adhesive, a double-sided tape, or the like. In this case, the second portion 212 of the flexible layer 210 of the covering 200 is indirectly fixed to the body 310 of the movable part 300 via the touch sensor S, or alternatively via the one or plurality of first intermediate layers 230 and the touch sensor S. Where the touch sensor S is provided inside the body 310 of the movable part 300, the touch sensor S is embedded inside the body 310 of the movable part 300 by insert molding, outsert molding, or other means. Alternatively, the touch sensor S may be disposed in spaced relation in the Z' direction to the body 310 of the movable part 300. In this case, the touch sensor S may be supported by a support or other member in the housing 100.

The touch sensor S is a touch switch or touch panel configured to detect a detection target contacting the touch region 201b1 of the outer face 201 of the covering 200. The touch sensor S includes at least one first electrode Sa (see FIGS. 2A and 2B). The at least one first electrode Sa may be a plurality of first electrodes Sa. The or each first electrodes Sa is located on the Z'-direction side relative to the touch region 201b1. The or each first electrodes Sa is configured such that an approach of a detection target to the first electrodes Sa from the Z-direction side changes electrostatic capacitance and accordingly changes an electric signal (e.g., voltage or current) of the first electrode Sa. The or each first electrode Sa is electrically connected to the controller 800, and an electric signal of the or each first electrode Sa is inputted into the controller 800.

Where the touch sensor S is a self-capacitive touch sensor, the controller 800 is configured to charge and discharge the one or plurality of first electrodes Sa. During the charge and discharge, when a detection target comes into contact with the touch region 201b1 of the covering 200 from the Z-direction side (i.e., approaches the single first electrode Sa or at least one of the first electrodes Sa from the Z-direction side), the contact causes a change in the electrostatic capacitance between a detection target and the single first electrode Sa or the at least one of the first electrodes Sa. According to the change in electrostatic capacitance, there is a change in an electric signal of the single first electrode Sa or the at least one of the first electrodes Sa. The controller 800 is a logic circuit, software to be processed by a logic circuit, or the like configured to monitor electric signal(s) of the one or plurality of first electrodes Sa and compare the electric signal(s) with a first threshold value on a memory of the controller 800 or on an external memory. When the controller 800 determines as a result of the comparison that an electric signal of the single first electrodes Sa or at least one of the first electrodes Sa has exceeded the first threshold value, then the controller 800 determines that a detection target has come into contact with a portion of the touch region 201b1 that is on the Z-direction side relative to the first electrode(s) Sa the electric signal(s) of which has exceeded the first threshold value. The controller 800 thus detects the position information on the contact with the touch region 201b1 by the detection target.

The touch sensor S may be a mutual-capacitive touch sensor. Where the touch sensor S is a mutual-capacitive touch sensor including at least one first electrode Sa and at least one second electrode Sb, the or each second electrodes Sb may be a drive electrode, and the or each first electrodes Sa may be a detection electrode. The first and second electrodes Sa and Sb are electrically connected to the controller 800. The controller 800 is configured to supply drive pulse to the one or plurality of second electrodes Sb and monitor electric signal(s) (voltage or current) of the one or plurality of first electrodes Sa, and compare the electric signal(s) with a second threshold value on a memory of the controller 800 or on an external memory. During the time in which the controller 800 supplies drive pulses to the one or plurality of second electrodes Sb, when a detection target approaches the single first electrode Sa or at least one of the first electrodes Sa, and the single second electrode Sb or at least one of the second electrodes Sb from the Z-direction side, there is a change in electrostatic capacitance between the single first electrode Sa or the at least one of the first electrodes Sa, and the single second electrode Sb or the at least one of the second electrodes Sb and thereby there is a change in an electric signal(s) of the single first electrode Sa or the at least one of the first electrodes Sa. When the controller 800 determines as a result of the comparison that an electric signal of the single first electrodes Sa or at least one of the first electrodes Sa has exceeded the second threshold value, then the controller 800 determines that a detection target has come into contact with a portion of the touch region 201b1 that is on the Z-direction side relative to the first electrode(s) Sa the electric signal(s) of which has exceeded the second threshold value. The controller 800 thus detects the position information on the contact with the touch region 201b1 by the detection target.

The touch sensor S may be a combined self-capacitive and mutual-capacitive sensor. In this case, when the controller 800 charges and discharges the one or plurality of first electrodes Sa, there is a change in electrostatic capacitance between a detection target approaching from the Z-direction side and the single first electrode Sa or at least one of the first electrodes Sa, and thereby there is a change in an electric signal(s) of the single first electrode Sa or the at least one of the first electrodes Sa. Also, during the time in which the controller 800 supplies drive pulses to the one or plurality of second electrodes Sb, when a detection target approaches the single first electrode Sa or at least one of the first electrodes Sa, and the single second electrode Sb or at least one of the second electrodes Sb from the Z-direction side, there is a change in electrostatic capacitance between the single first electrode Sa or the at least one of the first electrodes Sa, and the single second electrode Sb or the at least one of the second electrodes Sb and thereby there is a change in an electric signal(s) of the single first electrode Sa or the at least one of the first electrodes Sa. The controller 800 is configured to monitor electric signal(s) (voltage or current) of the one or plurality of first electrodes Sa and compare the electric signal(s) with a third threshold value on a memory of the controller 800 or on an external memory. When the controller 800 determines as a result of the comparison that an electric signal(s) of the single first electrodes Sa or at least one of the first electrodes Sa has exceeded the third threshold value, then the controller 800 determines that a detection target has come into contact with a portion of the touch region 201b1 that is on the Z-direction side relative to the first electrode(s) Sa the electric signal(s) of which has exceeded the third threshold value. The controller 800 thus detects the position information on the contact with the touch region 201b1 by the detection target.

Where the touch sensor S is a touch switch, the touch sensor S may have any of the above configurations. Where the touch sensor S is a self-capacitive touch panel, the touch sensor S may include a plurality of first electrodes Sa. Where the touch sensor S is a mutual-capacitive touch panel or a combined self-capacitive and mutual-capacitive touch panel, the touch sensor S may include a plurality of first electrodes Sa and a plurality of second electrodes Sb. In this case, the controller 800 is configured to detect a plurality of pieces of position information on contact by a detection target detected as information on an operational input to the touch region 201b1. In other words, the controller 800 is configured to detect information on an operational input to the touch region 201b1 according to a change in electric signals of the touch sensor S.

The controller 800 is configured (step) to repeat a process of determining whether the controller 800 has received a deformation instruction until receiving a deformation instruction, and configured (step) to drive the lifting actuator 700 (energize the coil of the lifting actuator 700) according to the receipt of a deformation instruction. Specifically, the controller includes at least one of the following configurations (I) to (IV).

(I) The controller 800 is configured (step) to repeat to repeat a process of determining whether there is a change exceeding the first, second, or third threshold value in electric signal(s) of the one or plurality of first electrodes Sa of the touch sensor S, and configured (step) to such that when there is a change exceeding the first, second, or third threshold value in electric signal(s) of the one or plurality of first electrodes Sa of the touch sensor S, then the controller 800 determines that the change indicates the receipt of the deformation instruction and drives the lifting actuator 700.

(II) The sensing device D1 further includes a proximity detector (not illustrated) electrically connected to the controller 800. In this case, the proximity detector is a proximity sensor of capacitive type, photoelectric sensor, or ultrasonic sensor. The proximity sensor of capacitive type has a similar configuration to the touch sensor S and is configured such that an electric signal(s) of at least one electrode change according to an approach of a detection target to the touch region 201b1. In this case, the controller 800 is configured (step) to monitor electric signal(s) of the at least one electrode and compare the electric signal(s) of the at least one electrode with a fourth threshold value on a memory of the controller 800 or on an external memory (configured to repeat a process of determining whether there is a change exceeding the fourth threshold value in electric signal(s) of the at least one electrode). The controller 800 is further configured (step) such that if the controller 800 determines as a result of the comparison that the at least one electric signal has exceeded the fourth threshold value, then the controller 800 determines that the change in the at least one electric signal indicates the receipt of the deformation instruction and drives the lifting actuator 700. The photoelectric sensor includes a light emitting device to emit light toward the touch region 201b1 or the vicinity thereof and a light receiving device to receive light that has been emitted from the light emitting device and reflected by a detection target approaching the touch region 201b1 and to output an electric signal to the controller 800. In this case, the controller 800 is configured (step) to repeat a process of determining whether the controller 800 has received an electric signal from the photoelectric sensor, and also configured (step) to determine that the electric signal received from the photoelectric sensor indicates the deformation instruction and drive the lifting actuator 700. The ultrasonic sensor is configured to emit ultrasonic waves toward the touch region 201b1 or the vicinity thereof, receive an ultrasonic wave that has been reflected by a detection target approaching the touch region 201b1, and output an electric signal to the controller 800. In this case, the controller 800 is configured (step) to repeat a process of determining whether the controller 800 has received an electric signal from the ultrasonic sensor, and also configured (step). to determine that the electric signal received from the ultrasonic sensor indicates the deformation instruction and drive the lifting actuator 700

(C) The deformation instruction is outputted from an external device of the sensing device D1, such as a controller or the like built in the automobile, furniture, portable information terminal, stationary information terminal, or the like described above. The controller 800 is configured (step) to repeat a process of determining whether the controller 800 has received the deformation instruction from the external device, and configured to drive the lifting actuator 700 according to the receipt of the deformation instruction.

(D) Where the touch sensor S is the touch panel, the controller 800 is configured (step) to detect a plurality of pieces of position information on a contact by a detection target detected in a manner as described above as information on an operational input to the touch region 201b1, configured (step) to determine whether the detected information on the operational input matches the predetermined information on an operational input recorded on a memory of the controller 800 or on an external memory. The controller 800 is further configured (step) such that if the controller 800 determines that the detected information on the operational input matches the information on the operational input on the memory, then the controller 800 determines that the detected information on the operational input indicates the receipt of the deformation instruction and drive the lifting actuator 700. It should be appreciated that the information on the predetermined operational input may be, but is not limited to information on a swiping operational input, and may be any other information. Each memory mentioned above may store information on a single kind of operational input, or may store information on a plurality of kinds of operational inputs.

The controller 800 may be configured (step) to detect, after the receipt of any of deformation instructions described above, position information on a contact with the touch region 201b1 by the detection target in a manner described above and/or configured (step) to detect a plurality of pieces of position information on a contact by a detection target detected as information on operational inputs to the touch region 201b1. In this case, the controller 800 is configured to drive the lifting actuator 700 according to the deformation instruction, and form a recessed or protruded part in the outer face 201 of the covering 200 as described above, and then be able to detect a contact and/or an operational input on the touch region 201b1 by a detection target via the touch sensor S.

Alternatively, where the touch sensor S is a touch panel, the controller 800 may be configured (step) to detect, after the receipt of any of deformation instructions described above, a plurality of pieces of position information on a contact by a detection target detected in a manner described above as information on operational inputs to the touch region 201b1, configured (step) to determine whether the detected information on the operational inputs matches information on a predetermined operational input recorded on a memory of the controller 800 or on an external memory. The controller 800 may be further configured (step) such that if the controller 800 determines that the detected information on the operational inputs matches the information on the operational input on the memory, then the controller 800 detects position information on the contact on the touch region 201b1 by a detection target in a manner described above, and/or configured (step) to detect a plurality of pieces of position information on a contact by a detection target detected in a manner described above as the information on the operational inputs to the touch region 201b1. In this case, the controller 800 is configured to drive the lifting actuator 700 according to any of deformation instructions described above, form a recessed or protruded part in the outer face 201 of the covering 200 as described above, then determines whether a predetermined operational input (e.g., an operational input for unlocking) is made to the touch region 201b1 via the touch sensor S, and, if predetermined operational input is made, be able to detect a contact and/or an operational input on the touch region 201b1 by a detection target via the touch sensor S.

Figure 2A:
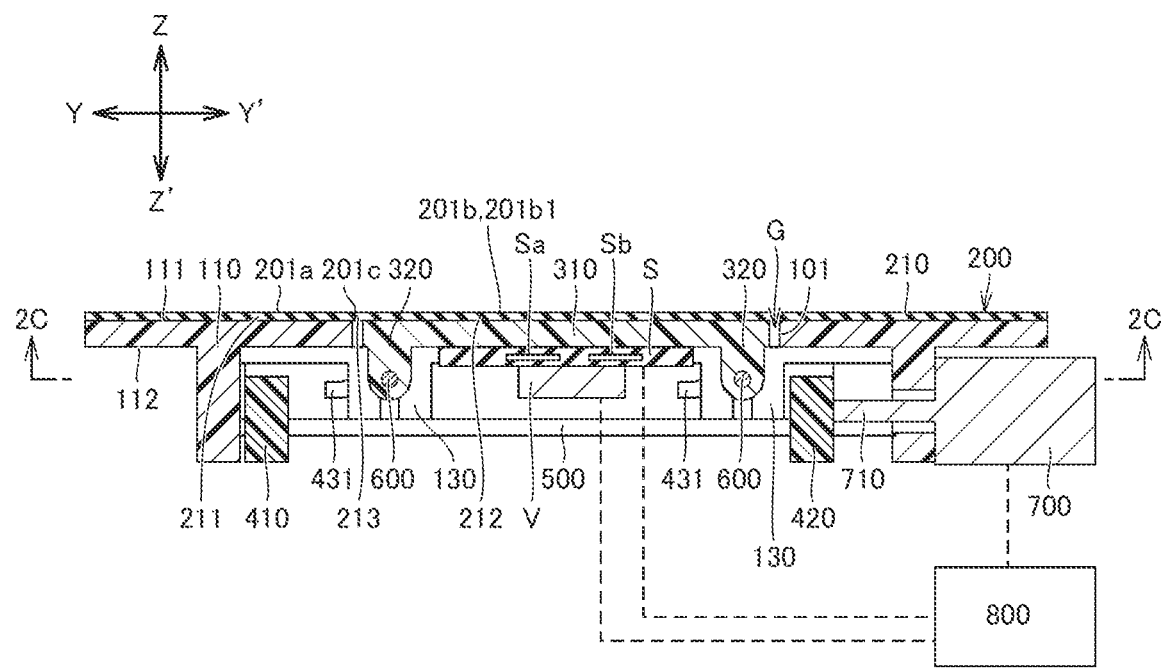
FIG. 2A is a cross-sectional view of the touch sensing device according to the first embodiment, taken along line 2A-2A in FIG. 1A.
Figure 2B:
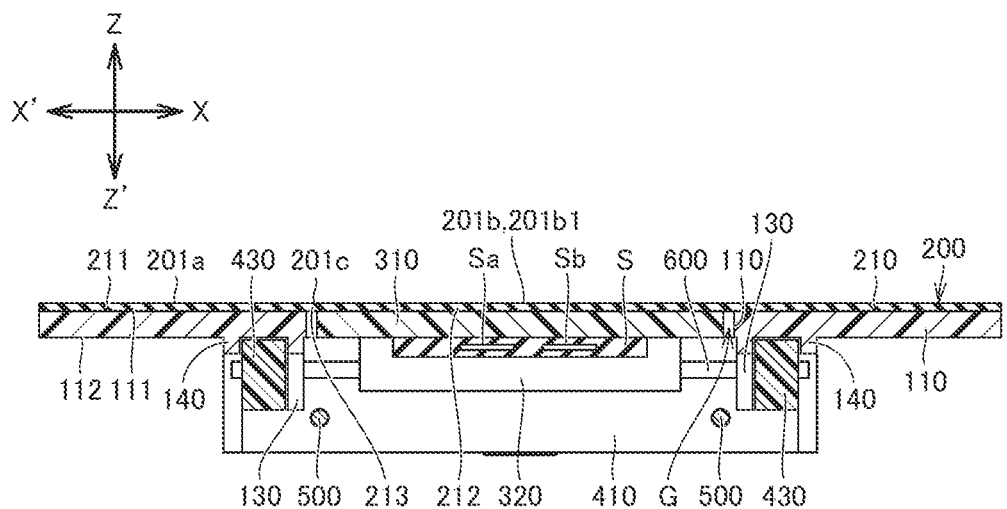
FIG. 2B is a cross-sectional view of the touch sensing device according to the first embodiment, taken along line 2B-2B in FIG. 1A.
Figure 2C:
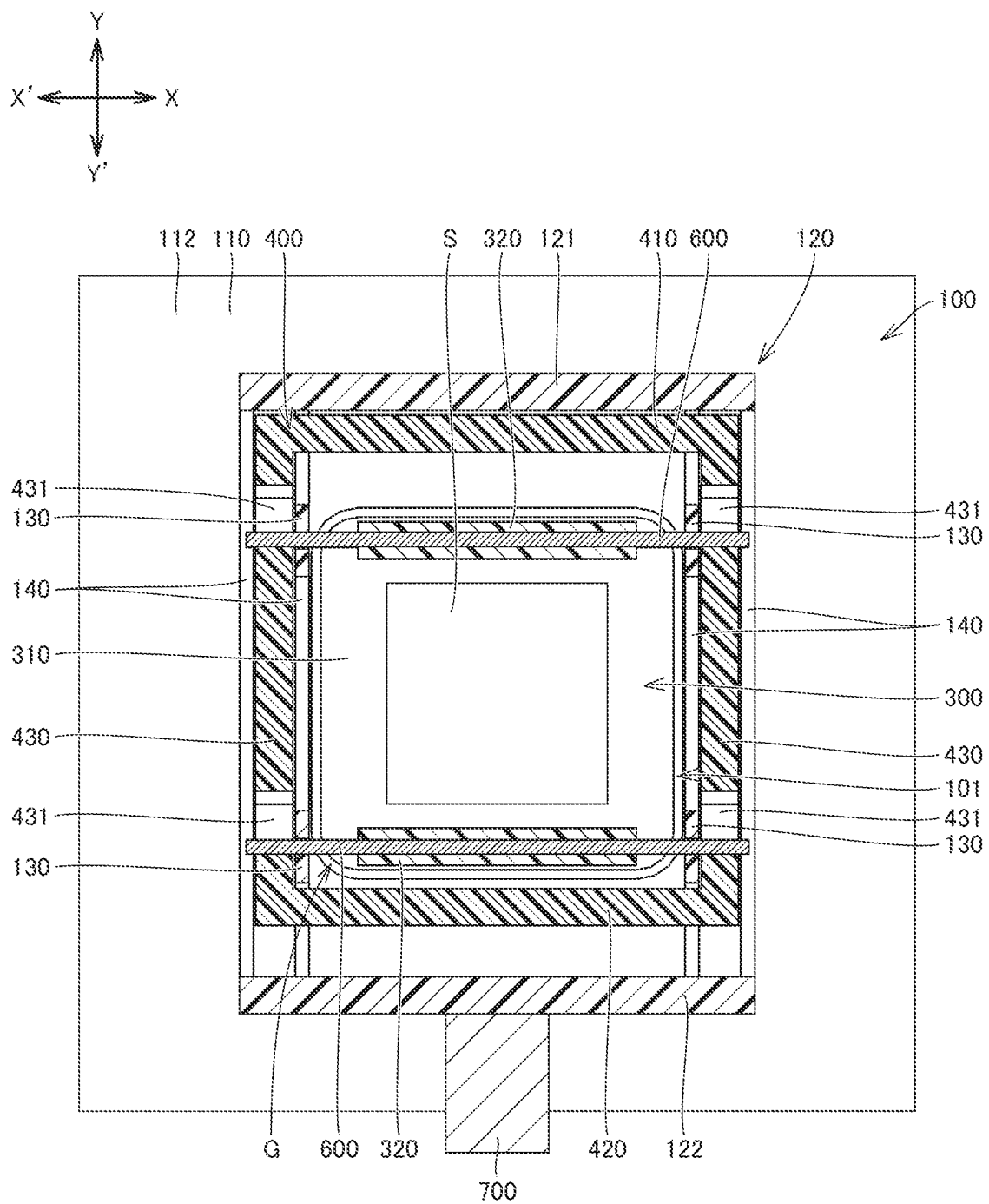
FIG. 2C is a cross-sectional view of the touch sensing device according to the first embodiment, taken along line 2C-2C in FIG. 2A.
Figure 3A:
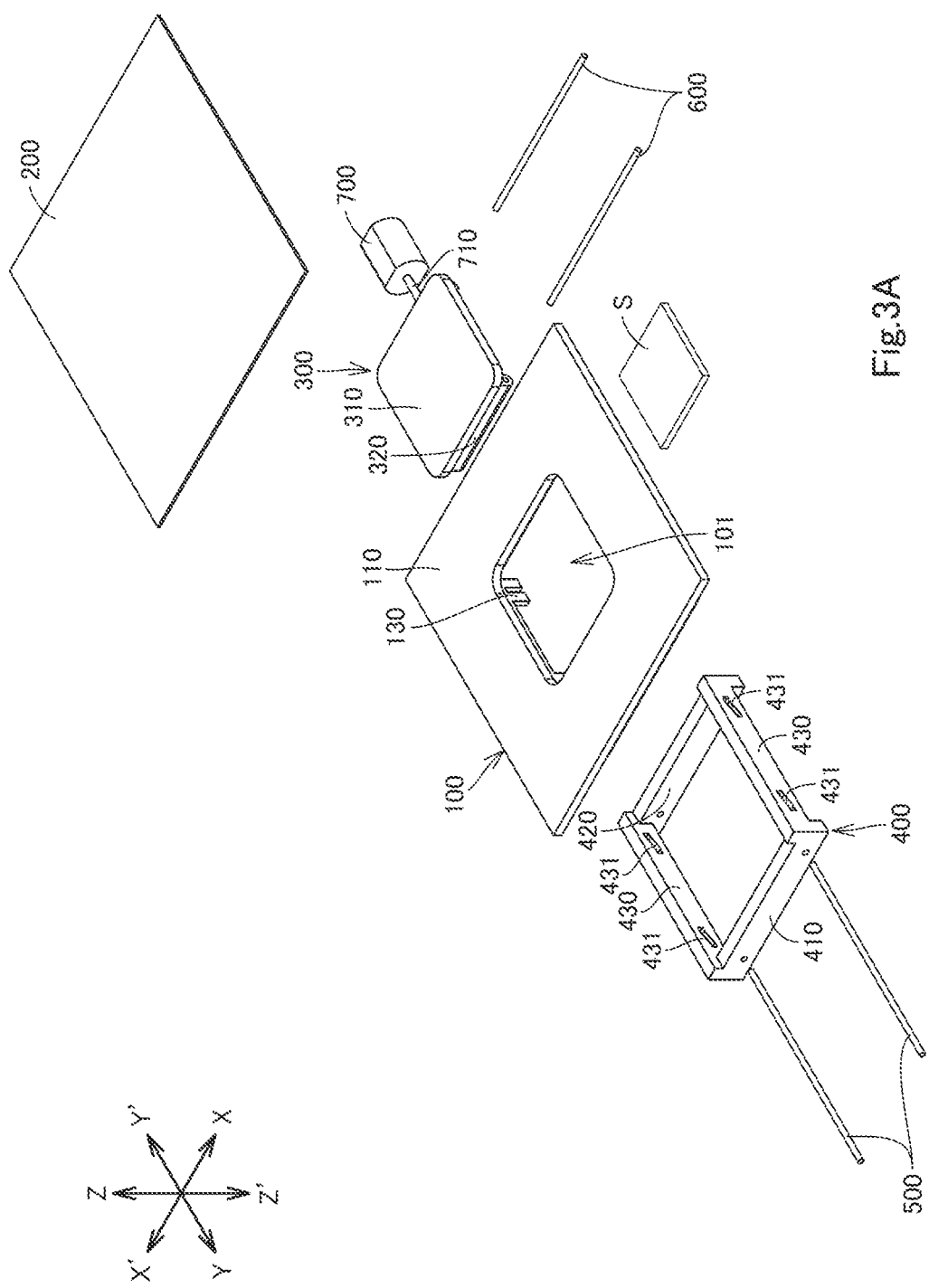
FIG. 3A is an exploded front, top, right side perspective view of the touch sensing device according to the first embodiment.
Figure 3B:
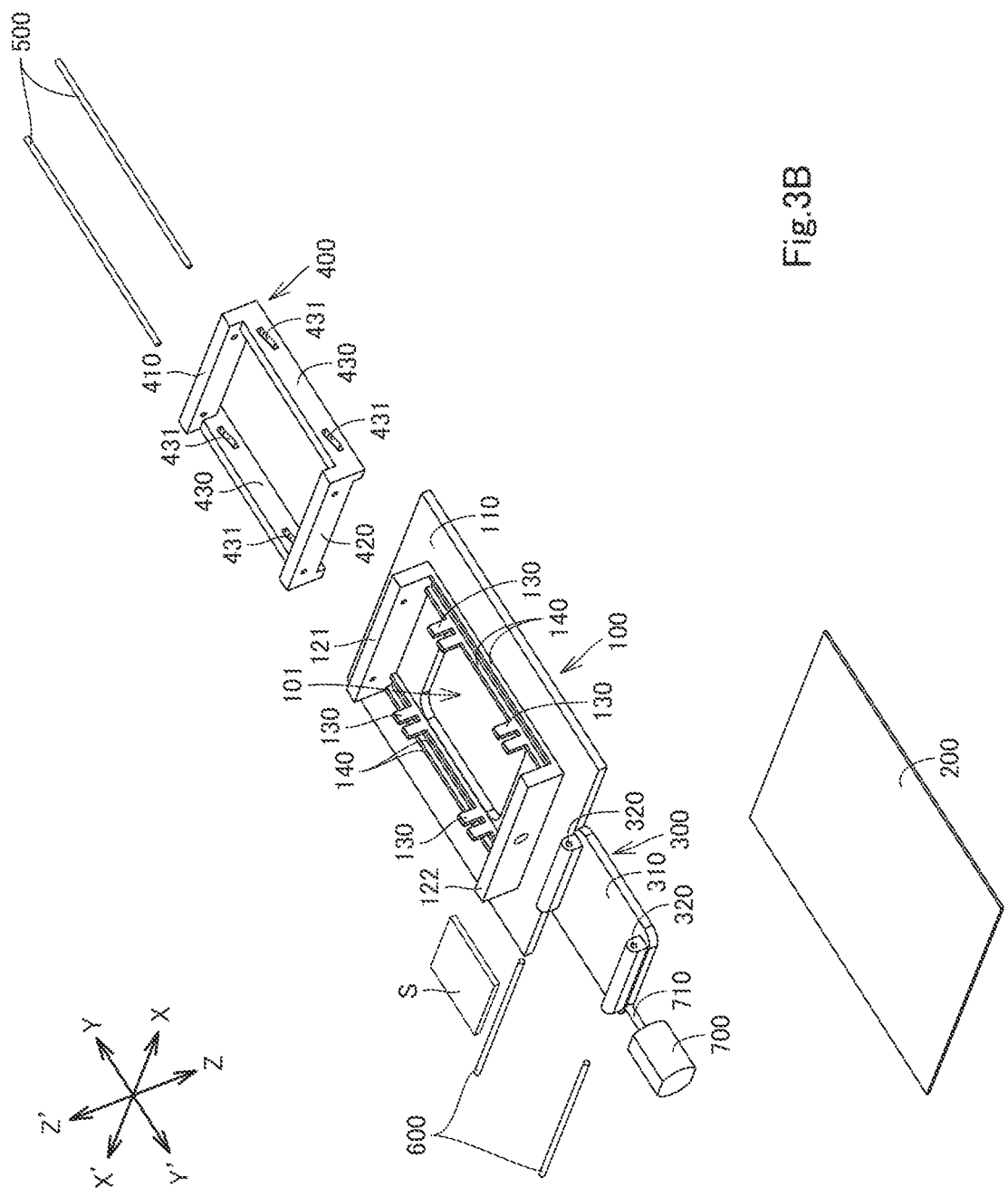
FIG. 3B is an exploded rear, bottom, right side perspective view of the touch sensing device according to the first embodiment.
Figure 4A:
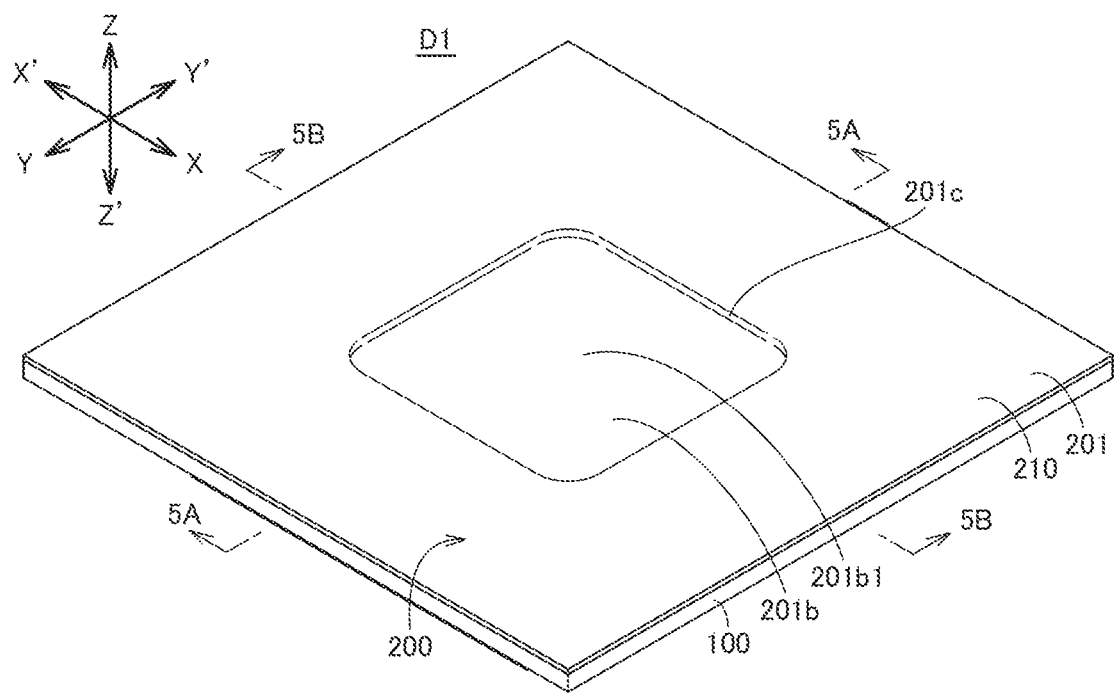
FIG. 4A is a front, top, right side perspective view of the touch sensing device according to the first embodiment, with a recessed part formed in an outer face of the touch sensing device.
Figure 4B:
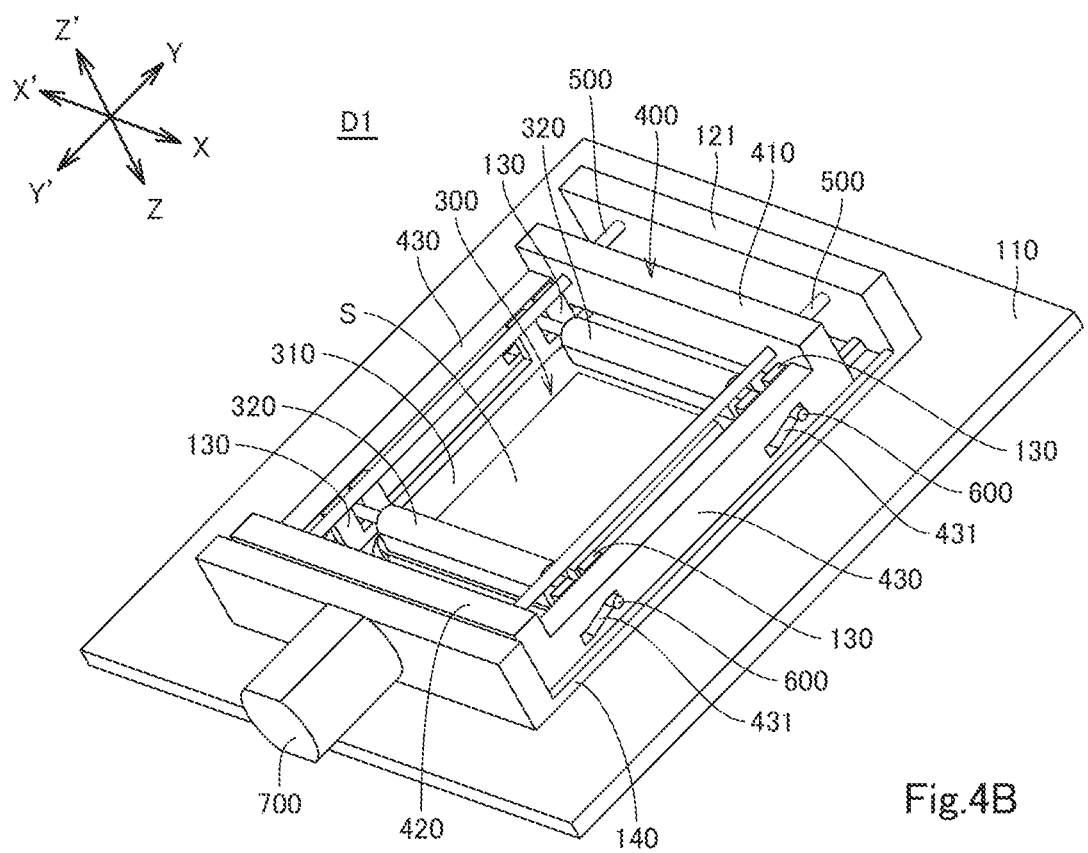
FIG. 4B is a rear, bottom, right side perspective view of the touch sensing device according to the first embodiment, with a recessed part formed in an outer face of the touch sensing device.
Figure 5A:
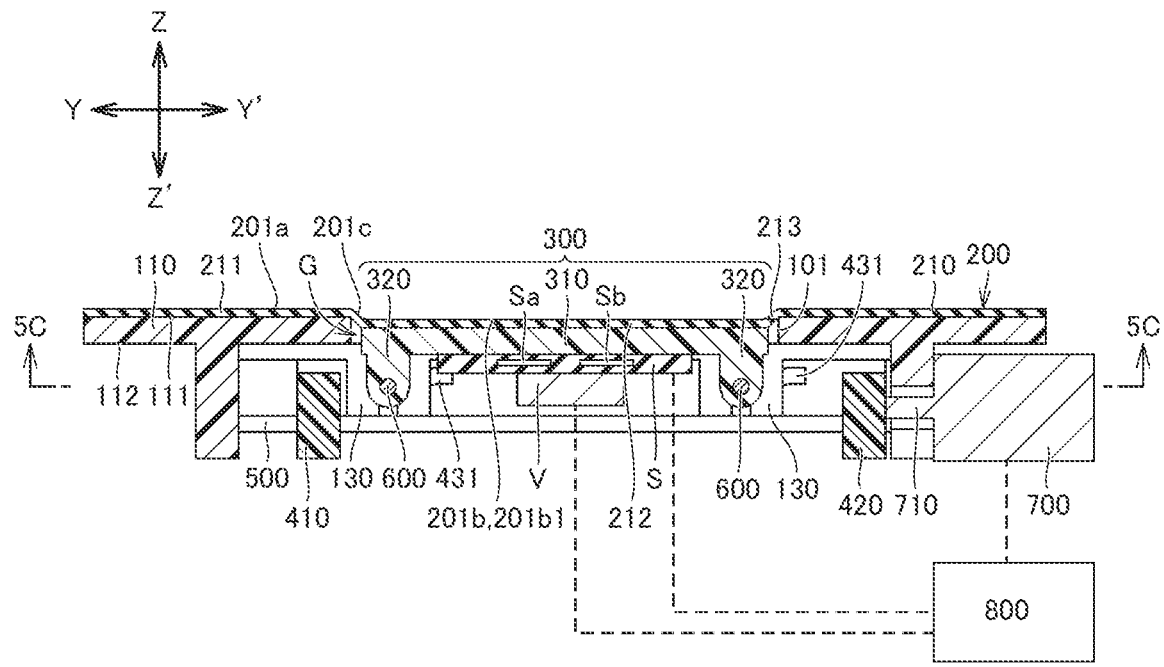
FIG. 5A is a cross-sectional view of the touch sensing device according to the first embodiment, taken along line 5A-5A in FIG. 4A.
Figure 5B:
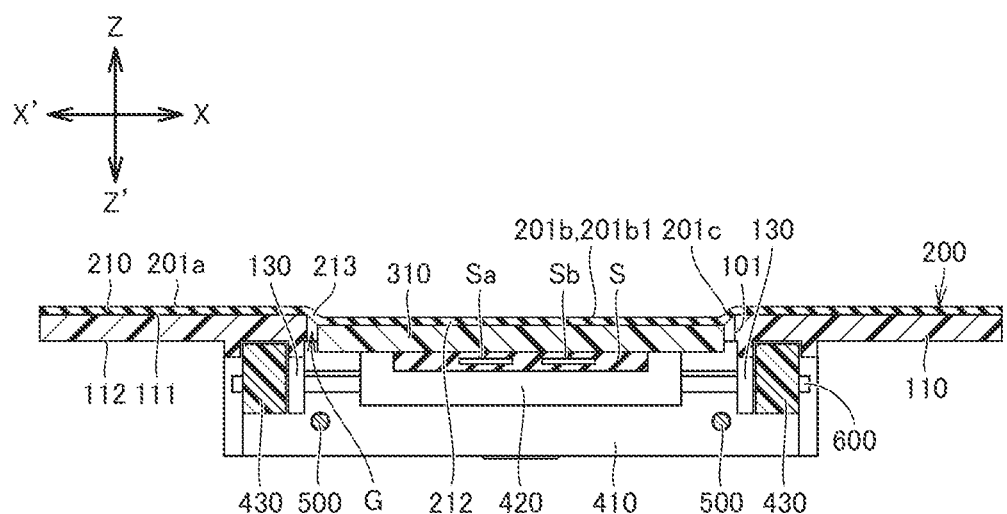
FIG. 5B is a cross-sectional view of the touch sensing device according to the first embodiment, taken along line 5B-5B in FIG. 4A.
Figure 5C:
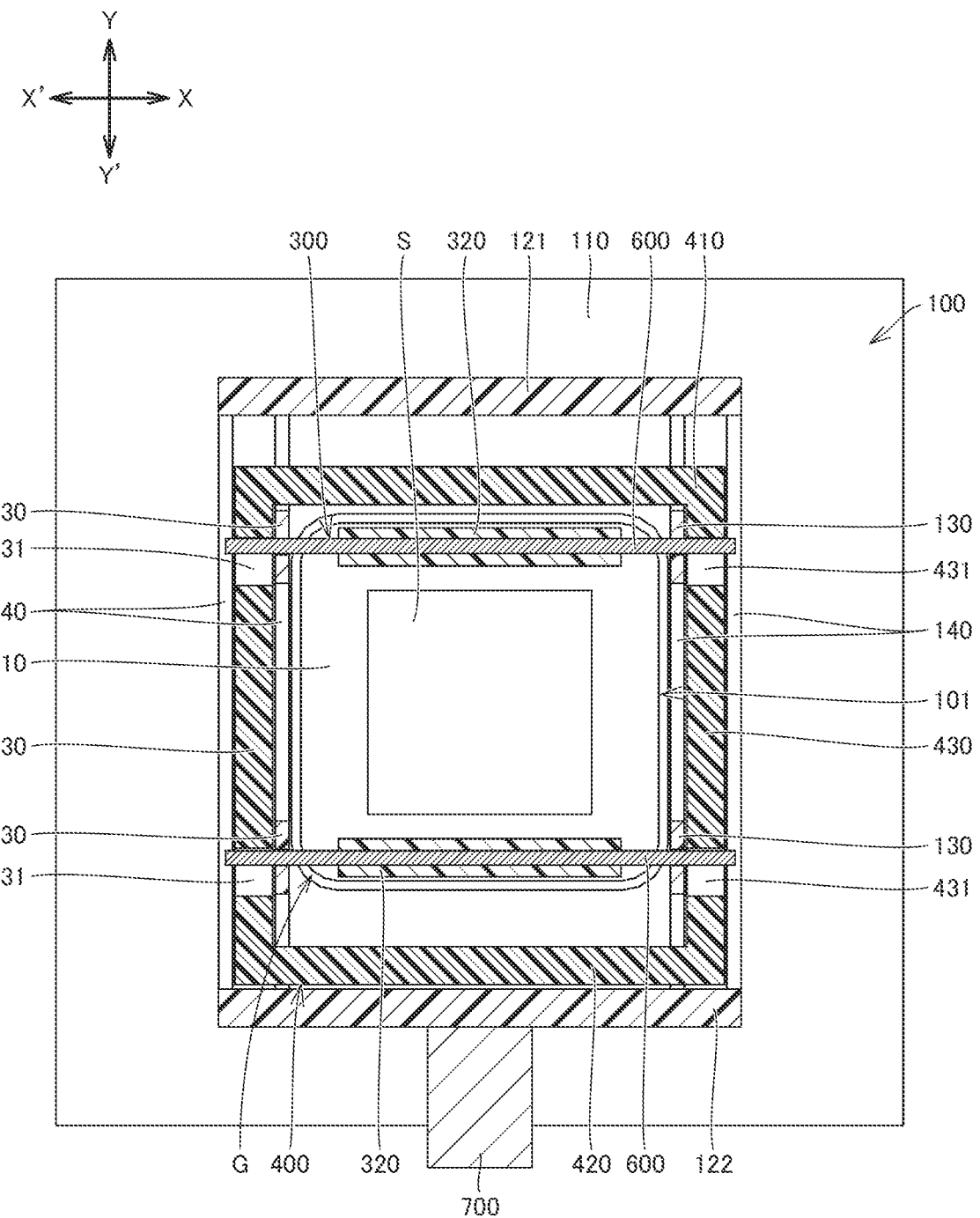
FIG. 5C is a cross-sectional view of the touch sensing device according to the first embodiment, taken along line 5C-5C in FIG. 5A.
Figure 6A:
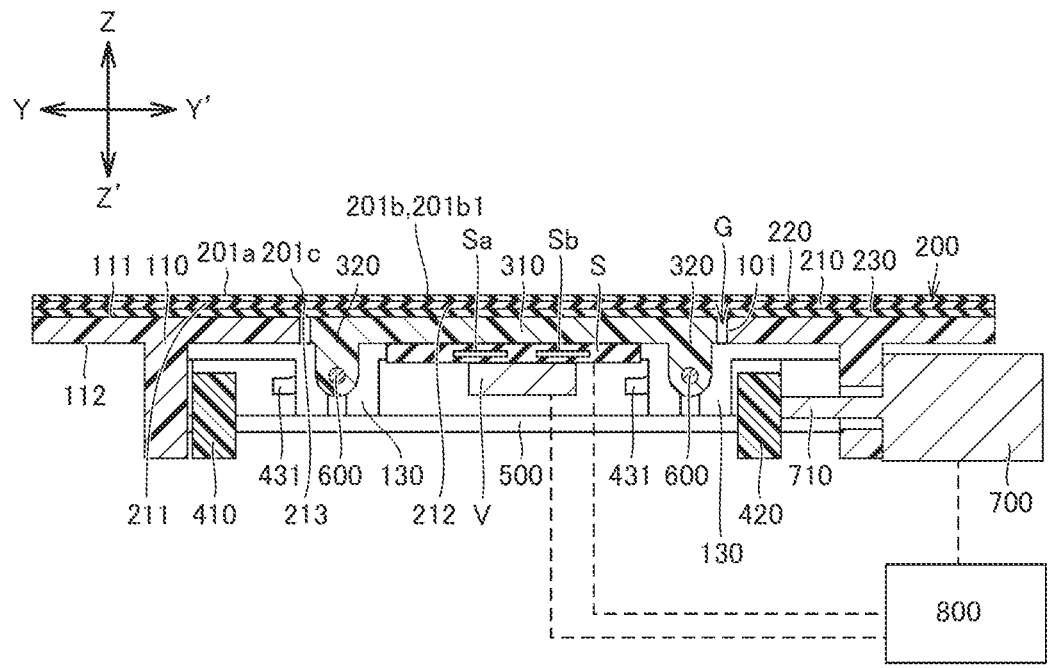
FIG. 6A is a cross-sectional view, corresponding to FIG. 2A, of a variant of the touch sensing device according to the first embodiment.
Figure 6B:
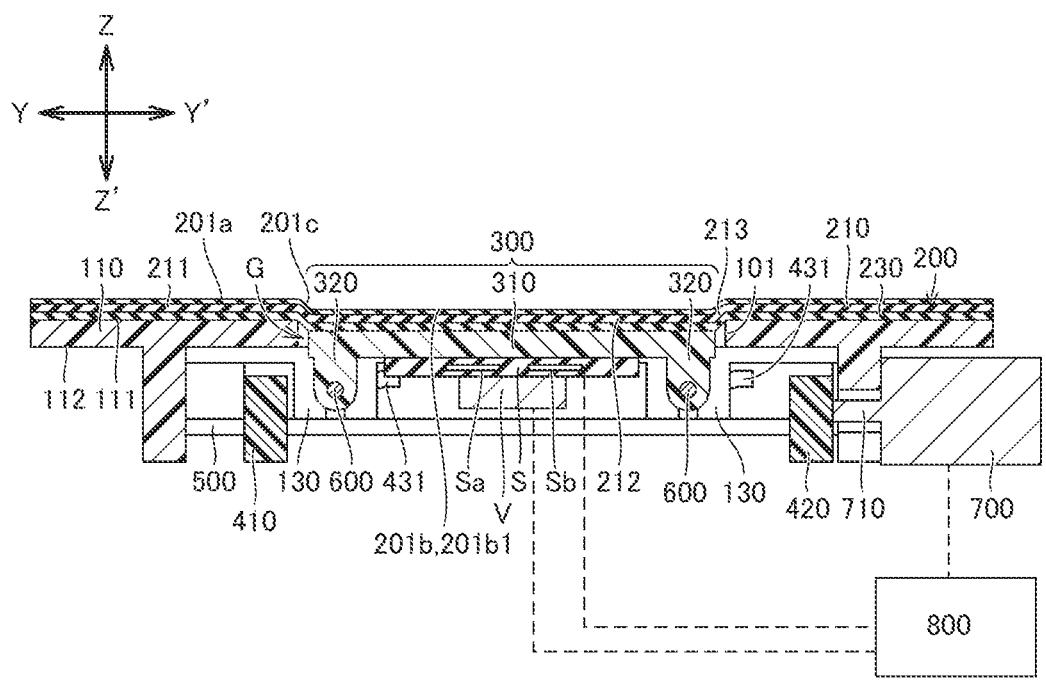
FIG. 6B is a cross-sectional view, corresponding to FIG. 5A, of the variant of the touch sensing device of the first embodiment.

The sensing device D1 may further include a vibration generator V to vibrate the movable part 300 (see FIGS. 2A and 5A). The vibration generator V may be an electromagnetic solenoid including a plunger and a coil (not illustrated). In this case, the vibration generator V is disposed on the Z'-direction side relative to the second face 312 of the body 310 of the movable part 300. The vibration generator V is configured to apply vibration to the movable part 300 in the Z-Z' direction by reciprocating the plunger in the Z-Z' direction upon the energization of the coil so as to repeatedly press the body 310. Alternatively, the vibration generator V may be a vibration motor including a motor and a plunger (not illustrated). This vibration generator V is also disposed on the Z'-direction side relative to the second face 312 of the body 310 of the movable part 300. The vibration generator V is configured to apply vibration to the movable part 300 in the Z-Z' direction by reciprocating the plunger in the Z-Z' direction upon the driving of the motor unit so as to repeatedly press the body 310. Still alternatively, the vibration generator V may be a vibration element using a shape-memory alloy wire. This vibration generator V is also disposed on the Z'-direction side relative to the second face 312 of the body 310 of the movable part 300. The vibration generator V is configured to apply vibration to the movable part 300 in the Z-Z' direction by vibrating (i.e. reciprocating) the wire in the Z-Z' direction so as to repeatedly press the body 310. For convenience of illustration, the vibration generator V is omitted from FIGS. 1B, 2B, 3A to 4B, and 5B.

The controller 800 may be further configured (step) such that when, after the receipt of any of deformation instructions described above, there is a change exceeding the first, second, or third threshold value in electric signal(s) of the one or plurality of first electrodes Sa of the touch sensor S, the controller 800 drives the vibration generator V. The controller 800 may be configured (step) to drive the vibration generator V before and after (the step of) detecting the position information on a contact with the touch region 201b1 by a detection target and/or (the step of) detecting a plurality of pieces of position information on contact by detection target detected as information on an operational input to the touch region 201b1. The controller 800 is thus configured to drive the vibration generator V according to a change in electric signal(s) of the one or plurality of first electrodes Sa of the touch sensor S. By driving the vibration generator V, vibration is applied to the body 310 of the movable part 300 in any of manners described above so as to vibrate the movable part 300 and the second portion 212 of the covering 200 fixed thereto and vibrate the second region 201b including the touch region 201b1 of the covering 200. The vibration is transmitted through the touch region 201b1 to a detection target that comes into contact with the touch region 201b1, imparting a tactile feel to the detection target (i.e., a detection target at the time of touch inputting operation).

The controller 800 may be further configured (step) to drive the vibration generator V before driving the lifting actuator 700 according to the receipt of any deformation instruction described above, count a predetermined period starting from the drive of the vibration generator V using a timer circuit of the controller 800 or a software timer on a memory, and drive the lifting actuator 700 upon the elapse of the predetermined period.

In this configuration, before the lifting actuator 700 is driven, i.e., before a recessed or protruded part is formed in the outer face 201 of the covering 200, the vibration applied by the vibration generator V is transmitted through the touch region 201b1 to a detection target that comes into contact with the touch region 201b1, imparting a tactile feel to the detection target It should be appreciated that the above configurations (steps) of the controller 800 can be combined in any possible manner. The vibration generator V can be omitted. Where the vibration generator V is omitted, it is also possible to omit the configurations related to the control of the vibration generator V of the controller 800.

The sensing device D1 described above provides the following technical features and effects.

Technical features and effects (1): The edge portion 110 of the housing 100 and the movable part 300 are covered by the covering 200 from the Z-direction side. This arrangement does not allow exposure in the Z direction of the gap G or a very small gap that may exist between the edge portion 110 of the housing 100 and the movable part 300. It is therefore possible to make the outer face 201 of the covering 200 of the sensing device D1 seamless.

Technical features and effects (2): Where the outer face 201 of the covering 200 includes the third region 201c, the first region 201a, the second region 201b, and the third region 201c of the outer face 201 are substantially flush with each other in a state where the movable part 300 is relatively located at the first height position relative to the edge portion 110 of the housing 100. Where the outer face 201 of the covering 200 does not include the third region 201c, the first region 201a and the second region 201b of the outer face 201 are substantially flush with each other in a state where the movable part 300 is relatively located at the first height position relative to the edge portion 110 of the housing 100. In either case, in a state where the body 310 is relatively located at the first height position relative to the edge portion 110 of the housing 100, the outer face 201 of the covering 200 has no substantial height differences at the boundaries of the above regions, i.e., the outer face 201 is seamless. On the other hand, when a deformation instruction is inputted to the controller 800 in a manner described above, the lifting actuator 700 is driven, the movable part 300 relatively moves from the first height position to the second height position relative to the edge portion 110 of the housing 100, and the second portion 212 of the flexible layer 210 moves in the Z' or Z direction, from the third height position to the fourth height position, relative to the first portion 211. As a result, the second region 201b of the outer face 201 of the covering 200 relatively moves in the Z' or Z direction relative to the first region 201a, and a recessed or protruded part is formed in the outer face 201 of the covering 200. The recessed or protruded part allows a user to visually recognize where the touch region 201b1 exists in the outer face 201 of the covering 200. Also, where the body 310 of the movable part 300 at the second height position is relatively located on the Z'-direction side relative to the edge portion 110 of the housing 100, or where the edge portion 110 of the housing 100 is located on the Z-direction side relative to the body 310 of the movable part 300, the second region 201b of the outer face 201 of the covering 200 is recessed to form a recessed part. This recessed part may serve as a guide to the touch region 201b1 of the second region 201b.

Technical features and effects (3): The edge portion 110 of the housing 100 and the movable part 300 are covered by the covering 200. In this arrangement, the outer face 201 of the covering 200 is seamless as described above, without the need to fabricate the cross-sectional shape and the outer dimension in the Y-Y' direction of the body 310 with high accuracy corresponding to the shape and the dimension of the cross-sectional shape and the dimension in the Y-Y' direction of the opening 101. Especially where the gap G is provided between the body 310 of the movable part 300 and the edge portion 110 of the housing 100, it is possible to fabricate the cross-sectional shape and the outer dimension in the Y-Y' direction of the body 310 of the movable part 300 to any extent that the body 310 can be disposed in the opening 101. It is therefore easy to fabricate the body 310 and the opening 101 of the housing 100.

Technical features and effects (4): Where the gap G is provided between the body 310 of the movable part 300 and the edge portion 110 of the housing 100, no friction is produced between the body 310 and the edge portion 110 of the housing 100 due to the relative movement of the body 310 between the first and second height positions relative to the edge portion 110 of the housing 100.

Technical features and effects (5): Where the body 310 is movable between the first height position and the second height position relative to the edge portion 110 of the housing 100 and the gap G is provided between the body 310 and the edge portion 110, the second portion 212 of the flexible layer 210 of the covering 200 supports the body 310 movably and floatably in the Z-Z' direction. In this arrangement, where the vibration generator V is provided to apply vibration to the body 310, the body 310 vibrates easily.

Second Embodiment

Figure 7A:
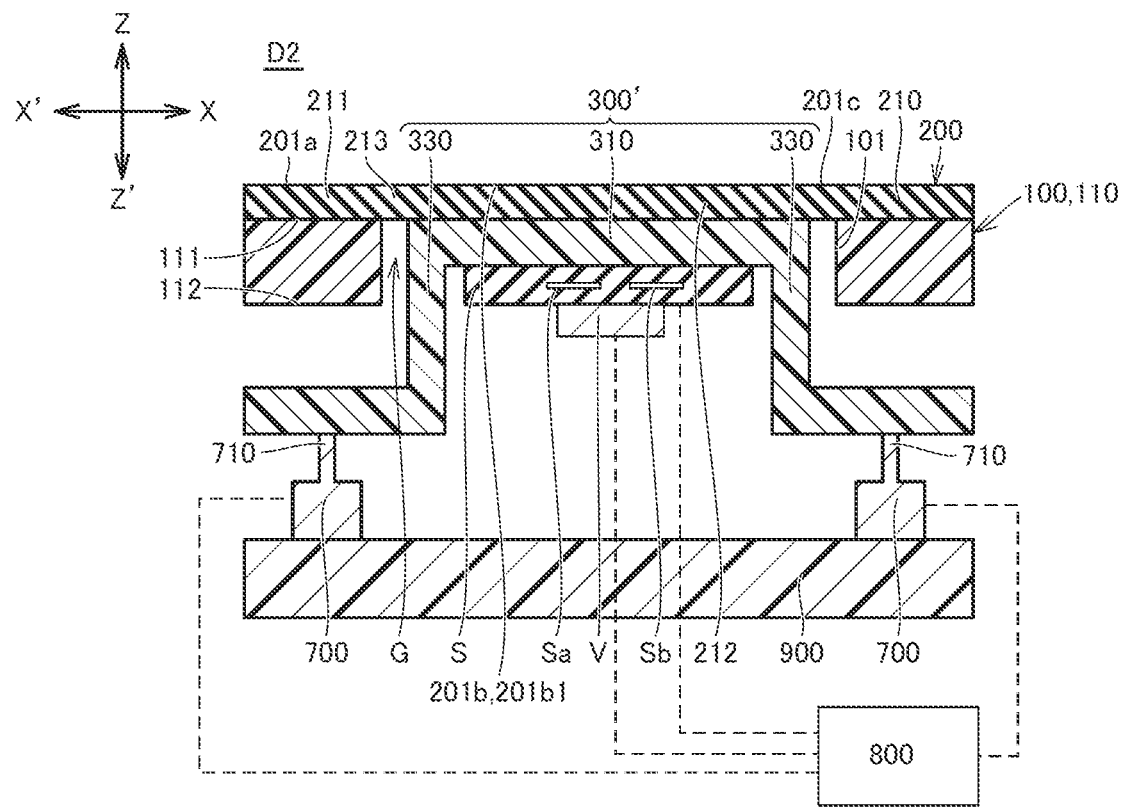
FIG. 7A is a schematic cross-sectional view of a touch sensing device according to a second embodiment of the invention, in a state where an outer face of the touch sensing device is flattened.
Figure 7B:
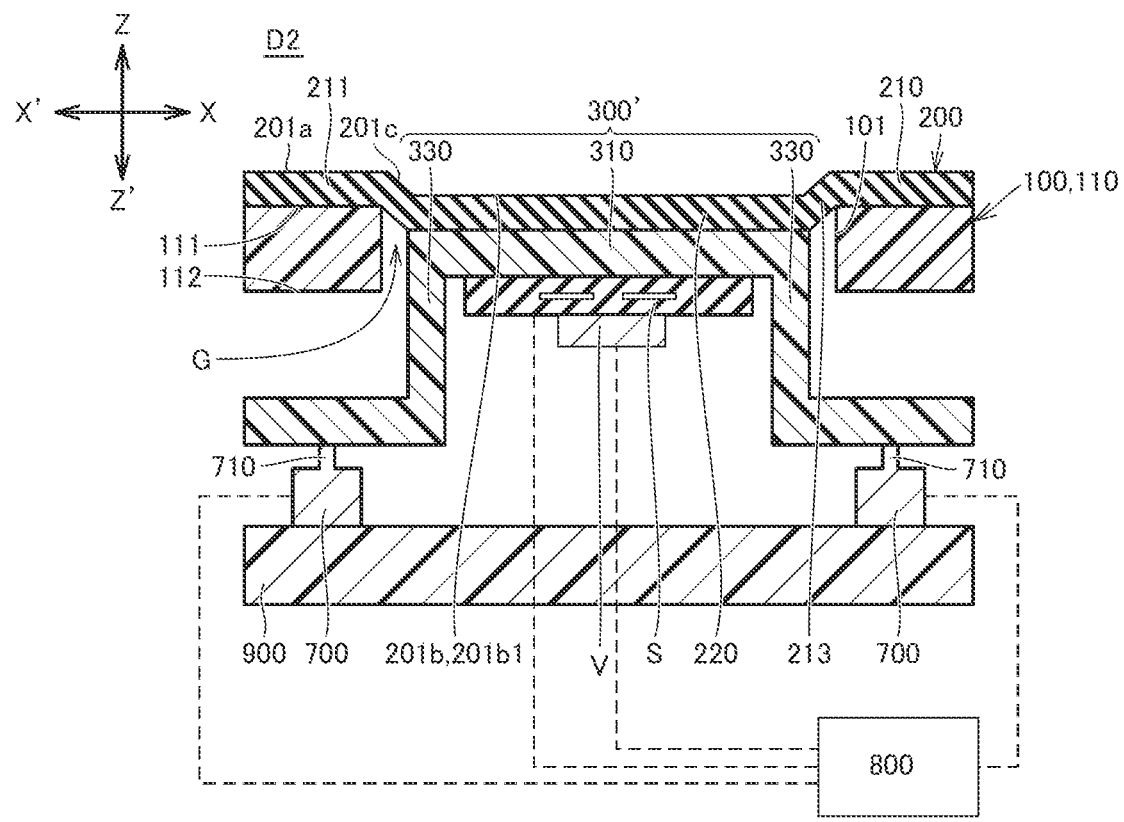
FIG. 7B is a schematic cross-sectional view of the touch sensing device according to the second embodiment, with a recessed part formed in an outer face of the touch sensing device.
Figure 7C:
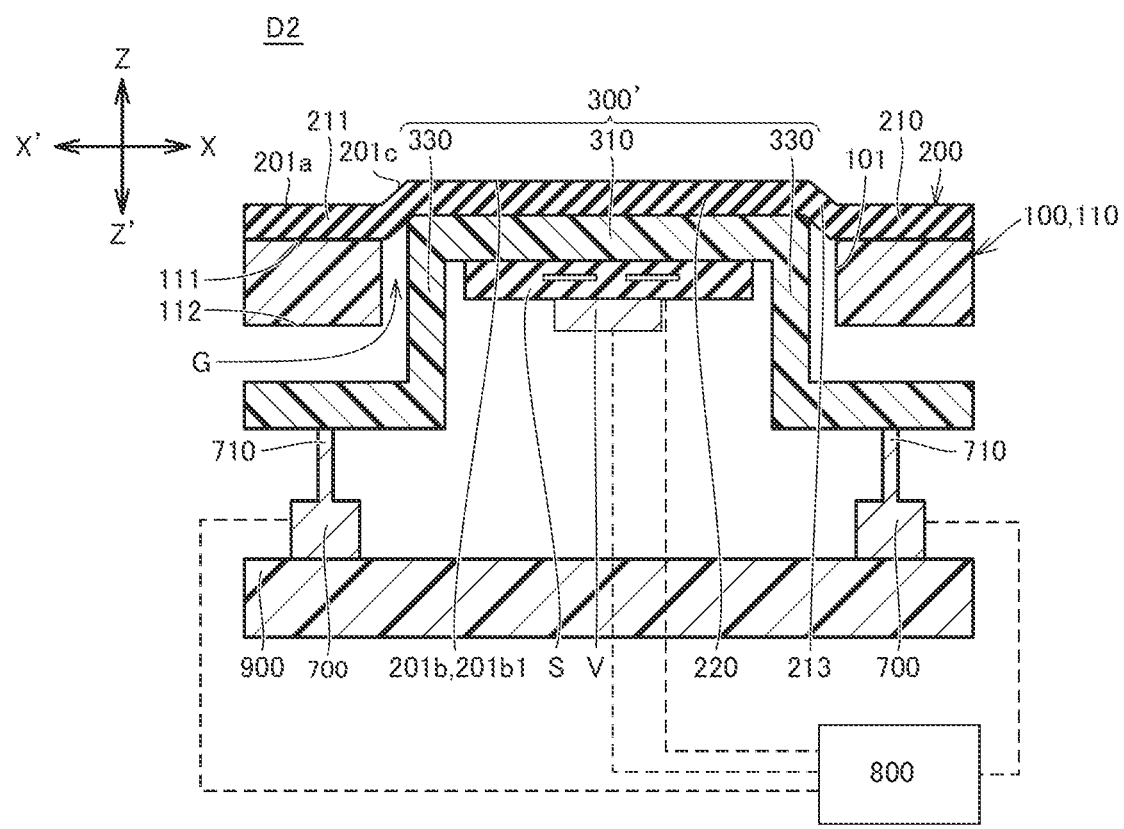
FIG. 7C is a schematic cross-sectional view of a first variant of the touch sensing device according to the second embodiment, with a protruded part formed in an outer face of the touch sensing device.
Figure 8A:
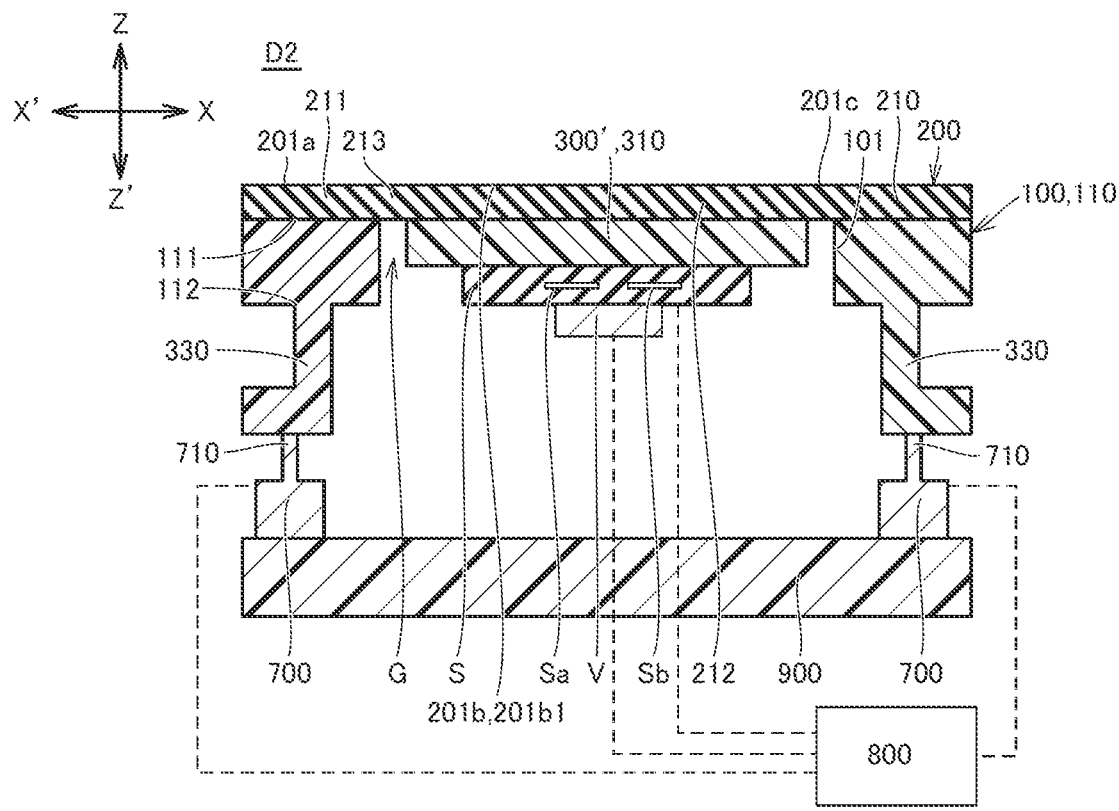
FIG. 8A is a schematic cross-sectional view of a second variant of the touch sensing device according to the second embodiment, in a state where an outer face of the touch sensing device is flattened.
Figure 8B:
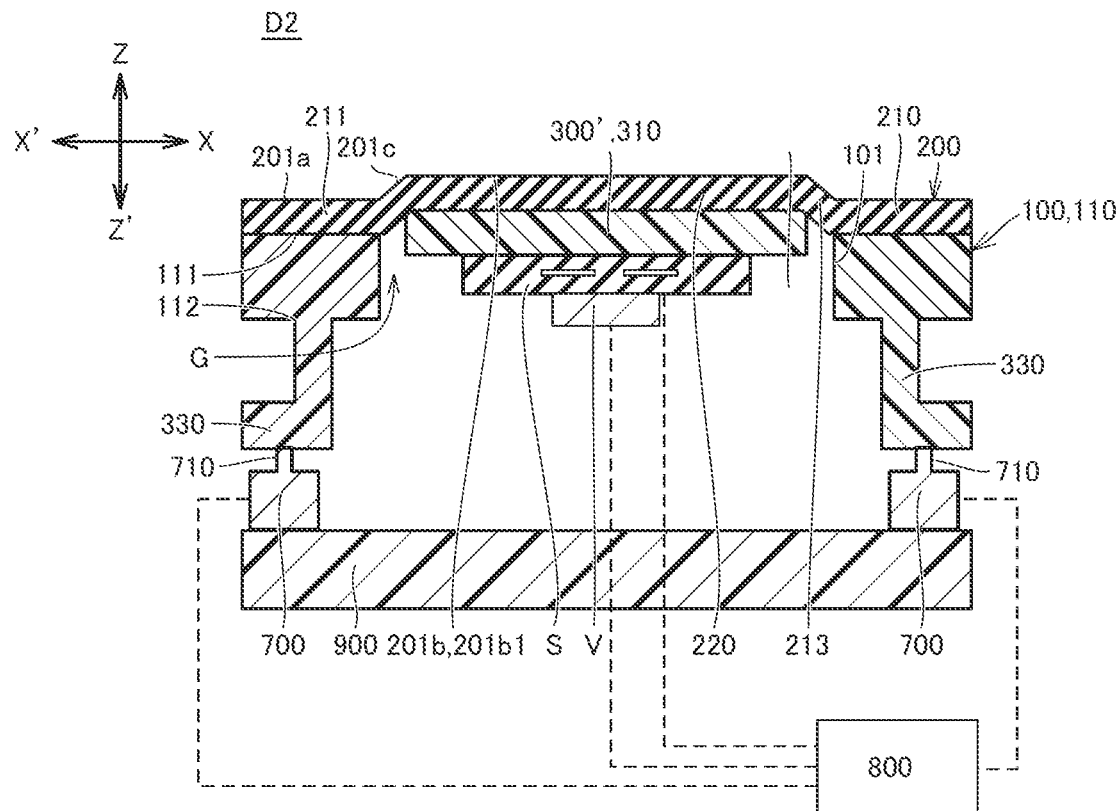
FIG. 8B is a schematic cross-sectional view of the touch sensing device of the second design modification example, with a protruded part formed in an outer face of the touch sensing device.
Figure 8C:
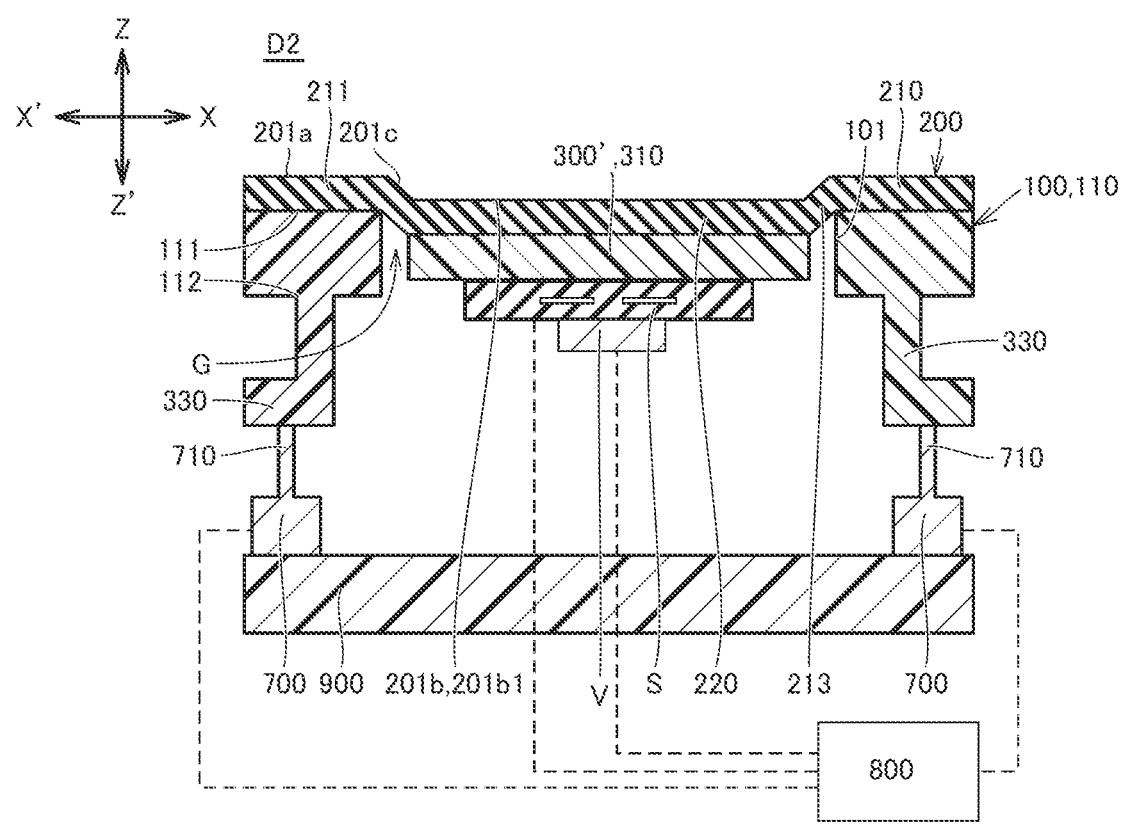
FIG. 8C is a schematic cross-sectional view of a third variant of the touch sensing device according to the second embodiment, with a recessed part formed in an outer face of the touch sensing device.

Hereinafter described is a touch sensing device D2 (which may be simply referred to as a sensing device D2) according to a plurality of embodiments of the invention, including the second embodiment and variants thereof, with reference to FIGS. 7A to 8C. FIGS. 7A to 7B illustrate the sensing device D2 according to the second embodiment. FIG. 7C illustrates a first variant of the sensing device D2 according to the second embodiment. FIGS. 8A and 8B illustrate a second variant of the sensing device D2 according to the second embodiment. FIG. 8C illustrates a third variant of the sensing device D2 according to the second embodiment. FIGS. 7A to 8C, similarly to FIG. 2B, indicate the Z-Z' and X-X' directions.

The sensing device D2 has a similar to the sensing device D1 but different in the following respects: the motion convertor is replaced with at least one lever 330; the at least one holding portion 320 is omitted, the sensing device D2 further includes a support 900; and the lifting actuator 700 is at least one lifting actuator 700 (see FIGS. 7A to 8C). The touch sensing device D2 will now be described focusing on these differences from the touch sensing device D1 and omitting overlapping descriptions.

Where the body 310 of a movable part 300' and the edge portion 110 of the housing 100 have configuration (1) described above, it is the movable part 300' that includes the at least one lever 330. The at least one lever 330 is generally L-shaped and includes a first beam and a second beam. The first beam extends in the Z' direction from the body 310. The second beam extends perpendicularly from the first beam. The at least one lever 330 may be a plurality of levers 330. In the embodiment shown in FIGS. 7A to 7C, two levers 330 are provided. The first beam of one of the two levers 330 extends from the end on the X-direction side of the body 310, and the first beam of the other lever 330 extends from the end on the X'-direction side of the body 310. The second beams of the two levers 330 extend away from each other.

The support 900 is a plate, a platform, or the like disposed in spaced relation to, and on the Z'-direction side to, the second beam of the at least one lever 330. Where a plurality of levers 330 is provided, the support 900 is disposed in spaced relation to, and on the Z'-direction side to, the second beams of the levers 330.

The at least one lifting actuator 700 may be one or plurality of lifting actuators 700 in accordance with the number of the at least one lever 330. Where a single lifting actuator 700 and a single lever 330 are provided, the lifting actuator 700 is interposed between the second beam of the lever 330 and the support 900. Where a plurality of lifting actuators 700 and a plurality of levers 330 are provided, each lifting actuator 700 is interposed between the second beam of a corresponding one of the levers 330 and the support 900.

The plunger 710 of the or each lifting actuator 700 may be coupled to the second beam of the or a corresponding lever 330, and the or each lifting actuator 700 is fixed to the support 900. The or each lifting actuator 700 is configured such that when the coil is energized, the plunger 710 is thereby retracted from an origin position into the lifting actuator 700 to pull the corresponding lever 330 of the movable part 300' in the Z' direction (see FIG. 7B). As a result, the body 310 of the movable part 300' moves in the Z' direction from the first height position to the second height position, the second portion 212 of the flexible layer 210 moves in the Z' direction from the third height position to the fourth height position, and the second region 201b of the outer face 201 moves and become recessed in the Z' direction relative to the first region 201a. At this time, where the third portion 213 and the third region 201c are provided, the third portion 213 flexes and stretches, and the third region 201c becomes sloped from the first region 201a to the second region 201b. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201a and the second region 201b of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Alternatively, the plunger 710 of the or each lifting actuator 700 may be coupled to, in contact with, or spaced from, the second beam of the or a corresponding lever 330. The or each lifting actuator 700 is configured such that when the coil is energized, the plunger 710 is thereby advanced from an origin position to press the corresponding lever 330 of the movable part 300' in the Z direction (see FIG. 7C). As a result, the body 310 of the movable part 300' moves in the Z direction from the first height position to the second height position, the second portion 212 of the flexible layer 210 moves in the Z direction from the third height position to the fourth height position, and the second region 201b of the outer face 201 moves and become protruded in the Z direction relative to the first region 201a. At this time, where the third portion 213 and the third region 201c are provided, the third portion 213 flexes and stretches, and the third region 201c becomes sloped from the first region 201a to the second region 201b. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201a and the second region 201b of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the plunger 710 of the or each lifting actuator 700 is coupled to the second beam of the corresponding lever 330 and the third portion 213 and the third region 201c are provided, when the coil of the or each lifting actuator 700 becomes deenergized, the plunger 710 of the or each lifting actuator 700 is thereby returned to the origin position. By the returning of the plunger 710 to the origin position, the third portion 213 of the flexible layer 210 restores itself, the body 310 of the movable part 300' moves from the second height position back to the first height position, and the first region 201a, the second region 201b, and the third region 201c of the outer face 201 become substantially flush with each other again. Also, where at least one of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the or each lifting actuator 700 is coupled to the second beam of the corresponding lever 330 and neither the third portion 213 nor the third region 201c are provided, when the coil of the or each lifting actuator 700 becomes deenergized, the plunger 710 of the or each lifting actuator 700 is thereby returned to the origin position. By the returning of the plunger 710 to the origin position, the boundary between the second portion 212 and the first portion 211 of the flexible layer 210 restores itself, the body 310 of the movable part 300' moves from the second height position back to the first height position, and the second region 201b and the first region 201a of the outer face 201 become substantially flush with each other again. Also, where at least one of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the or each lifting actuator 700 is not coupled to the second beam of the corresponding lever 330 and the third portion 213 and the third region 201c are provided, when the coil of the or each lifting actuator 700 becomes deenergized, released is the pressing in the Z direction of the plunger 710 of the or each lifting actuator 700 against the corresponding lever 330 of the movable part 300', so that the third portion 213 of the flexible layer 210 restores itself. By the restoration of the third portion 213 of the flexible layer 210, the body 310 of the movable part 300' moves from the second height position back to the first height position, and the second region 201b, the first region 201a, and the third region 201c of the outer face 201 become substantially flush with each other again. Also, where at least one of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the or each lifting actuator 700 is not coupled to the second beam of the corresponding lever 330 and neither the third portion 213 nor the third region 201c are provided, when the coil of the or each lifting actuator 700 becomes deenergized, released is the pressing in the Z direction of the plunger 710 of the or each lifting actuator 700 against the corresponding lever 330 of the movable part 300', so that the boundary between the second portion 212 and the first portion 211 of the flexible layer 210 restores itself. By the restoration of the boundary of the flexible layer 210, the body 310 of the movable part 300' moves from the second height position back to the first height position, and the second region 201b of the outer face 201 becomes substantially flush with the first region 201a again. Also, where at least one of the outermost layer 220, the at least one first intermediate layer 230, and the at least one second intermediate layer is provided, the boundary between the second portion and the first portion of the at least one layer restores itself according to the restoration of the boundary of the flexible layer 210.

Where the body 310 of the movable part 300' and the edge portion 110 of the housing 100 have configuration (2) described above, it is the edge portion 110 of the housing 100 that includes the at least one lever 330. The at least one lever 330 is generally L-shaped and includes a first beam and a second beam. The first beam extends in the Z' direction from the edge portion 110 (see FIGS. 8A to 8C). The second beam extends perpendicularly from the first beam. The at least one lever 330 may be a plurality of levers. For example, two levers 330 may be provided. In this case, the first beam of one of the two levers 330 extends from a portion of the edge portion 110 that is located on the X-direction side relative to the opening 101, the first beam of the other lever 330 extends from a portion of the edge portion 110 that is located on the X'-direction side relative to the opening 101, and the second beams of the two levers 330 extend away from each other.

The support 900 is configured as described above. The or each lifting actuator 700 is interposed between the second beam of the corresponding lever 330 and the support 900.

The plunger 710 of the or each lifting actuator 700 is coupled to the second beam of the or a corresponding lever 330, and the or each lifting actuator 700 is fixed to the support 900. The or each lifting actuator 700 is configured such that when the coil is energized, the plunger 710 is thereby retracted from an origin position into the lifting actuator 700 to pull the corresponding lever 330 of the edge portion 110 of the housing 100 in the Z' direction (see FIG. 8B). As a result, the edge portion 110 of the housing 100 moves in the Z' direction from the first height position to the second height position, the first portion 211 of the flexible layer 210 moves in the Z' direction from the third height position to the fourth height position, and the first region 201a of the outer face 201 moves and become recessed in the Z' direction relative to the second region 201b. At this time, where the third portion 213 and the third region 201c are provided, the third portion 213 flexes and stretches, and the third region 201c becomes sloped from the first region 201a to the second region 201b. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201a and the second region 201b of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Alternatively, the plunger 710 of the or each lifting actuator 700 may be coupled to, in contact with, or spaced from, the second beam of the or a corresponding lever 330. The or each lifting actuator 700 is configured such that when the coil is energized, the plunger 710 is thereby advanced from an origin position to press the corresponding lever 330 of the edge portion 110 of the housing 100 in the Z direction (see FIG. 8C). As a result, the edge portion 110 of the housing 100 moves in the Z direction from the first height position to the second height position, the first portion 211 of the flexible layer 210 moves in the Z direction from the third height position to the fourth height position, and the first region 201a of the outer face 201 moves and become protruded in the Z direction relative to the second region 201b. At this time, where the third portion 213 and the third region 201c are provided, the third portion 213 flexes and stretches, and the third region 201c becomes sloped from the first region 201a to the second region 201b. Where at least one of the outermost layer 220, the at least one first intermediate layer 230, and the at least one second intermediate layer is provided, the third portion of the at least one layer flexes and stretches according to the flexing and stretching of the third portion 213 of the flexible layer 210. Where the third portion 213 is not provided, the boundary between the first portion 211 and the second portion 212 of the flexible layer 210 flexes and stretches, and the boundary between the first region 201a and the second region 201b of the outer face 201 stretches and becomes sloped. Where at least one layer of the outermost layer 220, the at least one first intermediate layer 230, and the at least one second intermediate layer is provided, the boundary between the first portion and the second portion of the at least one layer flexes and stretches according to the flexing and stretching of the boundary between the first portion 211 and the second portion 212 of the flexible layer 210.

Where the plunger 710 of the or each lifting actuator 700 is coupled to the second beam of the corresponding lever 330 and the third portion 213 and the third region 201c are provided, when the coil of the or each lifting actuator 700 becomes deenergized, the plunger 710 of the or each lifting actuator 700 is thereby returned to the origin position. By the returning of the plunger 710 to the origin position, the third portion 213 of the flexible layer 210 restores itself, the edge portion 110 of the housing 100 moves from the second height position back to the first height position, and the first region 201a, the second region 201b, and the third region 201c of the outer face 201 become substantially flush with each other again. Also, where at least one of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the or each lifting actuator 700 is coupled to the second beam of the corresponding lever 330 and neither the third portion 213 nor the third region 201c are provided, when the coil of the or each lifting actuator 700 becomes deenergized, the plunger 710 of the or each lifting actuator 700 is thereby returned to the origin position. By the returning of the plunger 710 to the origin position, the boundary between the second portion 212 and the first portion 211 of the flexible layer 210 restores itself, the edge portion 110 of the housing 100 moves from the second height position back to the first height position, and the first region 201a of the outer face 201 become substantially flush with the second region 201b again. Also, where at least one of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the or each lifting actuator 700 is not coupled to the second beam of the corresponding lever 330 and the third portion 213 and the third region 201c are provided, when the coil of the or each lifting actuator 700 becomes deenergized, released is the pressing in the Z direction of the plunger 710 of the or each lifting actuator 700 against the corresponding lever 330 of the edge portion 110 of the housing 100, so that the third portion 213 of the flexible layer 210 restores itself. By the restoration of the third portion 213 of the flexible layer 210, the edge portion 110 of the housing 100 moves from the second height position back to the first height position, and the first region 201a, the second region 201b, and the third region 201c of the outer face 201 become substantially flush with each other again. Also, where at least one of the outermost layer 220, the at least one first intermediate layer 230, and the at least one second intermediate layer is provided, the third portion of the at least one layer restores itself according to the restoration of the third portion 213 of the flexible layer 210.

Where the plunger 710 of the or each lifting actuator 700 is not coupled to the second beam of the corresponding lever 330 and neither the third portion 213 nor the third region 201c are provided, when the coil of the or each lifting actuator 700 becomes deenergized, released is the pressing in the Z direction of the plunger 710 of the or each lifting actuator 700 against the corresponding lever 330 of the edge portion 110 of the housing 100, so that the boundary between the second portion 212 and the first portion 211 of the flexible layer 210 restores itself. By the restoration of the boundary of the flexible layer 210, the edge portion 110 of the housing 100 moves from the second height position back to the first height position, and the first region 201a of the outer face 201 becomes substantially flush with the second region 201b again. Also, where at least one of the outermost layer 220, the at least one first intermediate layer 230, and the at least one second intermediate layer is provided, the boundary between the second portion and the first portion of the at least one layer restores itself according to the restoration of the boundary of the flexible layer 210.

The controller 800 of the sensing device D2 is configured (step) to drive the or each lifting actuator 700 in a manner described above according to the receipt of any deformation instruction described above. Other than this, the controller 800 of the sensing device D2 may have substantially the same configuration (step) as the controller 800 of the sensing device D1.

The sensing device D2 described above provides similar technical features and effects as the technical features and effects (1) to (5) of the sensing device D1. Further, the sensing device D2 has a simplified configuration because the or each lifting actuator 700 is configured to pull or press the corresponding lever 330 and does not require the motion convertor.

It should be noted that the above-described touch sensing device is not limited to the above embodiments, and may be modified in any manner within the scope of the claims. Details will be described below.

The touch sensor of any of the above aspects is not limited to capacitive touch sensors and may be a resistive touch sensor or an optical touch sensor as described below. The touch sensing device of any of the above aspects is configured as described above, except that a resistive or optical touch sensor is provided in place of the capacitive touch sensor.

The resistive touch sensor includes at least one first electrode, at least one second electrode, and at least one insulating spacer. The at least one first electrode and the at least one second electrode are arranged such as to partly overlap each other in the Z-Z' direction. The at least one spacer is interposed between the at least one first electrode and the at least one second electrode in the Z-Z' direction so as to separate the at least one first electrode from the at least one second electrode in the Z-Z' direction. When a detection target comes into contact with the touch region 201b1, a load is applied onto part of the at least one first electrode, so that at least part of the at least one first electrode flexes to come into contact with, and thereby come into electrical conduction with, the at least one second electrode. It should be appreciated that the resistive touch sensor may serve as a touch panel including a plurality of first electrodes and a plurality of second electrodes. The resistive touch sensor may serve as a touch switch including a plurality of first electrodes and a plurality of second electrodes. The controller 800 is configured to determine that a detection target has come into contact with a portion of the touch region 201*b*1 that is on the Z-direction side relative to the contact area between the first and second electrodes of the resistive touch sensor. The controller 800 thus detects the position information on the contact with the touch region 201*b*1 by the detection target. Where the resistive touch sensor is a touch panel, the controller 800 is configured to detect a plurality of pieces of position information on a contact by a detection target detected as information on an operational input to the touch region 201*b*1. Also, the controller 800 may be further configured (step) to determine the receipt of the electrical conduction (electric signal) as the receipt of a deformation instruction, and to drive the lifting actuator 700. The controller 800 may be configured (step) to detect, after the receipt of any of deformation instructions described above and through the resistive touch sensor described above, position information on a contact with the touch region 201*b*1 by a detection target and/or a plurality of pieces of position information on a contact by a detection target detected as information on operational inputs to the touch region 201*b*1. In other words, the controller 800 may be configured (step) to detect position information on a contact with the touch region 201*b*1 by the detection target according to the receipt of an electrical signal of the resistive touch sensor and/or configured (step) to detect information on operational inputs to the touch region 201*b*1 according to the receipt of an electrical signal of the resistive touch sensor.

The optical touch sensor may include at least one light emitting device and at least one light receiving device. In this case, the at least one light emitting device and the at least one light receiving device are disposed on one and the other sides (e.g., on the X- and X'-direction sides), respectively, relative to the touch region 201*b*1, such that at least one light emitting device and the at least one light receiving device face each other across the touch region 201*b*1. The at least one light receiving device is configured to receive an optical signal emitted from the at least one light emitting device and output an electric signal. A detection target contacting the touch region 201*b*1 blocks an optical signal emitted from the at least one light emitting device. In this case, the at least one light receiving device does not output an electric signal. In other words, there is a change in an electric signal from the at least one light receiving device. It should be appreciated that the optical touch sensor may serve as a touch panel including a plurality of light emitting devices and a plurality of light receiving devices. The optical touch sensor may serve as a touch switch including a plurality of light emitting devices and a plurality of light receiving devices. The controller 800 is configured (step) to determine that a detection target has come into contact with a portion of the touch region 201*b*1 that is on the Z-direction side relative to a portion between the at least one light receiving device and the at least one light emitting device according to a change in an electric signal of the at least one light receiving device. The controller 800 thus detects the position information on the contact with the touch region 201*b*1 by the detection target. Where the optical touch sensor is a touch panel, he controller 800 is configured (step) to detect a plurality of pieces of position information on a contact by a detection target detected as information on an operational input to the touch region 201*b*1. Also, the controller 800 may be further configured (step) to determine the change of an electric signal as the receipt of a deformation instruction, and to drive the lifting actuator 700. The controller 800 may be configured (step) to detect, after the receipt of any of deformation instructions described above and through the optical touch sensor described above, position information on a contact with the touch region 201*b*1 by a detection target and/or a plurality of pieces of position information on a contact by a detection target detected as information on operational inputs to the touch region 201*b*1 in a manner described above. In other words, the controller 800 may be configured (step) to detect position information on a contact with the touch region 201*b*1 by the detection target according to a change in an electrical signal of the optical touch sensor and/or configured (step) to detect the information on operational inputs to the touch region 201*b*1 according to a change in an electrical signal of the optical touch sensor. Where the touch sensor is an optical type, the covering 200 of any of the above aspects has a translucent portion located on the Z-direction side portion relative to the touch sensor.

The vibration generator V may be provided separately from the lifting actuator 700 as described above, the present invention is not limited thereto. The lifting actuator 700 may double as the vibration generator V, and the plunger 710 of the lifting actuator 700 may be configured to apply vibration in the Z-Z' direction to the movable part 300 or 300' or to the edge portion 110 of the housing 100.

The lifting actuator 700 may or may not be a solenoid. For example, the lifting actuator 700 may a piezoelectric element or a motor. Where the lifting actuator 700 is a piezoelectric element, the lifting actuator 700 is configured to move the movable part 300 or 300' or the edge portion 110 of the housing 100 in the Z-Z' direction between the first height position and the second height position. Where the lifting actuator 700 is a motor, the above-described motion convertor may be configured to convert rotational motion of a shaft of the motor into motion in the Z-Z' direction of the movable part 300 or 300' or the edge portion 110 of the housing 100. The motion convertor may be constituted by a cam mechanism, a plurality of gears, a link mechanism, or a combination thereof.

The second portion 212 of the flexible layer 210 may have a larger dimension in the Z-Z' direction than the first portion 211 of the flexible layer 210, in which case the first face 311 of the body 310 of the movable part 300 or 300' of any of the above aspects at the first height position may be relatively located on the Z-direction side relative to the first face 111 of the edge portion 110 of the housing 100. Alternatively, the second portion 212 may have a smaller dimension in the Z-Z' direction than the first portion 211, in which case the first face 311 of the body 310 of the movable part 300 or 300' of any of the above at the first height position aspects may be relatively located on the Z'-direction side relative to the first face 111 of the edge portion 110 of the housing 100.

In a state where the movable part 300 or 300' of any of the above aspects is relatively located at the first height position relative to the edge portion 110, the first region 201*a* of the outer face 201 of the covering 200 of any of the above aspects may be located on the Z- or Z'-direction side relative to the second region 201*b*. In this case, in a state where the second portion 212 is relatively located at the third height position relative to the first portion 211, the flexible layer 210 partly flexes and stretches to the Z- or Z'-direction side. According to the movement of the movable part 300 or 300' from the first height position to the second height position relative to the edge portion 110 of the housing 100, the second portion 212 relatively moves from the third height position to the fourth height position relative to the first portion 211, and the flexible layer 210 partly shrinks to the Z'- or Z-direction side or flexes and stretches to the Z- or Z'-direction side. Where the third portion 213 is provided, in a state where the second portion 212 is relatively located at the third height position relative to the first portion 211, the third portion 213 flexes and stretches to the Z- or Z'-direction side. According to the movement of the movable part 300 or 300' from the first height position to the second height position relative to the edge portion 110 of the housing 100, the third portion 213 shrinks to the Z'- or Z-direction side or flexes and stretches to the Z- or Z'-direction side. Where the outermost layer 220, the at least one first intermediate layer 230, and/or the at least one second intermediate layer is provided, in a state where the second portion 212 is relatively located at the third height position relative to the first portion 211, the outermost layer 220, the at least one first intermediate layer 230, and/or the at least one second intermediate layer partly flexes and stretches along the flexible layer 210. According to the partial shrinking or stretching of the flexible layer 210, the outermost layer 220, the at least one first intermediate layer 230, and/or the at least one second intermediate layer also partly shrinks, or flexes and stretches. In other respects, the covering 200 may be configured as described above. When the second portion 212 relatively returns from the fourth height position to the third height position relative to the first portion 211 and the movable part 300 or 300' relatively moves from the second height position to the first height position relative to the edge portion 110, the flexible layer 210 partly flexes and stretches to the Z'- or Z-direction side. Where the third portion 213 is provided, when the second portion 212 relatively returns from the fourth height position to the third height position relative to the first portion 211 and the movable part 300 or 300' relatively moves from the second height position to the first height position relative to the edge portion 110, the third portion 213 flexes and stretches to the Z'- or Z-direction side. Where the outermost layer 220, the at least one first intermediate layer 230, and/or the at least one second intermediate layer is provided, the outermost layer 220, the at least one first intermediate layer 230, and/or the at least one second intermediate layer stretches according to the partial stretching of the flexible layer 210 at the time of returning.

The neutral position of the movable part 300 or 300' of any of the above aspects relative to the edge portion 110 of the housing 100 of any of the above aspects may be the second height position rather than the first height position. In this case, the motion convertor and the lifting actuator 700, or alternatively the lifting actuator 700, is configured to move the movable part 300 or 300' from the second height position to the first height position instead of from the first height position to the second height position, but otherwise may be configured as described above. In this case, in a state where the second portion 212 is relatively located at the fourth height position relative to the first portion 211, the flexible layer 210 partly flexes and stretches to the Z'- or Z-direction side. According to the movement of the movable part 300 or 300' from the second height position to the first height position relative to the edge portion 110 of the housing 100, the second portion 212 relatively moves from the fourth height position to the third height position relative to the first portion 211, and the flexible layer 210 partly shrinks to the Z- or Z'-direction side. Where the third portion 213 is provided, in a state where the second portion 212 is relatively located at the fourth height position relative to the first portion 211, the third portion 213 flexes and stretches to the Z'- or Z-direction side. According to the movement of the movable part 300 or 300' from the second height position to the first height position relative to the edge portion 110 of the housing 100, the third portion 213 shrinks to the Z- or Z'-direction side. Where the outermost layer 220, the at least one first intermediate layer 230, and/or the at least one second intermediate layer is provided, in a state where the second portion 212 is relatively located at the fourth height position relative to the first portion 211, the outermost layer 220, the at least one first intermediate layer 230, and/or the at least one second intermediate layer partly flexes and stretches along the flexible layer 210. According to the partial shrinking of the flexible layer 210, the outermost layer 220, the at least one first intermediate layer 230, and/or the at least one second intermediate layer also partly shrinks. In other respects, the covering 200 may be configured as described above. When the second portion 212 relatively returns from the third height position to the fourth height position relative to the first portion 211 and the movable part 300 or 300' relatively moves from the second height position to the first height position relative to the edge portion 110, the flexible layer 210 partly flexes and stretches to the Z'- or Z-direction side. Where the third portion 213 is provided, when the second portion 212 relatively returns from the fourth height position to the third height position relative to the first portion 211 and the movable part 300 or 300' relatively moves from the second height position to the first height position relative to the edge portion 110, the third portion 213 flexes and stretches to the Z'- or Z-direction side. Where the outermost layer 220, the at least one first intermediate layer 230, and/or the at least one second intermediate layer is provided, the outermost layer 220, the at least one first intermediate layer 230, and/or the at least one second intermediate layer stretch according to the partial stretching of the flexible layer 210 at the time of returning.

Figure 9A:
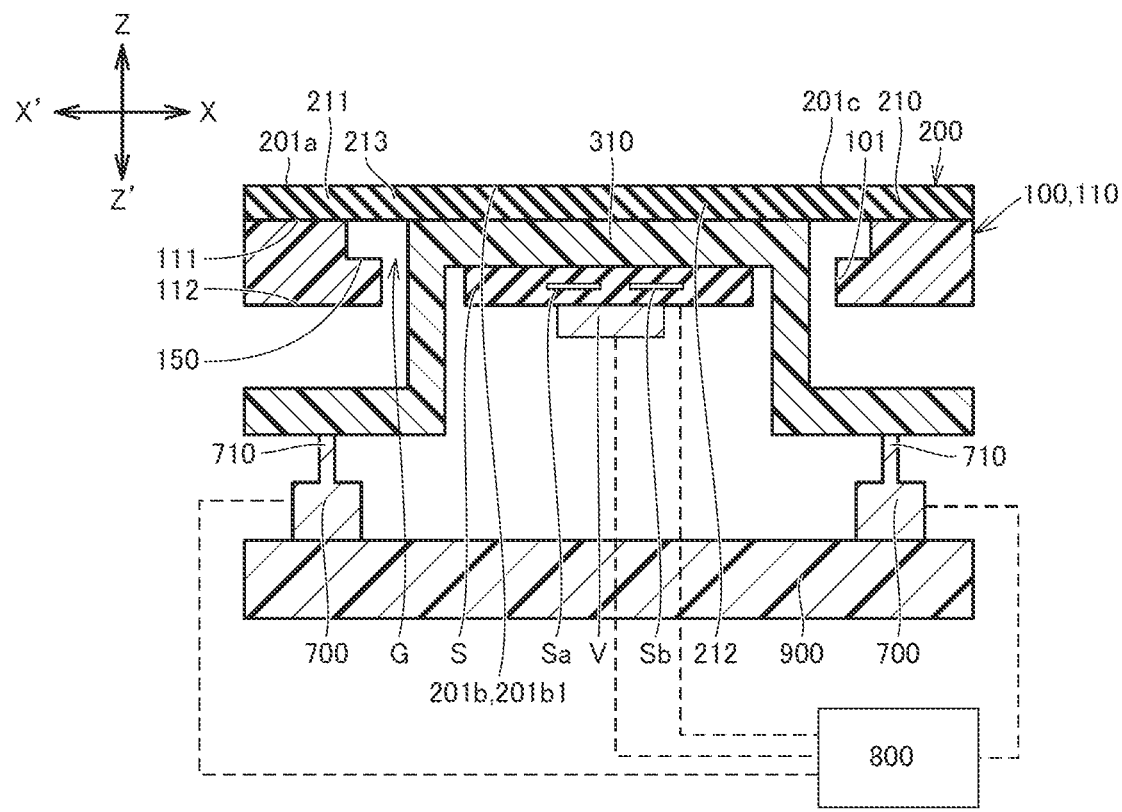
FIG. 9A is a schematic cross-sectional view of a fourth variant of the touch sensing device according to the second embodiment, in a state where an outer face of the touch sensing device is flattened.
Figure 9B:
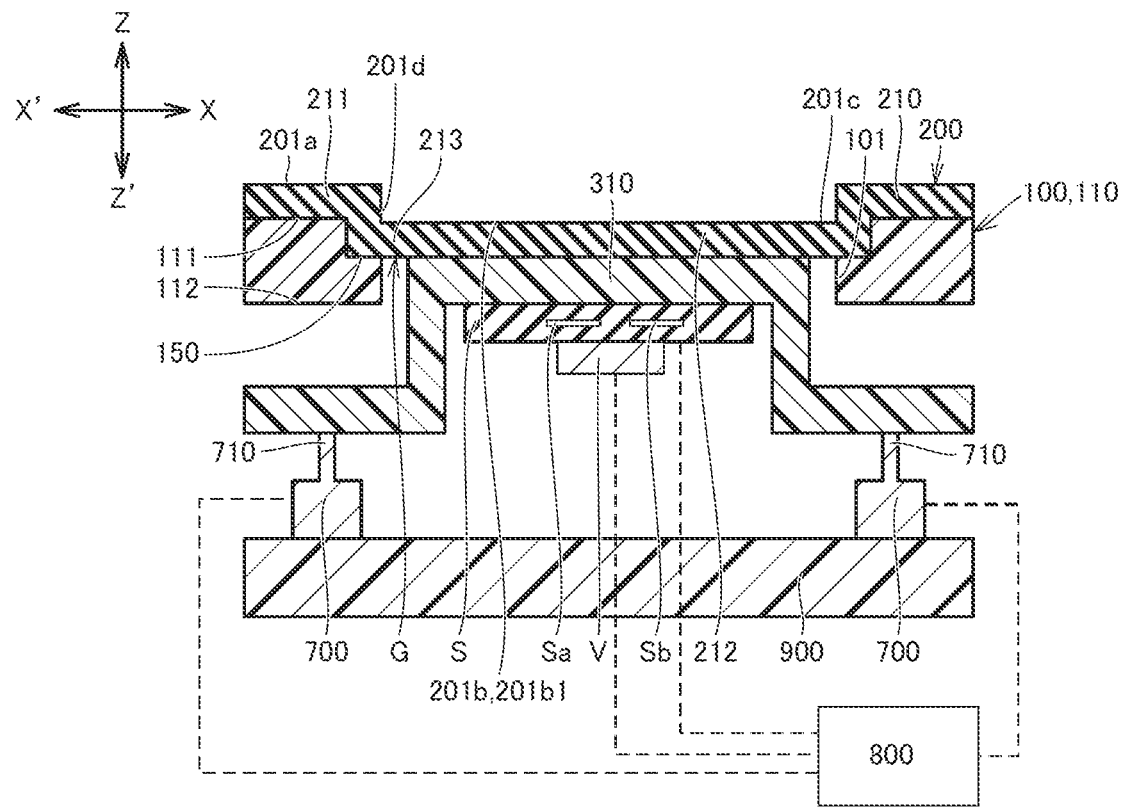
FIG. 9B is a schematic cross-sectional view of a fifth variant of the touch sensing device according to the second embodiment, in a state where an outer face of the touch sensing device is flattened.

The edge portion 110 of the housing 100 of any of the above aspects may be provided with a stepped portion 150 surrounding the opening 101 (see FIGS. 9A and 9B). The stepped portion 150 includes at least one step portion. In this case, the covering 200 of any of the above aspects may extend along the first face 111 of the edge portion 110, rather than along the stepped portion 150 (see FIG. 9A). Alternatively, the covering 200 of any of the above aspects may be extend along the stepped portion 150 (see FIG. 9B).Where the stepped portion 150 is provided, the first face 311 at the first height position of the movable part 300 or 300' of any of the above aspects may be relatively located at the same height position in the Z-Z' direction as, or alternatively on the Z- or Z'-direction side relative to, a face on the Z-direction side of at least one step portion of the stepped portion 150 of the edge portion 110. The at least one step portion of the stepped portion 150 may be a plurality of step portions.

For example, where the at least one step portion of the stepped portion 150 is a single step portion and the covering 200 of any of the above aspects extends along the stepped portion 150, the face on the Z-direction side of the step portion is located on the Z'-direction side relative to the face on the Z-direction side of a surrounding portion around the step portion of the edge portion 110. In this case, the outer face 201 of the covering 200 is formed with a step 201d along the height difference between the face on the Z-direction side of the step portion and the face on the Z-direction side of the surrounding portion. The area inside the step 201d may be used as the second region 201b of the outer face 201 to allow a user to touch the step 201d of the outer face 201 with a detection target and thereby recognize the second region 201b including the touch region 201b1.

[0180] For example, where the plurality of step portions includes a first step portion surrounding the opening 101, a second step portion having a face on the Z-direction side located on the Z-direction side relative to a face on the Z-direction side of the first step portion, and a third step portion having a face on the Z-direction side located on the Z-direction side relative to the face on the Z-direction side of the second step portion, and the covering 200 of any of the above aspects extends along the stepped portion 150, the outer face 201 of the covering 200 is formed with a first step along the height difference between the face on the Z-direction side of the third step portion and the face on the Z-direction side of the second step portion, and also formed with a second step along the height difference between the face on the Z-direction side of the second step portion and the face on the Z-direction side of the first step portion. This arrangement allows a user to touch the first step of the outer face 201 with a detection target and thereby recognize that the detection target is in the vicinity of the second region 201*b*, and also allows the user to touch the second step of the outer face 201 with a detection target and thereby recognize that the detection target is coming into the second region 201*b*.

Alternatively, where the plurality of step portions includes a first step portion surrounding the opening 101 and a second step portion having a face on the Z-direction side located on the Z'-direction side relative to a face on the Z-direction side of the first step portion and relative to a face on the Z-direction side of a surrounding portion of the second step, and the covering 200 of any of the above aspects extends along the stepped portion 150, the outer face 201 of the covering 200 is formed with a first step along the height difference between the face on the Z-direction side of the second step portion and the face on the Z-direction side of the surrounding portion, and also formed with a second step along the height difference between the face on the Z-direction side of the second step portion and the face on the Z-direction side of the first step portion. This arrangement also allows a user to touch the first step of the outer face 201 with a detection target and thereby recognize that the detection target is in the vicinity of the second region 201*b*, and also allows the user to touch the second step of the outer face 201 with a detection target and thereby recognize that the detection target is coming into the second region 201*b*.

The stepped portion 150 can be provided not on the edge portion 110 of the housing 100 but on the body 310 of the movable part 300 or 300' of any of the above aspects. Also in this case, the covering 200 of any of the above aspects may extend along the stepped portion 150 in a manner described above. The touch region 201*b*1 can be disposed on the Z-direction side relative to the face on the Z-direction side of the step portion on the most Z'-direction side of the stepped portion 150 of the body 310. The stepped portion 150 may be provided on both the edge portion 110 of the housing 100 and the body 310 of the movable part 300 or 300'.

Where the stepped portion 150 is not provided, it is possible to provide a step on the outer face 201. The movable part 300 or 300' of any of the above aspects is directly or indirectly fixed to the second portion 212 of the flexible layer 210 of the covering 200 of any of the above aspects, and the edge portion 110 of any of the above aspects is directly or indirectly fixed to the first portion 211 of the flexible layer 210 of the covering 200 of any of the above aspects. Therefore, in a state where the movable part 300 or 300' of any of the above aspects is relatively located at the first height position (neutral position) or the second height position (neutral position) relative to the edge portion 110, the first region 201*a* of the outer face 201 of the covering 200 of any of the above aspects is located on the Z- or Z'-direction side relative to the second region 201*b*, so that the step is formed at a portion between the first region 201*a* and the second region 201*b* of the outer face 201. The formation of the step is irrelevant to the presence or absence of the third portion 213 and the third region 201*c* of the covering 200. Such the step also functions similarly to the step 201*d*.

In addition to the touch sensor of any of the above aspects provided at(on or in) the body 310 of the movable part 300 or 300' of any of the above aspects or the touch sensor of any of the above aspects disposed in spaced relation in the Z' direction to the body 310 of the movable part 300 or 300' of any of the above aspects, a touch sensor of any of the above aspects may be further provided on the Z'-direction side relative to the face on Z-direction side of the second step portion of any of the above aspects. In this case, the controller 800 may be further configured (step) to detect a contact by a detection target on a portion of the outer face 201 that is located on the Z'-direction side relative to the face on Z-direction side of the second step portion, according to a change in an electric signal or a receipt of an electric signal of the touch sensor of the aspect located on the Z'-direction side relative to the face on the Z-direction side of the second step portion in a manner described. The controller 800 is thus able to detect that a detection target is in contact with the portion of the outer face 201 located on the Z-direction side relative to the face on the Z-direction side of the second step portion, that is, to detect that the detection target is located outside the touch region 201*b*1 of the second region 201*b*.

Figure 10:
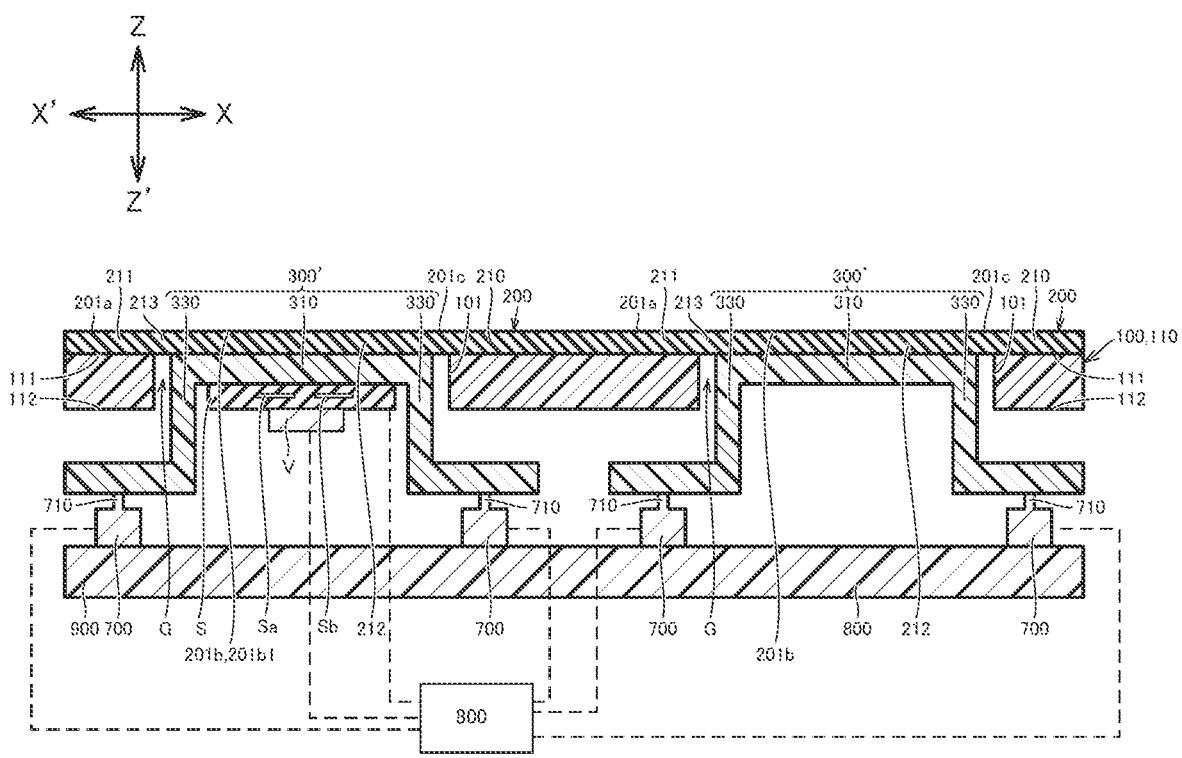
FIG. 10 is a schematic cross-sectional view of a sixth variant of the touch sensing device of the second embodiment, in a state where an outer face of the touch sensing device is flattened.

In the touch sensing device of any of the above aspects, the opening 101 of the housing 100, the movable part 300 or 300', the lifting actuator 700, the first portion 211 of the flexible layer 210, the second portion 212 of the flexible layer 210, the first region 201*a* of the outer face 201, and the second region 201*b* of the outer face 201 may each be at least one element. The at least one opening 101 of the housing 100 may be a plurality of them, the at least one movable part 300 or 300' may be a plurality of them, the at least one lifting actuator 700 may be a plurality of them, the at least one first portion 211 of the flexible layer 210 may be a plurality of them, the at least one second portion 212 of the flexible layer 210 may be a plurality of them, the at least one first region 201*a* of the outer face 201 may be a plurality of them, and the at least one second region 201*b* of the outer face 201 may be a plurality of them (see FIG. 10). Where a plurality of openings 101 of any of the above aspects is provided, the plural number of the edge portions 110 of the openings 101 of any of the above aspects corresponds to the plural number of the openings, the plural number of the movable parts 300 or 300' of any of the above aspects corresponds to the plural number of the openings, the plural number of the first portions 211 of any of the above aspects corresponds to the plural number of the openings, the plural number of the second portions 212 of any of the above aspects corresponds to the plural number of the openings, the plural number of the first regions 201*a* of any of the above aspects corresponds to the plural number of the openings, and the plural number of the second regions 201*b* corresponds to the plural number of the openings. The main bodies 310 of the plurality of movable parts 300 or 300' are each disposed in a corresponding one of the openings 101. A plurality of third portions 213 of the flexible layer 210 and a plurality of third regions 201*c* of the outer face 201 may be provided corresponding to the plural number of the second portions 212 and the plural number of the second regions 201*b*. Where the at least one first intermediate layer and/or the at least one second intermediate layer of any of the above aspects is provided, the at least one first intermediate layer and/or the at least one second intermediate layer may each include a plurality of first portions and a plurality of second portions corresponding to the plural number of the first portions 211 of the flexible layer 210 and the plural number of the second portions 212 of the flexible layer 210. The at least one first intermediate layer and/or the at least one second intermediate layer of any of the above aspects may each include a plurality of third portions corresponding to the plural number of the third portions 213. Where a plurality of lifting actuators 700 of any of the above aspects is provided, at least one of them is provided for each of the edge portions 110 of the openings 101 of any of the above aspects and configured to move each edge portion 110 in the Z-Z' direction in a manner described above, or alternatively at least one of the lifting actuators 700 is provided for each of the movable parts 300 or 300' of any of the above aspects and configured to move each movable part 300 or 300' in the Z-Z' direction in a manner described above. A plurality of motion convertors of any of the above aspects may be provided corresponding to the plural number of the lifting actuators 700.

The plurality of movable parts 300 or 300' may include at least one first movable part 300 or 300' and at least one second movable part 300 or 300'. In this case, the or each first movable part 300 or 300' has the same configuration as the movable part 300 or 300' of any of the above aspects, and the first height position is the neutral position. On the other hand, the or each second movable part 300 or 300' has the same configuration as the movable part 300 or 300' of any of the above aspects, except that the second height position, not the first height position, is the neutral position. In this case, the plurality of openings 101 include includes at least one first opening 101 and at least one second opening 101, the plurality of edge portions 110 of the openings 101 include an edge portion 110 of the least one first opening 101 and an edge portion 110 of the least one second opening 101, and the plurality of lifting actuators 700 includes at least one first lifting actuator 700 and at least one second lifting actuator 700. The or each first lifting actuator 700 is configured to move the corresponding first movable part 300 or 300' or the corresponding edge portion 110 of the first opening 101 in the Z-Z' direction so as to relatively move the corresponding first movable part 300 or 300' from the first height position to the second height position relative to the corresponding edge portion 110 of the first opening 101. The or each second lifting actuator 700 is configured to move the corresponding second movable part 300 or 300' or the corresponding edge portion 110 of the second opening 101 in the Z-Z' direction to relatively move the corresponding second movable part 300 or 300' from the second height position to the first height position relative to the corresponding edge portion 110 of the second opening 101. Where the motion convertor described above is provided, the motion convertor may be a plurality of motion convertors includes at least one first motion convertor and at least one second motion convertor. The or each first motion convertor may be configured to convert movement of the plunger or the motor shaft of the corresponding first lifting actuators 700 into a driving force to move the corresponding first movable part 300 or 300' or the corresponding edge portion 110 of the first opening 101 in the Z-Z' direction. The or each second motion convertor may be configured to convert movement of the plunger or the motor shaft of the corresponding second lifting actuators 700 into a driving force to move the corresponding second movable part 300 or 300' or the corresponding edge portion 110 of the second opening 101 in the Z-Z' direction.

Where there are provided a plurality of the movable parts 300 or 300', a plurality of the lifting actuators 700, a plurality of the first portions 211 of the flexible layers 210, a plurality of the second portions 212 of the flexible layers 210, a plurality of the first region 201a of the outer face 201, and a plurality of the second regions 201b of the outer faces 201 with any of the configurations above, the housing 100 may include a single opening 101. In this case, the plurality of movable parts 300 or 300' is disposed in the opening 101 in a manner described above, but the other configurations are as described above. Where a plurality of the openings 101 is provided, and more than one of the movable parts 300 or 300' may be disposed in each opening 101 in a manner described above.

The touch sensor of any of the above aspects may be a plurality of touch sensors, each of which may be provided at, on or in, or disposed in the Z-Z' direction in spaced relation to, the main body 310 of the corresponding one of the movable parts 300 or 300' in a manner as described above. In this case, each of the plurality of second regions 201b of the outer face 201 includes a touch region 201b1. Alternatively, the touch sensor of any of the above aspects may be a single touch sensor, which may be provided at, on or in, or disposed in spaced relation in the Z-Z' direction to, the main body 310 of one of the movable parts 300 or 300' in a manner as described above (see FIG. 10). In this case, one of the second regions 201b of the outer face 201 that is located on the Z-direction side relative to the touch sensor includes the touch region 201b1. Alternatively, the single touch sensor may be disposed in spaced relation in the Z-Z' direction to the bodies 310 of the plurality of movable parts 300 or 300' in a manner as described above. In this case, the plurality of second regions 201b of the outer face 201 includes a single touch region 201b1.

The controller 800 is further configured (step) to drive each of the lifting actuators 700 (including the at least one first lifting actuator 700 and the at least one second lifting actuator 700) according to the receipt of each of deformation instructions of any aspect described above.

The controller 800 may be further configured (step) to detect information on an operational input in a manner described above according to a change in an electric signal (s) of the single touch sensor or one of the touch sensors of any of the above aspects, or according to a receipt of an electric signal(s) of the single touch sensor or one of the touch sensors of any of the above aspects. The controller 800 may be further configured (step) to determine whether the detected information on the operational input matches the information on an operational input or any one of the pieces of information on operational inputs of a plurality of types recorded on a memory. The controller 800 may be further configured (step) such that if the controller 800 determines that the detected information on the operational input matches the information on the operational input or the one of the pieces of information on the operational inputs of the plurality of types on the memory, then the controller 800 determines that the detected information on the operational input indicates the receipt of a deformation instruction corresponding to the information on the operational input or the one of the pieces of information on the operational inputs of the plurality of types. The controller 800 may be further configured (step) to drive one or more than one (but not all) of, or all of, the lifting actuators 700 (including the at least one first lifting actuator 700 and the at least one second lifting actuator 700) that correspond to the deformation instruction according to the receipt of the deformation instruction. Information on the lifting actuator 700 corresponding to each deformation instruction is recorded on a memory, and may be referred to by the controller 800 according to each deformation instruction. Where the controller 800 has such a configuration, when a detection target is used to perform a predetermined operational input on the touch region or regions 201b1 of the second region or regions 201b located on the Z-direction side relative to the touch sensor or sensors, the corresponding one or more than one of, or the all of, the lifting actuators 700 are thereby driven, the second region or regions 201b having the operated touch region or regions 201b1 of the outer face 201 is protruded or recessed.

Where there is provided the plurality of touch sensors described above, the touch sensors may each be the capacitive touch panel, the resistive touch panel, or the optical touch panel of any of the above aspects. In this case, the controller 800 may be further configured (step) to detect information on an operational input in a manner described according to changes in an electric signal(s) of each of the touch sensors, or according to the receipt of an electric signal(s) of each of the touch sensors. The controller 800 may be further configured (step) to determine whether the detected information on the operational input matches any one of the pieces of the information on operational inputs of a plurality of types recorded on a memory. The controller 800 may be further configured (step) such that if the controller 800 determines that the detected information on the operational input matches the one of the pieces of the information on the the operational inputs of the plurality of types on the memory, then the controller 800 determines that the detected information on the operational input indicates the receipt of a deformation instruction corresponding to the one of the pieces of the information on the operational inputs of the plurality of types. The controller 800 may be further configured (step) to drive one of the lifting actuators 700 that corresponds to the deformation instruction according to the receipt of the determined deformation instruction. Where the controller 800 is configured as described above, when a detection target is used to perform a predetermined operational input on the touch region 201b1 of the second region 201b located on the Z-direction side relative to each of the touch sensors, the corresponding one of the lifting actuators 700 is thereby driven, the second region 201b having the operated touch region 201b1 of the outer face 201 is protruded or recessed.

Where more than one of movable parts 300 or 300' (including the at least one first movable part 300 or 300' and the at least one second movable part 300 or 300') is disposed in the or each opening 101, the memory of the controller 800 stores a plurality of pieces of preset information, each piece of which corresponds to each of deformation instructions of a plurality of types. Each piece of preset information includes information on two or more of the lifting actuators 700 to be driven. The controller 800 may be further configured (step) to detect information on an operational input in a manner described according to a change in an electric signal(s) of the at least one touch sensor, or according to the receipt of an electric signal(s) of the at least one touch sensor. The controller 800 may be further configured (step) to determine whether the detected information on the operational input matches any one of the pieces of the information on operational inputs of a plurality of types recorded on a memory. The controller 800 may be further configured (step) such that if the controller 800 determines that the detected information on the operational input matches the one of the pieces of the information on the operational inputs of the plurality of types on the memory, then the controller 800 determines that the detected information on the operational input indicates the receipt of a deformation instruction corresponding to the one of the pieces of the information on the operational inputs of the plurality of types. The controller 800 may be further configured (step) to refer to one of the pieces of preset information that corresponds to the deformation instruction according to the receipt of the determined deformation instruction and drive two or more of the lifting actuators 700 that corresponds to the piece of preset information that has been referred to. Where the controller 800 is configured as described above, when a detection target is used to perform one of predetermined operational inputs on the touch region or regions 201b1 of the second region or regions 201b located on the Z-direction side relative to the or each touch sensor, the preset information corresponding to the performed operational input is thereby referred to so as to drive two or more of the lifting actuators 700 that corresponds to the piece of preset information that has been referred to, so that the outer face 201 becomes partly protruded or recessed. It is possible to change the shape of the protruded or recessed part of the outer face 201 for each operational input by selecting which two or more of the lifting actuators 700 according to the piece of preset information for each operational input. For example, where an opening 101 accommodates sixteen rectangular movable parts 300 or 300' are arranged in four columns in the Y-Y' direction and four rows in the X-X' direction, if the controller 800 determines that the detected information on the operational input matches the information on one (a first operational input) out of operational inputs of a plurality of types recorded on a memory and determines that the detected information indicates the receipt of a deformation instruction corresponding to the first operational input, then the controller 800 refers to the piece of preset information corresponding to the first operational input and drives sixteen lifting actuators 700 corresponding to all of the sixteen movable parts 300 or 300' to move the sixteen movable parts 300 or 300' from the first height position to the second height position or vice versa. In this case, corresponding to the entire shape of the sixteen movable parts 300 or 300', a generally square recessed or protruded part is formed in the outer face 201. If the controller 800 determines that the detected information on the operational input matches the information on another one (a second operational input) out of operational inputs of a plurality of types recorded on a memory and determines that the detected information indicates the receipt of a deformation instruction corresponding to the second operational input, then the controller 800 refers to the piece of preset information corresponding to the second operational input and drives six lifting actuators 700 corresponding to six of the sixteen movable parts 300 or 300' to move the six movable parts 300 or 300' from the first height position to the second height position or vice versa. In this case, corresponding to the entire shape of the six movable parts 300 or 300', a generally rectangular recessed or protruded part is formed in the outer face 201.

It is possible to move one or more of the main bodies 310 of the plurality of movable parts 300 or 300' (including the at least one first movable part 300 or 300' and the at least one second movable part 300 or 300') that no touch sensors are provided at or disposed in spaced relation in the Z-Z' direction to, from the first height position to the second height position relative to the edge portion 110 of the housing 100, so as to protrude or recess one or more of the second regions 201b that is located on the Z-direction side relative the one or more of the main bodies 310 in the outer face 201 of the covering 200. Formation of such recessed and/or protruded part or parts in the outer face 201 allows a user to visually recognize the touch region or regions 201$b$1 in the vicinity of the recessed and/or protruded part(s) and/or allows the recessed and/or protruded part or parts to be used as an ornamental design. It is possible to select how to combine the recessed and/or protruded part(s) formed in the outer face 201.

It should be noted that the plurality of movable parts 300 or 300' (including the at least one first movable part 300 or 300' and the at least one second movable part 300 or 300') at respective first height positions may be relatively located at the same or different height relative to the respective edge portions 110 of the plurality of openings 101 (including the edge portion 110 of the at least one first opening 101 and the edge portion 110 of the at least one second opening 101). Also, the plurality of movable parts 300 or 300' (including the at least one first movable part 300 or 300' and the at least one second movable part 300 or 300') at respective second height positions may be relatively located at the same or different height relative to the respective edge portions 110 of the plurality of openings 101 (including the edge portion 110 of the at least one first opening 101 and the edge portion 110 of the at least one second opening 101). The plurality of second portions 212 of the flexible layer 210 at respective third height positions may be relatively located at the same or different height relative to the respective first portions 211. The plurality of second portions 212 of the flexible layer 210 at respective fourth height positions may be relatively located at the same or different height relative to the respective first portions 211.

Where the vibration generator V of any of the above aspects is provided, the vibration generator V may be one or a plurality of vibration generators according to the body or bodies 310 of one or a plurality of movable parts 300 or 300'. The controller 800 may be configured drive one or a plurality of vibration generators V according to a change in an electric signal(s) or a receipt of an electric signal(s) of one or a plurality of touch sensors S. Also, regarding one or more of the main bodies 310 of the plurality of movable parts 300 or 300' that the touch sensor S is provided at or disposed in spaced relation in the Z-Z' direction to, there is no need to vibrate such body or bodies 310 with the vibration generator or generators V, making it possible to omit the vibration generator V or generators for vibrating the body or bodies 310. Also where a plurality of main bodies 310 is provided, it is obviously possible to omit the vibration generator or generators V.

The controller 800 of any of the above aspects may be configured to count a predetermined period starting from the input of a deformation instruction of any aspect described above or from an operational input for unlocking, using a timer circuit of the controller 800 or a software timer on a memory, and, if there is no change in the electric signal(s) or no receipt of the electric signal(s) of the at least one touch sensor of any of the above aspects within the predetermined period, then return to the step of repeating a process of determining whether the controller 800 has received a deformation instruction until receiving any deformation instruction. The controller 800 described above can be omitted. In this case, in place of the controller 800, it is possible to use a controller built in an automobile, furniture, portable information terminal, stationary information terminal, or the like, and such built-in controller may have a similar configuration to the controller 800 of any aspect described above.

The first direction (Z-Z' direction) of the invention can be any direction that corresponds to the axial direction of the opening 101 and/or the thickness direction of the edge portion 110.

REFERENCE SIGNS LIST

D1, D2, D3: touch sensing device
100: housing
101: opening; 110: edge portion; 111: first face of edge portion; 112: second face of edge portion; 121: holding portion; 122: holding portion; 130: holding portion; 140: guide; 150: stepped portion; G: gap
200: covering
201: outer face; 201$a$: first region; 201$b$: second region; 201$b$1: touch region; 201$c$: third region; 201$d$: step
210: flexible layer; 211: first portion; 212: second portion; 213: third portion
220: outermost layer
230: first intermediate layer
300, 300': movable part
310: body; 311: first face of main body; 312: second face of body
320: holding portion
400: slider
410: coupling portion; 420: coupling portion; 430: runner; 431: cam groove
500: guide shaft
600: cam shaft
700: lifting actuator
710: plunger
800: controller
900: support
S: touch sensor
Sa: first electrode; Sb: second electrode
V: vibration generator

What is claimed is:
1. A touch sensing device comprising:
a housing including:
  at least one opening opening out at least to one side in a first direction, the first direction being an axial direction of the at least one opening, and
  an edge portion of the at least one opening, the edge portion of the at least one opening including a first face on the one side in the first direction;
at least one movable part including a first face on the one side in the first direction, the at least one movable part being relatively movable within the at least one opening relative to the edge portion of the at least one opening, between a first height position and a second height position in the first direction, the first height position being such that the first face of the at least one movable part is located at a predetermined height in the first direction relative to the first face of the edge portion of the at least one opening of the housing, the second height position being located on the other side or the one side in the first direction relative to the first height position;
a covering including a flexible layer being flexible and stretchable, the flexible layer covering at least the edge portion of the at least one opening of the housing and the at least one movable part from the one side in the first direction, and including:
  at least one first portion being directly or indirectly fixed to the first face of the edge portion of the at least one opening of the housing and including a first face on the one side in the first direction, and at least one second portion being directly or indirectly fixed to the first face of the at least one movable part and including a first face on the one side in the first direction, wherein in a state where the at least one movable part is relatively located at the first height position relative to the edge portion of the at least one opening of the housing, the first face of the at least one second portion of the flexible layer is relatively located at a predetermined third height position in the first direction relative to the first face of the at least one first portion of the flexible layer, in a state where the at least one movable part is relatively located at the second height position relative to the edge portion of the at least one opening of the housing, the first face of the at least one second portion of the flexible layer is relatively located at a fourth height position relative to the first face of the at least one first portion of the flexible layer, the fourth height position being located on the other side or the one side in the first direction relative to the third height position, and the flexible layer is configured to partly flex and stretch, or alternatively partly shrink, in accordance with a relative movement of the at least one second portion relative to the at least one first portion, from the third height position to the fourth height position, or alternatively from the fourth height position to the third height position;

at least one touch sensor provided at the at least one movable part, or in spaced relation to and on the other side in the first direction relative to the at least one movable part, the at least one touch sensor being configured to detect a detection target contacting a touch region of an outer face on the one side in the first direction of the covering; and at least one lifting actuator configured to move the at least one movable part, or alternatively move the edge portion of the at least one opening of the housing, in the first direction, and thereby relatively move the at least one movable part from the first height position to the second height position, or alternatively from the second height position to the first height position, relative to the edge portion of the at least one opening of the housing.

2. The touch sensing device according to claim 1, wherein the outer face of the covering includes:

at least one first region located on the one side in the first direction relative to the edge portion of the at least one opening of the housing, and at least one second region located on the one side in the first direction relative to the at least one movable part, at least one of the at least one second region including the touch region to be contacted by a detection target, in a state where the at least one movable part is relatively located at the first height position relative to the edge portion of the at least one opening of the housing, the at least one first region and the at least one second region of the outer face are substantially flush with each other, and in a state where the at least one movable part is relatively located at the second height position relative to the edge portion of the at least one opening of the housing, the at least one second region of the outer face is relatively located on the other side or the one side in the first direction relative to the at least one first region of the outer face.

3. The touch sensing device according to claim 1, wherein the at least one movable part is disposed in the at least one opening of the housing with a gap between the at least one movable part and the edge portion of the at least one opening of the housing, the flexible layer further includes at least one third portion between the at least one first portion and the at least one second portion, the at least one third portion being located on the one side in the first direction relative to the gap, and the at least one third portion is configured to flex and stretch, or alternatively shrink, in accordance with the relative movement of the at least one second portion relative to the at least one first portion, from the third height position to the fourth height position, or alternatively from the fourth height position to the third height position.

4. The touch sensing device according to claim 2, wherein the at least one movable part is disposed in the at least one opening of the housing with a gap between the at least one movable part and the edge portion of the at least one opening of the housing, the outer face further includes at least one third region between the at least one first region and the at least one second region, the at least one third region being located on the one side in the first direction relative to the gap, the flexible layer further includes at least one third portion between the at least one first portion and the at least one second portion, the at least one third portion being located on the one side in the first direction relative to the gap, and in a state where the at least one movable part is relatively located at the first height position relative to the edge portion of the at least one opening of the housing, the at least one first region, the at least one second region, and the at least one third region of the outer face are substantially flush with each other, and in a state where the at least one movable part is relatively located at the second height position relative to the edge portion of the at least one opening of the housing, the at least one second region of the outer face is relatively located on the other side or the one side in the first direction relative to the at least one first region of the outer face, and the at least one third region of the outer face slopes obliquely from the at least one second region of the outer face to the at least one first region of the outer face.

5. The touch sensing device according to claim 1, wherein the flexible layer is configured to partly restore itself or partly stretches when the first face of the at least one second portion of the flexible layer relatively returns from the fourth height position to the third height position relative to the first face of the at least one first portion of the flexible layer and the at least one movable part relatively moves from the second height position to the first height position relative to the edge portion of the at least one opening of the housing, or alternatively when the first face of the at least one second portion of the flexible layer relatively returns from the third height position to the fourth height position relative to the first face of the at least one first portion of the flexible layer and the at least one movable part relatively moves from the first height position to the second height position relative to the edge portion of the at least one opening of the housing.

6. The touch sensing device according to claim 1, wherein the covering further includes an outermost layer including
the outer face and being located on the one side in the first direction relative to the flexible layer, and
the outermost layer is configured to partly flex as the flexible layer partly flexes, or alternatively partly shrink as the flexible layer partly shrinks.

7. The touch sensing device according to claim 1, wherein the covering further includes a cushioning layer disposed between the flexible layer and a combination of the housing and the at least one movable part, the cushioning layer including:
at least one first portion interposed between the at least one first portion of the flexible layer and the first face of the edge portion of the at least one opening of the housing, and
at least one second portion interposed between the at least one second portion of the flexible layer and the first face of the at least one movable part.

8. The touch sensing device according to claim 1, wherein the at least one touch sensor is provided on the first face of the at least one movable part, and
the at least one second portion of the flexible layer is indirectly fixed to the first face of the at least one movable part via the at least one touch sensor.

9. The touch sensing device according to claim 2, wherein the outer face further includes at least one ornamental protrusion protruding to the one side in the first direction and/or at least one ornamental recess recessed to the other side in the first direction, the at least one ornamental protrusion and/or the at least one ornamental recess being located between the at least one first region and the at least one second region, and
in a state where the at least one movable part is relatively located at the first height position relative to the edge portion of the at least one opening of the housing, the at least one first region and the at least one second region of the outer face are substantially flush with each other except for the at least one ornamental protrusion and/or the at least one ornamental recess.

10. The touch sensing device according to claim 1, further comprising a controller configured to drive the at least one lifting actuator according to a receipt of at least one deformation instruction.

11. The touch sensing device according to claim 10, wherein
the at least one touch sensor is configured to change or output an electric signal according to a contact by a detection target with the touch region of the outer face of the covering, and
the controller is further configured to determine that a change in an electric signal or a receipt of an electric signal of the at least one touch sensor indicates the receipt of the at least one deformation instruction.

12. The touch sensing device according to claim 10, further comprising a proximity detector configured to output the at least one deformation instruction to the controller according to an approach of a detection target to the touch region of the outer face of the covering.

13. The touch sensing device according to claim 11, wherein
the controller is further configured to detect, after the receipt of the at least one deformation instruction, position information on the contact with the touch region by the detection target according to a change in an electric signal in the at least one touch sensor or a receipt of an electric signal from the at least one touch sensor.

14. The touch sensing device according to claim 10, wherein
the at least one touch sensor is a touch panel configured to change or output an electric signal according to an operational input with a detection target to the touch region of the outer face of the covering, and
the controller is further configured to detect information on the operational input according to a change in an electric signal in the at least one touch sensor or a receipt of an electric signal from the at least one touch sensor, and to determine whether the detected information on the operational input matches predetermined information on an operational input recorded on a memory, and
the controller is further configured such that if the controller determines that the detected information on the operational input matches the information on the operational input on the memory, then the controller determines that the detected information on the operational input indicates the receipt of the at least one deformation instruction.

15. The touch sensing device according to claim 14, wherein
the controller is further configured to detect, after the receipt of the at least one deformation instruction, information on an operational input with the detection target to the touch region according to a change in an electric signal in the at least one touch sensor or a receipt of an electric signal from the at least one touch sensor.

16. The touch sensing device according to claim 10, wherein
the at least one touch sensor is a touch panel configured to change or output an electric signal according to an operational input with a detection target to the touch region of the outer face of the covering, and
the controller is further configured to detect, after the receipt of the at least one deformation instruction, information on the operational input according to a change in an electric signal in the at least one touch sensor or a receipt of an electric signal from the at least one touch sensor, and to determine whether the detected information on the operational input matches predetermined information on an operational input recorded on a memory.

17. The touch sensing device according to claim 15, wherein
the controller is further configured such that if the controller determines that the detected information on the operational input matches the information on the operational input on the memory, then the controller detects information on the operational input with the detection target to the touch region according to a change in an electric signal in the at least one touch sensor or a receipt of an electric signal from the at least one touch sensor.

18. The touch sensing device according to claim 13, further comprising at least one vibration generator to apply vibration to the at least one movable part,
wherein the controller is further configured to drive the at least one vibration generator according to a change in an electric signal in the at least one touch sensor or a receipt of an electric signal from the at least one touch sensor.

19. The touch sensing device according to claim 1, wherein
the edge portion of the at least one opening of the housing and/or the movable part includes a stepped portion, and
the outermost layer extends along the stepped portion.

20. The touch sensing device according to claim 1, wherein
the outer face of the covering includes:
at least one first region located on the one side in the first direction relative to the edge portion of the at least one opening of the housing, and
at least one second region located on the one side in the first direction relative to the at least one movable part, at least one of the at least one second region including the touch region to be contacted by a detection target,
in a state where the at least one movable part is relatively located at the first or second height position relative to the edge portion of the at least one opening of the housing, the at least one first region of the outer face is located on the other side or the one side in the first direction relative to the at least one second region of the outer face, and
a step is formed in a portion between the at least one first region of the outer face and the at least one second region of the outer face.

* * * * *